US012739580B2

(12) United States Patent
Katayama et al.

(10) Patent No.: US 12,739,580 B2
(45) **Date of Patent: *Sep. 15, 2026**

(54) SEMICONDUCTOR DEVICE AND ELECTRONIC APPARATUS

(71) Applicant: SEIKO EPSON CORPORATION, Tokyo (JP)

(72) Inventors: Takao Katayama, Matsumoto (JP); Akihiro Fukuzawa, Hino (JP); Isamu Moriya, Chino (JP)

(73) Assignee: SEIKO EPSON CORPORATION (JP)

( * ) Notice: Subject to any disclaimer, the term of this patent is extended or adjusted under 35 U.S.C. 154(b) by 151 days.

This patent is subject to a terminal disclaimer.

(21) Appl. No.: 18/783,594

(22) Filed: Jul. 25, 2024

(65) Prior Publication Data

US 2025/0039623 A1 Jan. 30, 2025

(30) Foreign Application Priority Data

Jul. 28, 2023 (JP) ................................ 2023-123147
Mar. 26, 2024 (JP) ................................ 2024-049568

(51) Int. Cl.
*H04R 29/00* (2006.01)
*G01K 13/00* (2021.01)
(Continued)

(52) U.S. Cl.
CPC ........... *H04R 29/001* (2013.01); *H03F 3/183* (2013.01); *H04R 3/04* (2013.01); *G01K 13/00* (2013.01); *H03F 2200/03* (2013.01)

(58) Field of Classification Search
CPC ......... H04R 29/001; H04R 3/04; H03F 3/183; H03F 2200/03; G01K 13/00
(Continued)

(56) References Cited

U.S. PATENT DOCUMENTS 7,262,658 B2 8/2007 Ramaswamy et al.
2012/0294450 A1 11/2012 Ozcan
(Continued)

FOREIGN PATENT DOCUMENTS

JP H01-176952 A 7/1989
JP 2005-202624 A 7/2005
(Continued)

OTHER PUBLICATIONS

U.S. Appl. No. 18/474,348, filed Sep. 26, 2023, Takao Katayama et al.

*Primary Examiner* — Vivian C Chin
*Assistant Examiner* — Douglas J Suthers
(74) *Attorney, Agent, or Firm* — Harness, Dickey & Pierce, P.L.C.

(57) ABSTRACT

A semiconductor device includes: a test signal generation circuit that, modulates a test signal to generate third and fourth modulated signals; an amplification circuit that, outputs a third amplified signal obtained by amplifying the third modulated signal to a first output terminal and outputs a fourth amplified signal obtained by amplifying the fourth modulated signal to a second output terminal; a peak frequency detection circuit that, measures a potential difference between the first and second output terminals to detect a peak frequency at which an impedance of a sound reproduction device reaches a peak; and a determination circuit that, determines whether or not the peak frequency is included in a reference frequency range determined based on a frequency band of the test signal and temperature information of the sound reproduction device.

13 Claims, 30 Drawing Sheets

(51) Int. Cl.
*H03F 3/183* (2006.01)
*H04R 3/04* (2006.01)

(58) Field of Classification Search
USPC ............................................................ 381/59
See application file for complete search history.

(56) References Cited

U.S. PATENT DOCUMENTS

| | | | | |
|---|---|---|---|---|
| 2019/0028805 A1* | 1/2019 | Goto | H04R 29/001 | |
| 2020/0081684 A1* | 3/2020 | Akahori | H04R 3/04 | |
| 2020/0236482 A1* | 7/2020 | Akahori | H04R 29/001 | |
| 2023/0327617 A1* | 10/2023 | Matsuyama | H03F 3/2175 | 330/251 |

FOREIGN PATENT DOCUMENTS

| | | | |
|---|---|---|---|
| JP | 2012-199854 | A | 10/2012 |
| JP | 2020-022055 | A | 2/2020 |
| JP | 2020-041953 | A | 3/2020 |
| JP | 2020-120243 | A | 8/2020 |
| WO | 2017-164380 | A1 | 9/2017 |

* cited by examiner

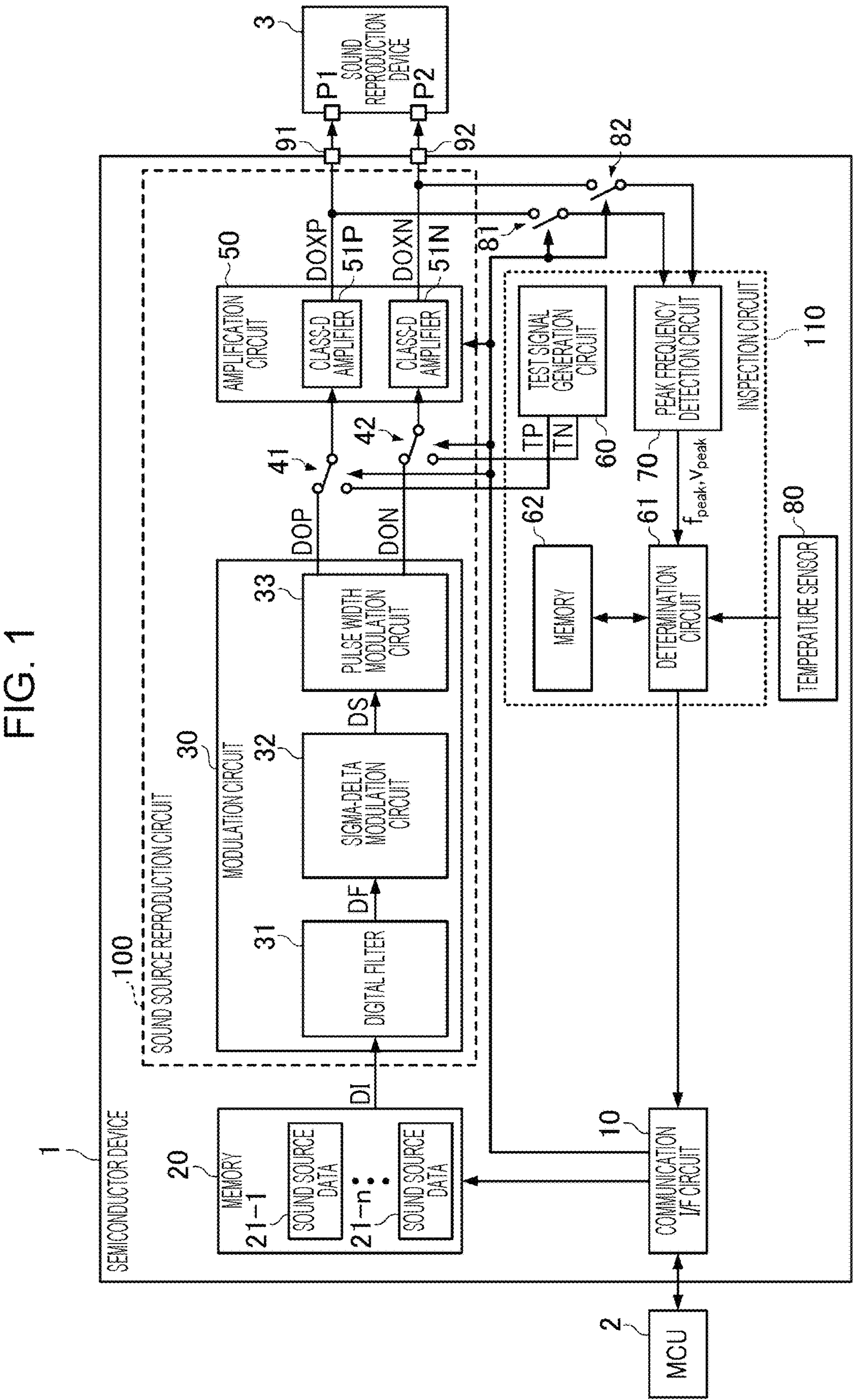
FIG. 1
SEMICONDUCTOR DEVICE
SOUND SOURCE REPRODUCTION CIRCUIT
MODULATION CIRCUIT
DIGITAL FILTER
SIGMA-DELTA MODULATION CIRCUIT
PULSE WIDTH MODULATION CIRCUIT
AMPLIFICATION CIRCUIT
CLASS-D AMPLIFIER
CLASS-D AMPLIFIER
SOUND REPRODUCTION DEVICE
MEMORY
SOUND SOURCE DATA
SOUND SOURCE DATA
COMMUNICATION I/F CIRCUIT
MCU
TEST SIGNAL GENERATION CIRCUIT
PEAK FREQUENCY DETECTION CIRCUIT
INSPECTION CIRCUIT
MEMORY
DETERMINATION CIRCUIT
TEMPERATURE SENSOR
DI
DF
DS
DOP
DON
DOXP
DOXN
TP
TN
P1
P2
$f_{peak}$, $V_{peak}$
1
2
3
10
20
21-1
21-n
30
31
32
33
41
42
50
51P
51N
60
61
62
70
80
81
82
91
92
100
110

FIG. 5
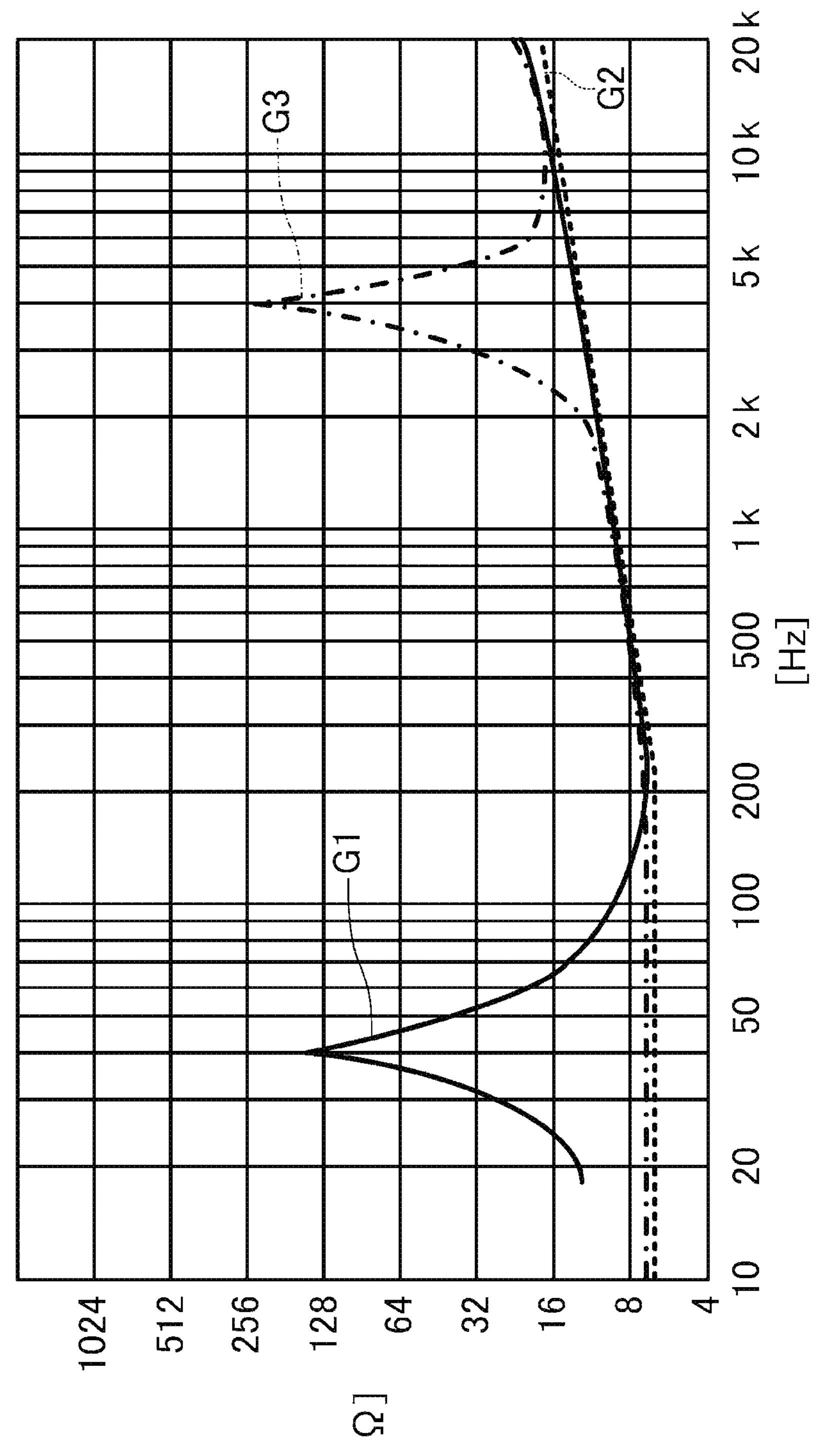

$R_{sp}$
P1
P2
91
92
81
82
DOXP
DOXN
201−n
201−2
201−1
202−n
202−2
202−1
51P
51N
DIFFERENTIAL LPF
71
V'
72
A/D CONVERSION CIRCUIT
DT
73
PEAK TIME MEASUREMENT CIRCUIT
70
41
42
DOP
TP
TN
DON
$f_{peak}, V_{peak}$

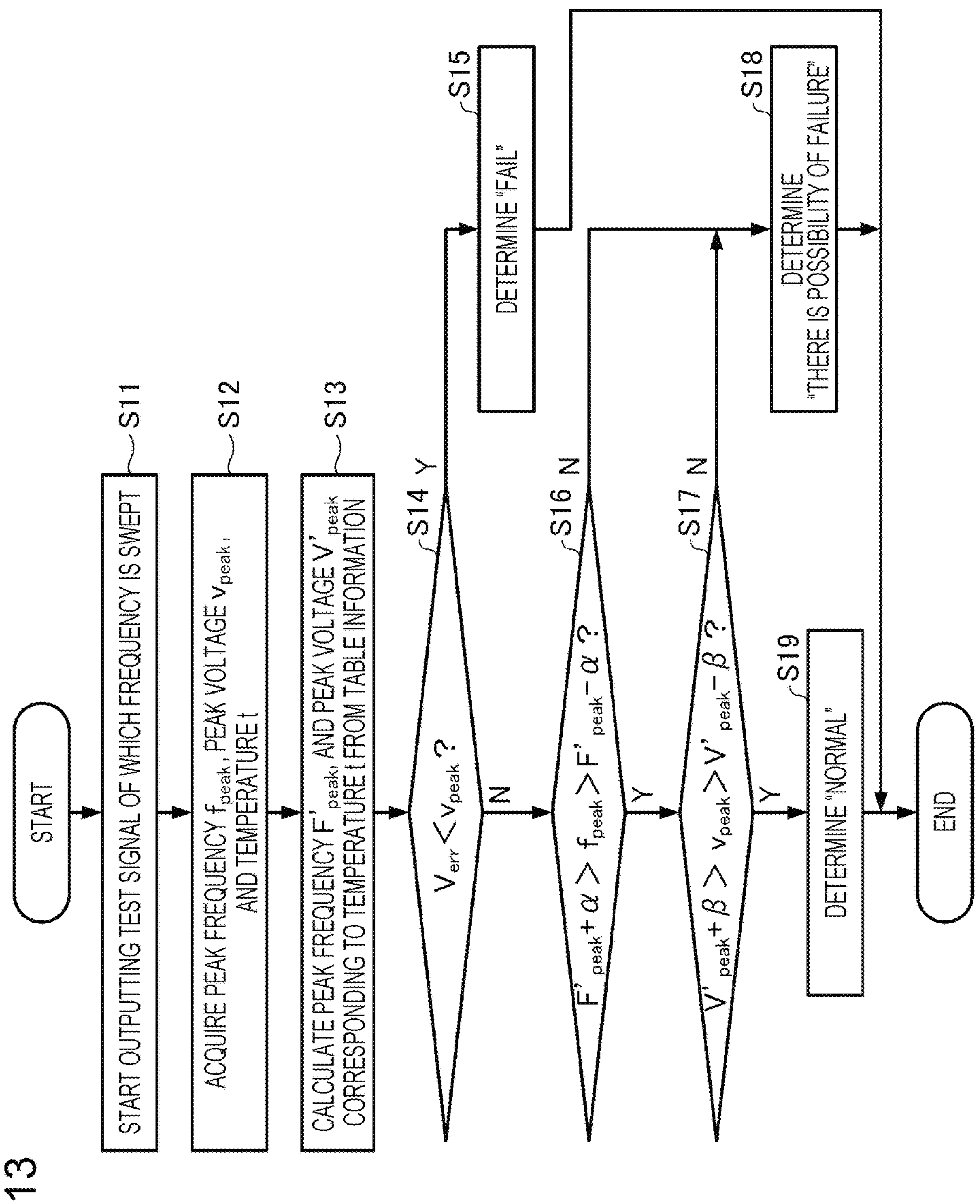
FIG. 13
START
S11
START OUTPUTTING TEST SIGNAL OF WHICH FREQUENCY IS SWEPT
S12
ACQUIRE PEAK FREQUENCY $f_{peak}$, PEAK VOLTAGE $v_{peak}$, AND TEMPERATURE t
S13
CALCULATE PEAK FREQUENCY $F'_{peak}$ AND PEAK VOLTAGE $V'_{peak}$ CORRESPONDING TO TEMPERATURE t FROM TABLE INFORMATION
S14
$V_{err} < v_{peak}$ ?
Y
N
S15
DETERMINE "FAIL"
S16
$F'_{peak} + \alpha > f_{peak} > F'_{peak} - \alpha$ ?
N
Y
S17
$V'_{peak} + \beta > v_{peak} > V'_{peak} - \beta$ ?
N
Y
S18
DETERMINE "THERE IS POSSIBILITY OF FAILURE"
S19
DETERMINE "NORMAL"
END FREQUENCY (Hz) OR VOLTAGE (V)
TEMPERATURE (°C)
$F_{peak\_Low}$
$V_{peak\_Low}$
$V_{peak\_Nor}$
$F_{peak\_Nor}$
$V'_{peak}$
$F'_{peak}$
$V_{peak\_High}$
$F_{peak\_High}$
$T_{High}$
t
$T_{Nor}$
$T_{Low}$

FIG. 16
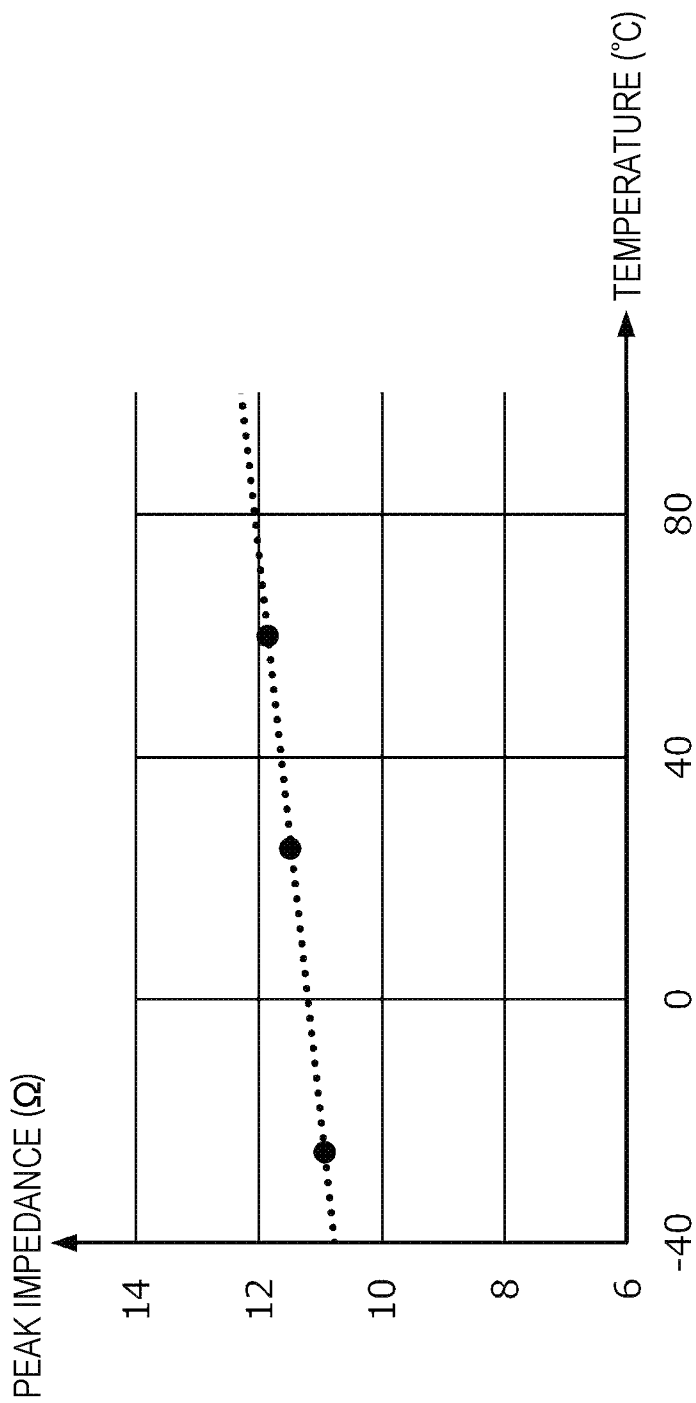
PEAK IMPEDANCE (Ω)
14
12
10
8
6
-40
0
40
80
TEMPERATURE (°C)

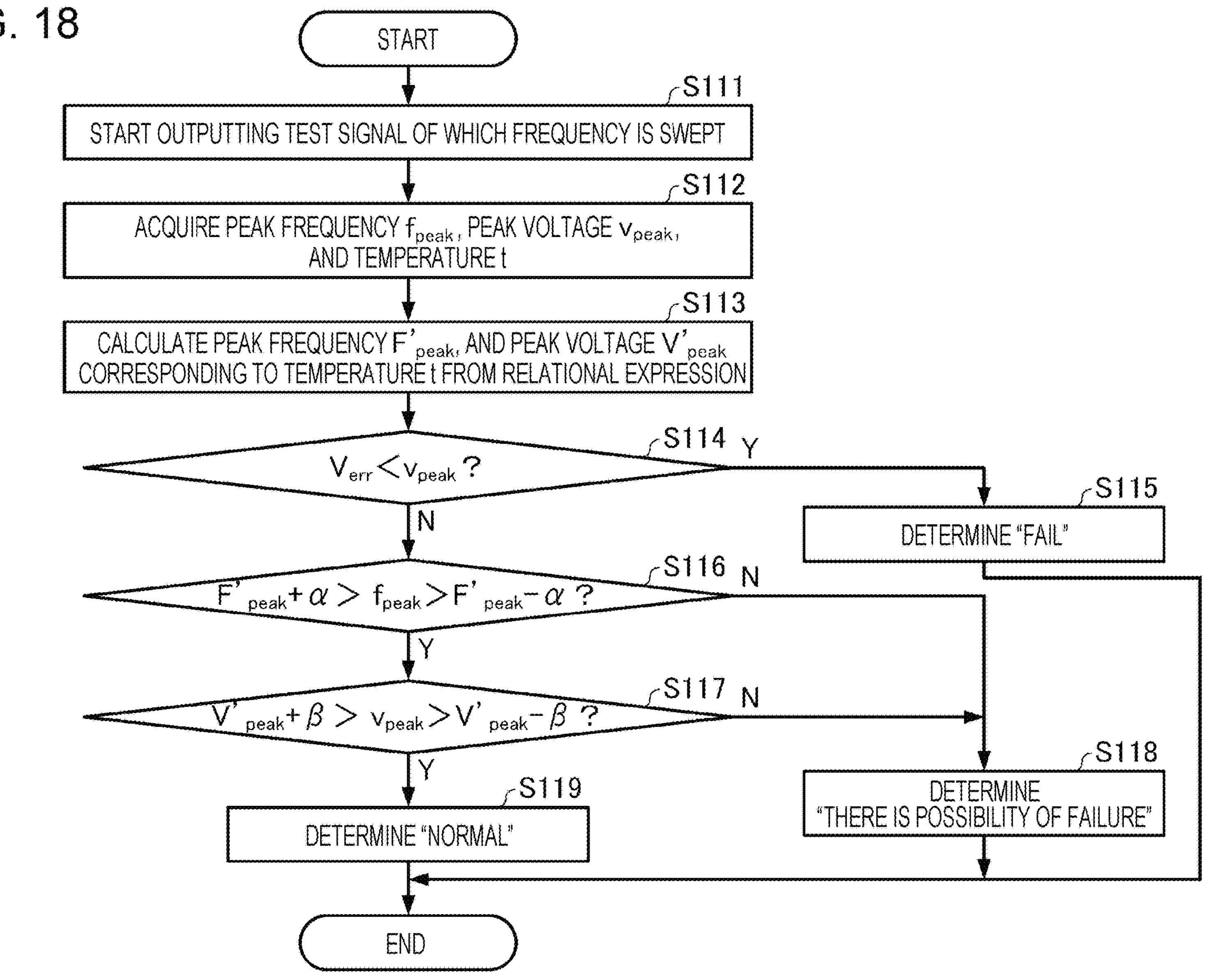
FIG. 18
START
S111
START OUTPUTTING TEST SIGNAL OF WHICH FREQUENCY IS SWEPT
S112
ACQUIRE PEAK FREQUENCY $f_{peak}$, PEAK VOLTAGE $v_{peak}$, AND TEMPERATURE t
S113
CALCULATE PEAK FREQUENCY $F'_{peak}$, AND PEAK VOLTAGE $V'_{peak}$ CORRESPONDING TO TEMPERATURE t FROM RELATIONAL EXPRESSION
S114
$V_{err} < v_{peak}$ ?
Y
N
S115
DETERMINE "FAIL"
S116
$F'_{peak} + \alpha > f_{peak} > F'_{peak} - \alpha$ ?
N
Y
S117
$V'_{peak} + \beta > v_{peak} > V'_{peak} - \beta$ ?
N
Y
S118
DETERMINE "THERE IS POSSIBILITY OF FAILURE"
S119
DETERMINE "NORMAL"
END

FIG. 20

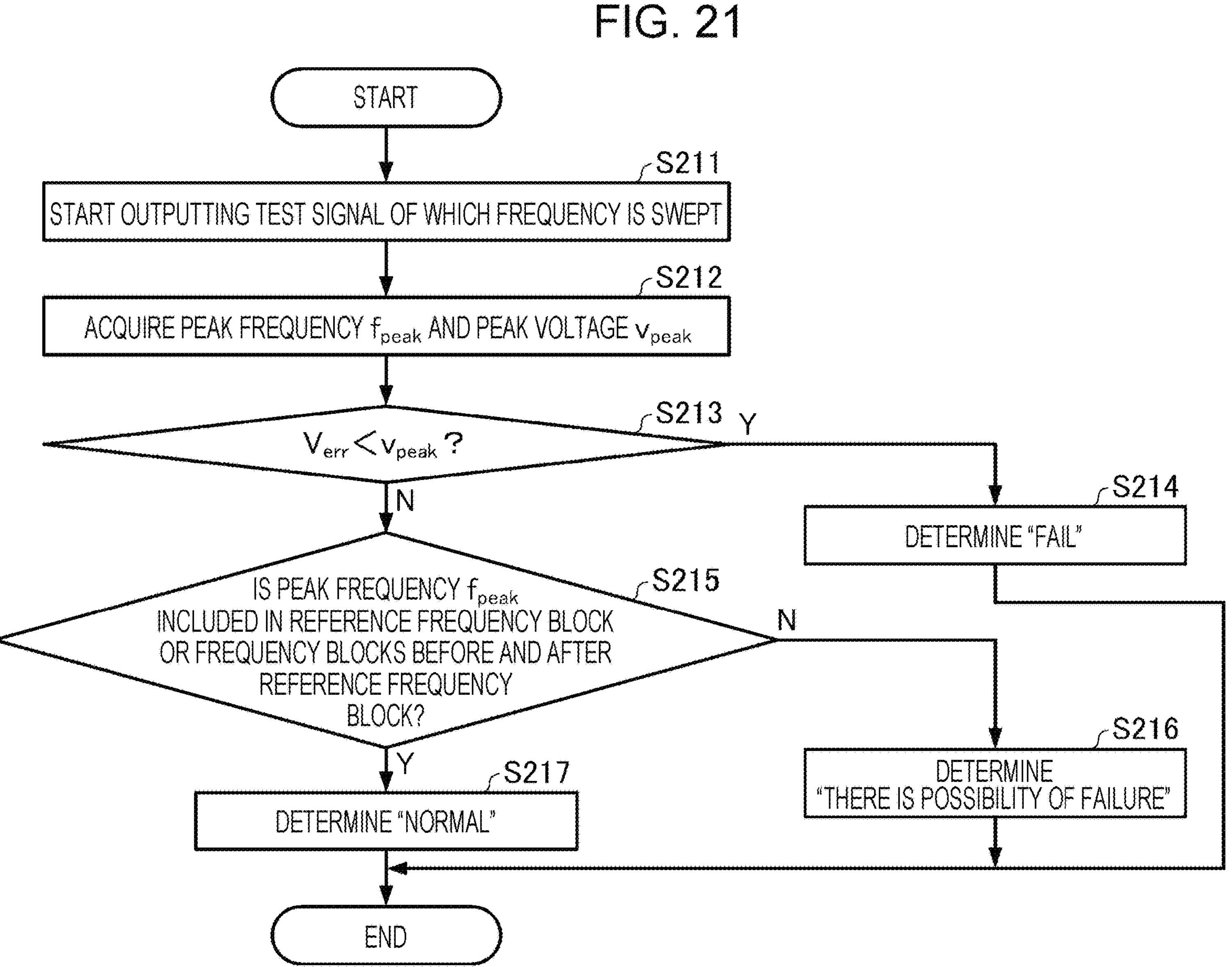
FIG. 21
START
S211
START OUTPUTTING TEST SIGNAL OF WHICH FREQUENCY IS SWEPT
S212
ACQUIRE PEAK FREQUENCY $f_{peak}$ AND PEAK VOLTAGE $v_{peak}$
S213
$V_{err} < v_{peak}$ ?
Y
N
S214
DETERMINE "FAIL"
S215
IS PEAK FREQUENCY $f_{peak}$ INCLUDED IN REFERENCE FREQUENCY BLOCK OR FREQUENCY BLOCKS BEFORE AND AFTER REFERENCE FREQUENCY BLOCK?
N
Y
S216
DETERMINE "THERE IS POSSIBILITY OF FAILURE"
S217
DETERMINE "NORMAL"
END

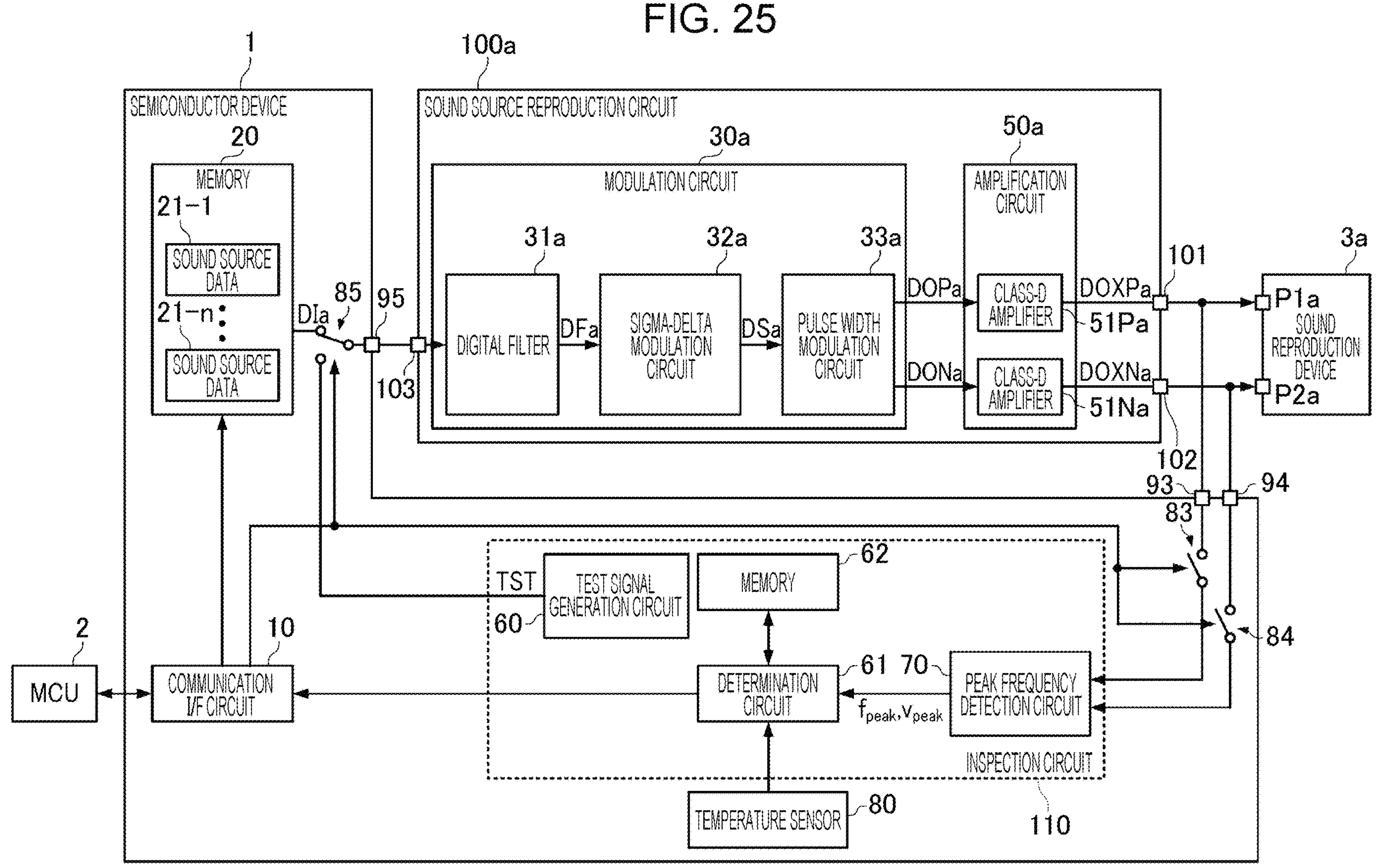
FIG. 25
1
SEMICONDUCTOR DEVICE
20
MEMORY
21−1
SOUND SOURCE DATA
21−n
SOUND SOURCE DATA
DIa
85
95
103
100a
SOUND SOURCE REPRODUCTION CIRCUIT
30a
MODULATION CIRCUIT
31a
DIGITAL FILTER
DFa
32a
SIGMA-DELTA MODULATION CIRCUIT
DSa
33a
PULSE WIDTH MODULATION CIRCUIT
DOPa
DONa
50a
AMPLIFICATION CIRCUIT
CLASS-D AMPLIFIER
51Pa
CLASS-D AMPLIFIER
51Na
DOXPa
DOXNa
101
102
3a
P1a
SOUND REPRODUCTION DEVICE
P2a
93
94
83
84
2
MCU
10
COMMUNICATION I/F CIRCUIT
TST
TEST SIGNAL GENERATION CIRCUIT
60
MEMORY
62
DETERMINATION CIRCUIT
61
70
PEAK FREQUENCY DETECTION CIRCUIT
$f_{peak}, V_{peak}$
INSPECTION CIRCUIT
110
TEMPERATURE SENSOR
80

SEMICONDUCTOR DEVICE AND ELECTRONIC APPARATUS

The present application is based on, and claims priority from JP Application Serial Number 2023-123147, filed Jul. 28, 2023 and 2024-049568, filed Mar. 26, 2024 the disclosures of which are hereby incorporated by reference herein in their entirety.

BACKGROUND

1. Technical Field

The present disclosure relates to a semiconductor device and an electronic apparatus.

2. Related Art

JP-A-2012-199854 discloses a speaker failure notification device that measures an impedance that changes with a structural change of a speaker by a control section, determines whether or not the measured impedance is within a predetermined range, and notifies that the speaker fails when it is determined that the impedance is not within the range.

In the speaker failure notification device disclosed in JP-A-2012-199854, since it is determined whether or not the measured impedance is within the predetermined range, when the impedance of the speaker changes due to a change in a temperature, there is a risk that the failure of the speaker cannot be determined correctly.

SUMMARY

According to an aspect of the present disclosure, there is provided a semiconductor device including: a first output terminal coupled to a first terminal of a sound reproduction device; a second output terminal coupled to a second terminal of the sound reproduction device; a modulation circuit that, in a first operation mode, modulates a signal based on a sound source signal to output a first modulated signal and a second modulated signal; a test signal generation circuit that, in a second operation mode, modulates a test signal of which a frequency is changed in a frequency band set in advance, to generate a third modulated signal and a fourth modulated signal; an amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the third modulated signal to the first output terminal and outputs a fourth amplified signal obtained by amplifying the fourth modulated signal to the second output terminal; a peak frequency detection circuit that, in the second operation mode, measures a potential difference between the first output terminal and the second output terminal to detect a peak frequency that is a frequency of the test signal at which an impedance of the sound reproduction device reaches a peak; and a determination circuit that, in the second operation mode, determines whether or not the peak frequency is included in a reference frequency range determined based on the frequency band of the test signal and temperature information that is information on a temperature of the sound reproduction device.

According to another aspect of the present disclosure, there is provided a semiconductor device coupled to a sound source reproduction circuit including an input terminal, a modulation circuit that modulates a signal input to the input terminal to output a first modulated signal and a second modulated signal, and an amplification circuit that outputs a first amplified signal obtained by amplifying the first modulated signal to a first terminal of a sound reproduction device and outputs a second amplified signal obtained by amplifying the second modulated signal to a second terminal of the sound reproduction device, the semiconductor device including: a first input terminal coupled to the first terminal of the sound reproduction device; a second input terminal coupled to the second terminal of the sound reproduction device; an output terminal coupled to the input terminal of the sound source reproduction circuit; a switch that, in a first operation mode, outputs a signal based on a sound source signal to the output terminal and that, in a second operation mode, outputs a test signal of which a frequency is changed in a frequency band set in advance to the output terminal; a test signal generation circuit that, in the second operation mode, outputs the test signal to the switch; a peak frequency detection circuit that, in the second operation mode, measures a potential difference between the first input terminal and the second input terminal to detect a peak frequency that is a frequency of the test signal at which an impedance of the sound reproduction device reaches a peak; and a determination circuit that, in the second operation mode, determines whether or not the peak frequency is included in a reference frequency range determined based on the frequency band of the test signal and temperature information that is information on a temperature of the sound reproduction device.

According to an aspect of the present disclosure, there is provided an electronic apparatus including: the semiconductor device according to the above-described aspect; and the sound reproduction device.

According to another aspect of the present disclosure, there is provided an electronic apparatus including: a first output terminal coupled to a first terminal of a sound reproduction device; a second output terminal coupled to a second terminal of the sound reproduction device; a modulation circuit that, in a first operation mode, modulates a signal based on a sound source signal to output a first modulated signal and a second modulated signal and that, in a second operation mode, modulates a test signal of which a frequency is changed in a frequency band set in advance, to output a third modulated signal and a fourth modulated signal; a test signal generation circuit that, in the second operation mode, outputs the test signal to the modulation circuit; an amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the third modulated signal to the first output terminal and outputs a fourth amplified signal obtained by amplifying the fourth modulated signal to the second output terminal; a peak frequency detection circuit that, in the second operation mode, measures a potential difference between the first output terminal and the second output terminal to detect a peak frequency that is a frequency of the test signal at which an impedance of the sound reproduction device reaches a peak; and a determination circuit that, in the second operation mode, determines whether or not the peak frequency is included in a reference frequency range determined based on the frequency band of the test signal and temperature information that is information on a temperature of the sound reproduction device.

BRIEF DESCRIPTION OF THE DRAWINGS

FIG. 1 is a diagram illustrating a configuration example of a semiconductor device according to a first embodiment.

FIG. 5 is a diagram illustrating an example of a relationship between a state of a speaker and an impedance characteristic thereof.

FIG. 13 is a flowchart illustrating an example of a processing procedure of the inspection circuit in an inspection mode in the first embodiment.

FIG. 16 is a graph illustrating a relationship between the temperature and the peak impedance.

FIG. 18 is a flowchart illustrating an example of a processing procedure of the inspection circuit in an inspection mode in the second embodiment.

FIG. 20 is a flowchart illustrating an example of a processing procedure of an inspection circuit in a calibration mode in the third embodiment.

FIG. 21 is a flowchart illustrating an example of a processing procedure of the inspection circuit in an inspection mode in the third embodiment.

FIG. 25 is a diagram illustrating a configuration example of a semiconductor device according to a fifth embodiment.

DESCRIPTION OF EMBODIMENTS

Figure 2:
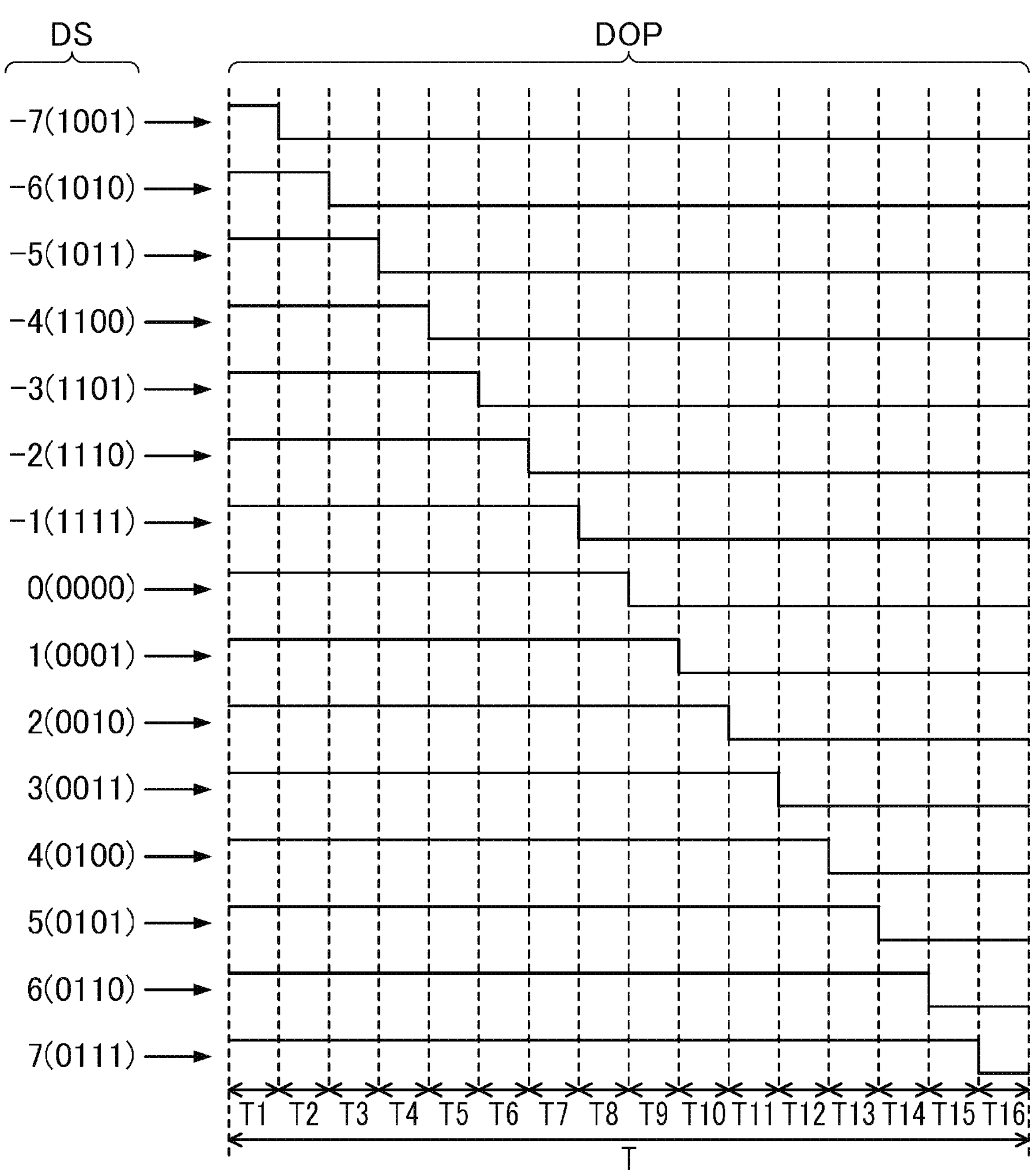
FIG. 2 is a diagram illustrating an example of pulse width modulation for generating a modulated signal.

Hereinafter, preferred embodiments of the present disclosure will be described in detail with reference to the accompanying drawings. The following embodiments do not inappropriately limit the contents of the present disclosure described in the claims. Not all of the configurations described below are essential components of the present disclosure.

1. Semiconductor Device

1-1. First Embodiment 1-1-1. Configuration of Semiconductor Device

FIG. 1 is a diagram illustrating a configuration example of a semiconductor device according to a first embodiment. As illustrated in FIG. 1, the semiconductor device 1 according to the first embodiment includes a communication interface circuit 10, a memory 20, a temperature sensor 80, switches 81 and 82, a sound source reproduction circuit 100, and an inspection circuit 110. The semiconductor device 1 is coupled to the sound reproduction device 3. The semiconductor device 1 may be a semiconductor integrated circuit device of one chip, may be configured as a semiconductor integrated circuit device of a plurality of chips, or may be configured such that at least a part thereof is configured with an electronic component other than the semiconductor integrated circuit device.

The semiconductor device 1 has three operation modes of a normal operation mode, an inspection mode, and a calibration mode. The normal operation mode is an operation mode in which the sound reproduction device 3 reproduces a sound. The inspection mode is an operation mode for determining a state of the sound reproduction device 3. The calibration mode is a mode for creating information necessary for the state determination of the sound reproduction device 3.

The memory 20 stores n pieces of sound source data 21-1 to 21-*n*. n is an integer of 1 or more. The memory 20 may be, for example, a flash memory. Each of the sound source data 21-1 to 21-*n* may be, for example, pulse code modulated audio data or adaptively difference pulse code modulated audio data. The sound source data 21-1 to 21-*n* may be, for example, data that is a basis for an audio imitating a voice when a human speaks, or various sounds such as a mechanical warning sound or an effect sound.

The communication interface circuit 10 is a circuit that performs data communication with a micro control unit 2. The communication interface circuit 10 may be, for example, an SPI interface circuit or an I2C interface circuit.

SPI is an abbreviation for Serial Peripheral Interface, and I2C is an abbreviation for Inter-Integrated Circuit.

The communication interface circuit 10 receives various commands transmitted from the micro control unit 2 and generates various control signals corresponding to the received commands. For example, when a command to switch the operation mode of the semiconductor device 1 to the normal operation mode, the inspection mode, or the calibration mode is received, the communication interface circuit 10 generates a control signal for switching the coupling of switches 41, 42, 81, and 82 depending on the operation mode. In addition, for example, when a sound source reproduction command for causing the sound reproduction device 3 to reproduce sound source data 21-*i* is received, the communication interface circuit 10 reads the sound source data 21-*i* from the memory 20, inputs the sound source data 21-*i* to the sound source reproduction circuit 100 as a sound source signal DI, and instructs the sound source reproduction circuit 100 to perform the reproduction via the sound reproduction device 3. The sound source data 21-*i* is any one of the sound source data 21-1 to 21-*n* stored in the memory 20. Further, for example, when a sound source stop command for the sound source data 21-*i* being reproduced is received, the communication interface circuit 10 instructs the sound source reproduction circuit 100 to stop the reproduction. Further, for example, when various setting commands related to the sound source reproduction are received, the communication interface circuit 10 performs various settings on the sound source reproduction circuit 100.

In the present embodiment, the sound source signal DI input to the sound source reproduction circuit 100 is a pulse code modulated signal. When the sound source data 21-1 to 21-*n* are compressed audio data or adaptively difference pulse code modulated audio data, the sound source data 21-*i* to be reproduced is converted into the sound source signal DI, which is the pulse code modulated signal, by a decoder (not illustrated).

The sound source reproduction circuit 100 converts the sound source signal DI into amplified signals DOXP and DOXN, which are sound signals, and outputs the amplified signals DOXP and DOXN to the sound reproduction device 3. As a result, the sounds corresponding to the amplified signals DOXP and DOXN are output from the sound reproduction device 3. For example, the sound reproduction device 3 may be a speaker or a buzzer. The sound output from the sound reproduction device 3 may be, for example, an audio imitating a voice when a human speaks, or various sounds such as a mechanical warning sound or an effect sound.

As illustrated in FIG. 1, in the present embodiment, the sound source reproduction circuit 100 includes a modulation circuit 30, the switches 41 and 42, and an amplification circuit 50.

The modulation circuit 30 receives the sound source signal DI, modulates a signal based on the sound source signal DI, and outputs modulated signals DOP and DON. The signal based on the sound source signal DI may be the sound source signal DI itself or may be a signal obtained by performing some processing on the sound source signal DI. In the present embodiment, the modulation circuit 30 includes a digital filter 31, a sigma-delta modulation circuit 32, and a pulse width modulation circuit 33.

The digital filter 31 is a low-pass filter that receives the sound source signal DI and outputs a signal DF in which a high-frequency noise included in the sound source signal DI is reduced. The sigma-delta modulation circuit 32 receives the signal DF from the digital filter 31, and performs sigma-delta modulation by oversampling the signal DF at an n-fold sampling ratio, to output a sigma-delta modulated signal DS in which noise is biased to a high-frequency band. n is an integer of 2 or more. Therefore, when a sampling frequency of the sound source signal DI is fs, a sampling frequency of the signal DF output from the digital filter 31 is fs, and a sampling frequency of the sigma-delta modulated signal DS is n×fs. The digital filter 31 functions as an anti-aliasing filter that reduces the high-frequency noise aliased to a signal band via the oversampling of the sigma-delta modulation circuit 32.

The pulse width modulation circuit 33 performs pulse width modulation on the sigma-delta modulated signal DS to output the modulated signals DOP and DON. Each of the modulated signals DOP and DON is a digital signal of 1 bit. When the sampling frequency of the sigma-delta modulated signal DS is n×fs, the sampling frequency of the modulated signals DOP and DON is n×m×fs. Here, when the number of bits of the sigma-delta modulated signal DS is M, $m=2^M$.

As described above, the modulation circuit 30 performs sigma-delta modulation on a signal obtained by performing digital filter processing on the sound source signal DI, and further performs the pulse width modulation to output the modulated signals DOP and DON.

Figure 3:
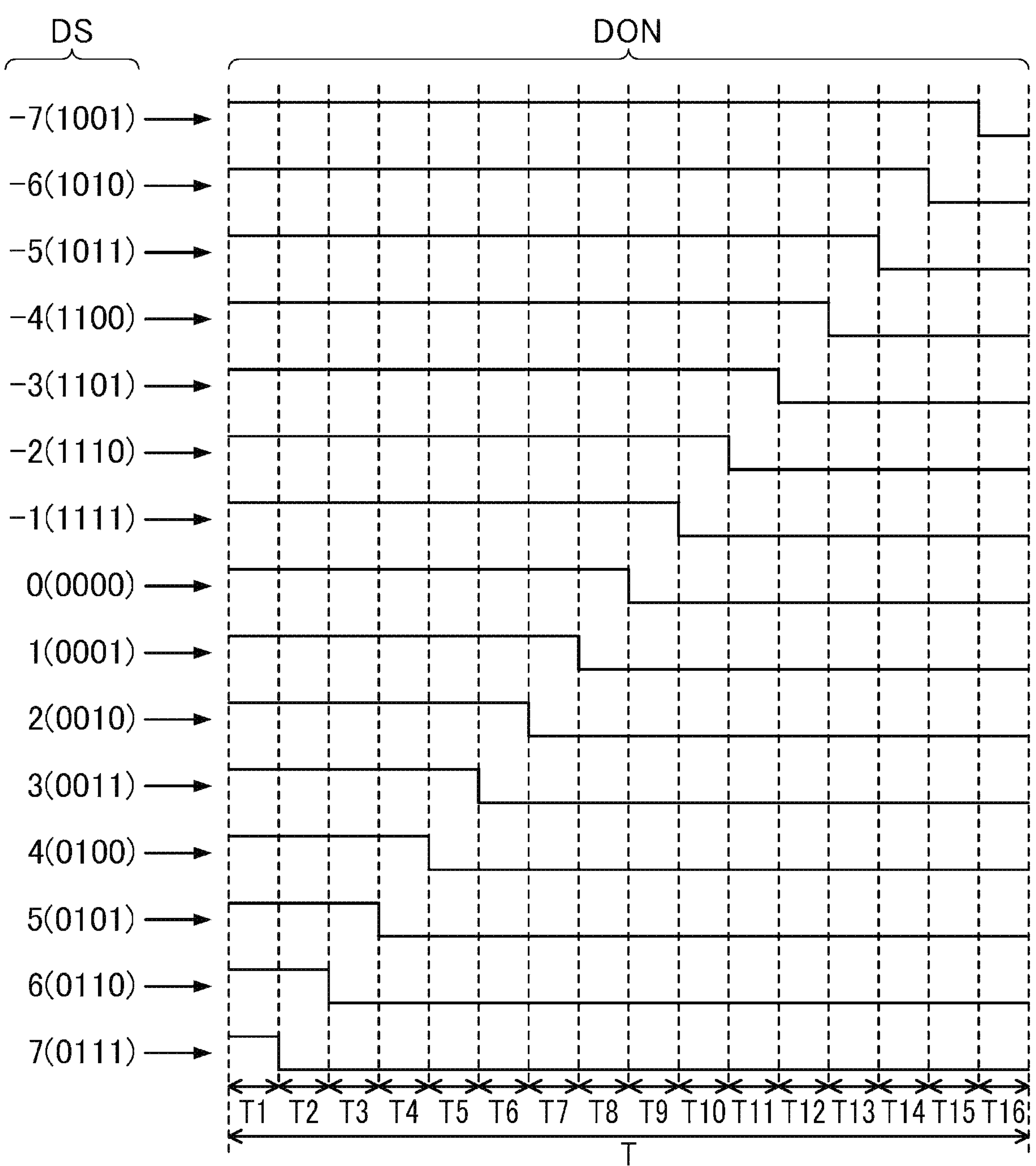
FIG. 3 is a diagram illustrating an example of pulse width modulation for generating a modulated signal.

The pulse width modulation for generating the modulated signal DOP and the pulse width modulation for generating the modulated signal DON are performed with different methods. FIG. 2 is a diagram illustrating an example of the pulse width modulation for generating the modulated signal DOP. FIG. 3 is a diagram illustrating an example of the pulse width modulation for generating the modulated signal DON. FIGS. 2 and 3 are examples when the number of bits M of the sigma-delta modulated signal DS is four. In FIGS. 2 and 3, the sigma-delta modulated signal DS is updated with a period T as a cycle, and the modulated signals DOP and DON are at a high level or a low level in each of 16 sections T1 to T16 obtained by dividing the period T. That is, a length of the period T is 1/(n×fs), and a length of each of the sections T1 to T16 is 1/(n×m×fs).

As illustrated in FIG. 2, a high-level time of the modulated signal DOP is longer as a value of the sigma-delta modulated signal DS is larger. For example, when the sigma-delta modulated signal DS is "−7" in decimal, that is, "1001" in binary, the modulated signal DOP is at a high level in the one section T1 and is at a low level in the 15 sections T2 to T16. For example, when the sigma-delta modulated signal DS is "0" in decimal, that is, "0000" in binary, the modulated signal DOP is at a high level in the eight sections T1 to T8 and is at a low level in the eight sections T9 to T16. For example, when the sigma-delta modulated signal DS is "7" in decimal, that is, "0111" in binary, the modulated signal DOP is at a high level in the 15 sections T1 to T15 and is at a low level in the one section T16.

As illustrated in FIG. 3, a high-level time of the modulated signal DON is shorter as the value of the sigma-delta modulated signal DS is larger. For example, when the sigma-delta modulated signal DS is "−7" in decimal, that is, "1001" in binary, the modulated signal DON is at a high level in the 15 sections T1 to T15 and is at a low level in the one section T16. For example, when the sigma-delta modulated signal DS is "0" in decimal, that is, "0000" in binary, the modulated signal DON is at a high level in the eight sections T1 to T8 and is at a low level in the eight sections T9 to T16. For example, when the sigma-delta modulated signal DS is "7" in decimal, that is, "0111" in binary, the modulated signal DON is at a high level in the one section T1 and is at a low level in the 15 sections T2 to T16.

Figure 4:
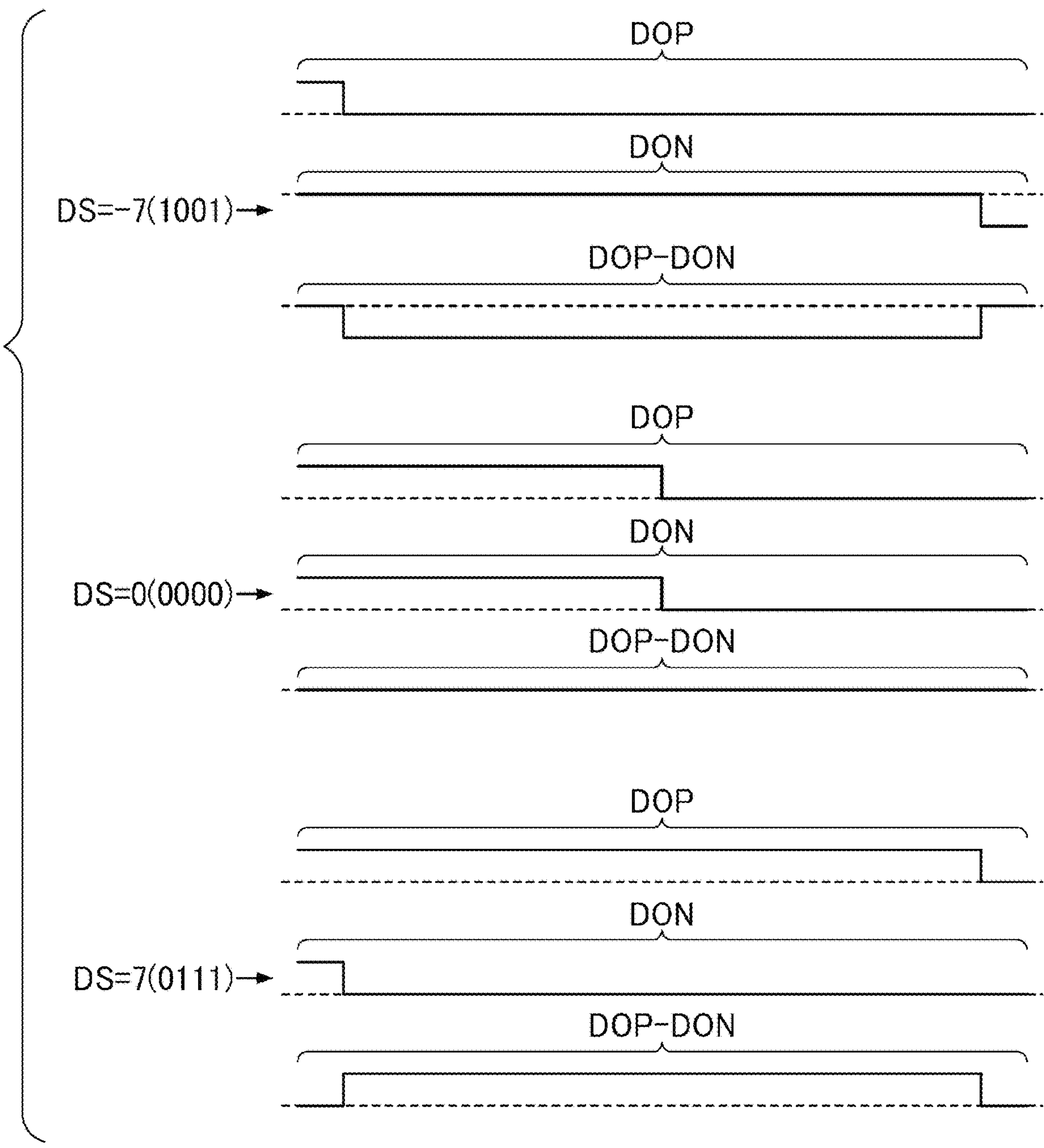
FIG. 4 is a diagram illustrating an example of a difference between the modulated signal and the modulated signal.

Therefore, for example, a difference between the modulated signal DOP and the modulated signal DON when the sigma-delta modulated signal DS is "−7", "0", and "7" in decimal is as illustrated in FIG. 4.

Returning to the description of FIG. 1, the switch 41 outputs any one of the modulated signal DOP and a modulated signal TP to a class-D amplifier 51P of the amplification circuit 50 in response to the control signal output from the communication interface circuit 10. Specifically, the switch 41 outputs the modulated signal DOP to the class-D amplifier 51P when the operation mode of the semiconductor device 1 is the normal operation mode, and outputs the modulated signal TP to the class-D amplifier 51P when the operation mode of the semiconductor device 1 is the inspection mode or the calibration mode.

Further, the switch 42 outputs any one of the modulated signal DON and a modulated signal TN to a class-D amplifier 51N of the amplification circuit 50 in response to the control signal output from the communication interface circuit 10. Specifically, the switch 42 outputs the modulated signal DON to the class-D amplifier 51N when the operation mode of the semiconductor device 1 is the normal operation mode, and outputs the modulated signal TN to the class-D amplifier 51N when the operation mode of the semiconductor device 1 is the inspection mode or the calibration mode.

In the normal operation mode, the amplification circuit 50 receives the modulated signals DOP and DON, and outputs amplified signals DOXP and DOXN obtained by amplifying the modulated signals DOP and DON to output terminals 91 and 92 of the semiconductor device 1. In the inspection mode and the calibration mode, the amplification circuit 50 receives the modulated signals TP and TN, and outputs the amplified signals DOXP and DOXN obtained by amplifying the modulated signals TP and TN to the output terminals 91 and 92 of the semiconductor device 1.

In the present embodiment, the amplification circuit 50 includes the two class-D amplifiers 51P and 51N. The class-D amplifier 51P outputs the amplified signal DOXP obtained by amplifying the modulated signal DOP to the output terminal 91 in the normal operation mode, and outputs the amplified signal DOXP obtained by amplifying the modulated signal TP to the output terminal 91 in the inspection mode and the calibration mode. The class-D amplifier 51N outputs the amplified signal DOXN obtained by amplifying the modulated signal DON to the output terminal 92 in the normal operation mode, and outputs the amplified signal DOXN obtained by amplifying the modulated signal TN to the output terminal 92 in the inspection mode and the calibration mode. The output terminal 91 is coupled to a terminal P1 of the sound reproduction device 3, and the output terminal 92 is coupled to a terminal P2 of the sound reproduction device 3. The sound reproduction device 3 reproduces a sound having a magnitude corresponding to a voltage difference between the amplified signal DOXP and the amplified signal DOXN. It is preferable that the sound reproduction device 3 outputs a desired sound indicated by the sound source reproduction command in the normal operation mode, and outputs a very small sound that is difficult to be heard by a human ear in the inspection mode and the calibration mode. That is, it is preferable that a volume of the sound reproduced by the sound reproduction device 3 in the inspection mode and the calibration mode is smaller than a minimum value of a volume of the sound reproduced by the sound reproduction device 3 in the normal operation mode. In other words, it is preferable that a voltage difference between the amplified signal DOXP and the amplified signal DOXN in the inspection mode and the calibration mode is smaller than a voltage difference between the amplified signal DOXP and the amplified signal DOXN when the minimum sound is output from the sound reproduction device 3 in the normal operation mode. As a result, it can be made less noticeable to a user that the semiconductor device 1 is operating in the inspection mode or the calibration mode.

The inspection circuit 110 is a circuit that inspects the sound reproduction device 3.

FIG. 5 is a diagram illustrating an example of a relationship between a state of the speaker, which is an example of the sound reproduction device 3, and an impedance characteristic thereof. In FIG. 5, a horizontal axis is a frequency of an input signal of the speaker, and a vertical axis is an impedance value of the speaker. G1 is an example of an impedance characteristic when the speaker is normal. A peak frequency, which is a frequency of the input signal at which an impedance of the speaker reaches a peak, varies depending on the type of the speaker, but the peak frequency is included in at least a frequency band of 20 Hz or higher, which is a lower limit of an audible range of a human, and 3 kHz or lower, which is a frequency used for a buzzer warning sound, when the speaker is normal. G2 is an example of an impedance characteristic in a state where a magnet of the speaker is damaged and removed. When the magnet of the speaker is removed, only a coil remains, so that the impedance value slowly increases as the frequency is higher, and the peak frequency disappears. G3 is an example of an impedance characteristic in a state where a cone paper of the speaker is torn. When the cone paper, which is a vibration surface of the speaker, is torn, a low-tone sound is not emitted, and the peak frequency is shifted to the high frequency side.

As described above, the peak frequency changes depending on the state of the speaker. Therefore, in the present embodiment, in the inspection mode, the inspection circuit 110 detects the peak frequency of the sound reproduction device 3, and determines the state of the sound reproduction device 3 based on the detected peak frequency. In the calibration mode, the inspection circuit 110 detects the peak frequency of the sound reproduction device 3 and creates information necessary for determining the state of the sound reproduction device 3 based on the detected peak frequency.

In the present embodiment, the inspection circuit 110 includes a test signal generation circuit 60, a determination circuit 61, a memory 62, and a peak frequency detection circuit 70. The test signal generation circuit 60 and the peak frequency detection circuit 70 operate in the inspection mode and the calibration mode, and stop the operation in the normal operation mode. The determination circuit 61 operates in the inspection mode, and stops the operation in the normal operation mode and the calibration mode.

The test signal generation circuit 60 modulates a test signal of which a frequency is changed in a frequency band set in advance, to generate the modulated signals TP and TN. The frequency band in which the test signal generation circuit 60 changes the frequency of the test signal can be set to any frequency band by the micro control unit 2, and may be, for example, a frequency band of 10 Hz or higher and 3 kHz or lower. In the present embodiment, the test signal generation circuit 60 performs the pulse width modulation on the test signal to generate the modulated signals TP and TN. The pulse width modulation method via the test signal generation circuit 60 is the same as the pulse width modulation method via the pulse width modulation circuit 33.

The peak frequency detection circuit 70 measures a potential difference between the output terminal 91 and the output terminal 92, and detects a peak frequency which is a frequency of the test signal at which the impedance of the sound reproduction device 3 reaches a peak. The peak frequency detection circuit 70 further detects a peak voltage, which is a voltage obtained by amplifying the potential difference between the output terminal 91 and the output terminal 92 when the frequency of the test signal is the peak frequency. As will be described below, the peak frequency or the peak voltage changes in response to a temperature of the sound reproduction device 3.

The memory 62 includes a non-volatile memory (not illustrated), and the non-volatile memory stores table information in which a plurality of temperatures and a plurality of peak frequencies related to the sound reproduction device 3 are associated with each other. The table information also defines a correspondence relationship between the plurality of temperatures and a plurality of peak voltages related to the sound reproduction device 3. The memory 62 includes a volatile memory (not illustrated) that stores various temporarily created data.

The determination circuit 61 determines whether or not the peak frequency detected by the peak frequency detection circuit 70 is included in a reference frequency range. The reference frequency range is a range of a frequency determined based on the frequency band of the test signal and temperature information which is information on the temperature of the sound reproduction device 3. In the present embodiment, the determination circuit 61 acquires a temperature signal output from the temperature sensor 80 as the temperature information, and calculates the reference frequency range based on the acquired temperature signal and the table information stored in the memory 62. The determination circuit 61 further determines whether or not the peak voltage detected by the peak frequency detection circuit 70 is included in a reference voltage range. The reference voltage range is a range of a voltage determined based on the frequency band of the test signal and the temperature information which is the information on the temperature of the sound reproduction device 3. The determination circuit 61 calculates the reference voltage range based on the temperature signal output from the temperature sensor 80 and the table information stored in the memory 62. Further, in the present embodiment, the determination circuit 61 determines the state of the sound reproduction device 3, such as the presence or absence of a failure of the sound reproduction device 3, based on the determination result of whether or not the peak frequency is included in the reference frequency range or the determination result of whether or not the peak voltage is included in the reference voltage range. The details of the processing of the determination circuit 61 will be described below.

The temperature sensor 80 detects the temperature, and outputs the temperature signal having the magnitude corresponding to the detected temperature. In FIG. 1, although the temperature sensor 80 is built in the semiconductor device 1 and directly detects the temperature of the semiconductor device 1, the temperature of the semiconductor device 1 and the temperature of the sound reproduction device 3 change similarly depending on the temperature of the periphery of the semiconductor device 1 and the sound reproduction device 3, and thus the temperature of the sound reproduction device 3 is indirectly detected. It should be noted that the temperature sensor 80 may be provided outside the semiconductor device 1 in the vicinity of the sound reproduction device 3 in order to directly detect the temperature of the sound reproduction device 3.

The switch 81 switches whether to electrically couple or cut off between the output terminal 91 of the semiconductor device 1 and the peak frequency detection circuit 70 in response to the control signal output from the communication interface circuit 10. Specifically, the switch 81 electrically cuts off between the output terminal 91 and the peak frequency detection circuit 70 when the operation mode of the semiconductor device 1 is the normal operation mode, and electrically couples the output terminal 91 and the peak frequency detection circuit 70 when the operation mode of the semiconductor device 1 is the inspection mode or the calibration mode.

Similarly, the switch 82 switches whether to electrically couple or cut off between the output terminal 92 of the semiconductor device 1 and the peak frequency detection circuit 70 in response to the control signal output from the communication interface circuit 10. Specifically, the switch 82 electrically cuts off between the output terminal 92 and the peak frequency detection circuit 70 when the operation mode of the semiconductor device 1 is the normal operation mode, and electrically couples the output terminal 92 and the peak frequency detection circuit 70 when the operation mode of the semiconductor device 1 is the inspection mode or the calibration mode.

As described above, the peak frequency detection circuit 70 is electrically cut off from the output terminals 91 and 92 in the normal operation mode by the switches 81 and 82, and is electrically coupled to the output terminals 91 and 92 in the inspection mode and the calibration mode to measure the potential difference between the output terminal 91 and the output terminal 92 and detect the peak frequency and the peak voltage.

When a command to read the information on the determination result of the determination circuit 61 is received from the micro control unit 2, the communication interface circuit 10 acquires information on the determination result from the determination circuit 61 and transmits the information to the micro control unit 2. The micro control unit 2 can recognize the state of the sound reproduction device 3 and perform various types of processing corresponding to the state of the sound reproduction device 3 based on the information on the determination result.

1-1-2. State Determination of Sound Reproduction Device

Figure 6:
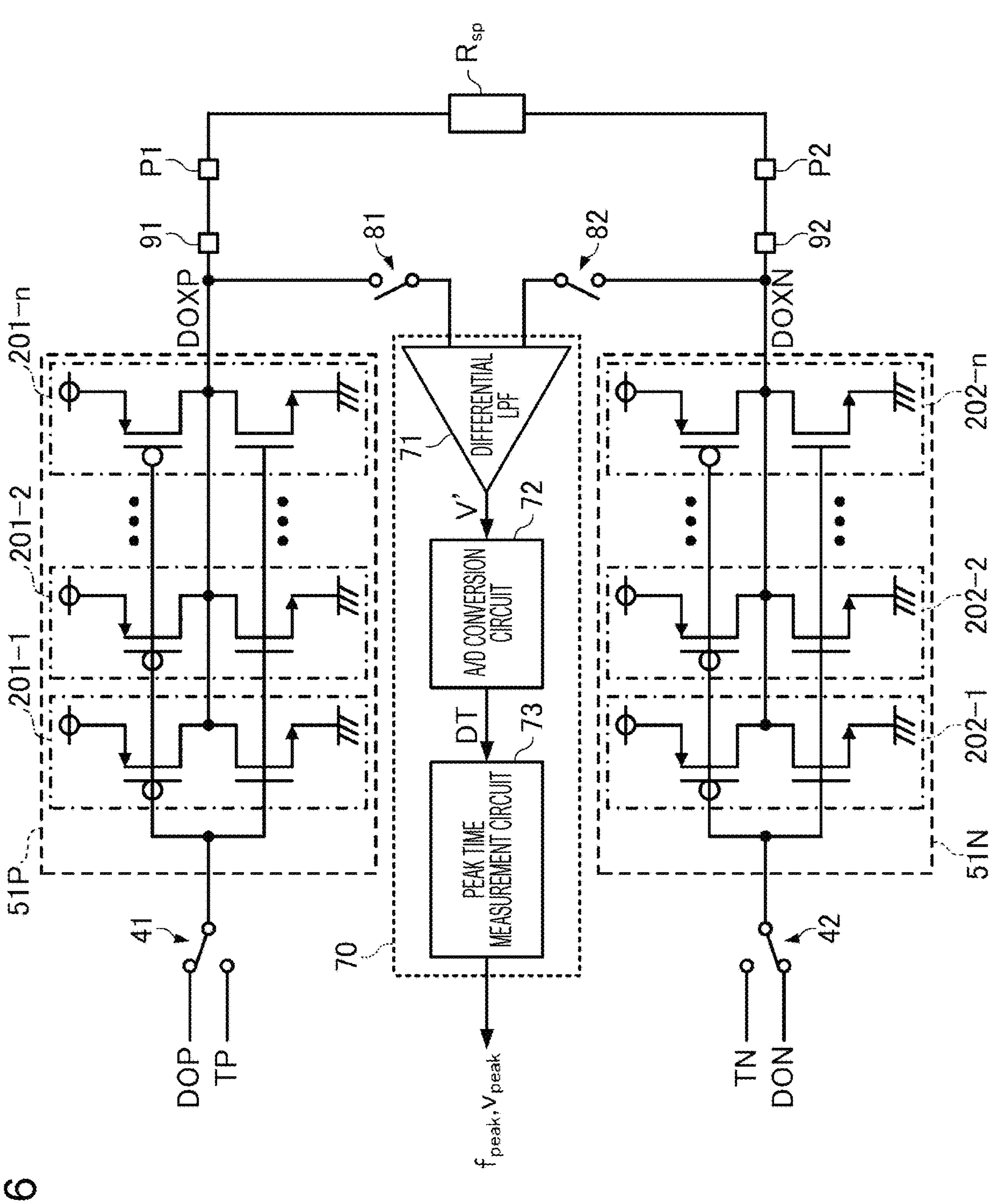
FIG. 6 is a diagram illustrating a configuration example of a class-D amplifier, a peak frequency detection circuit, and peripheral circuits thereof.
Figure 7:
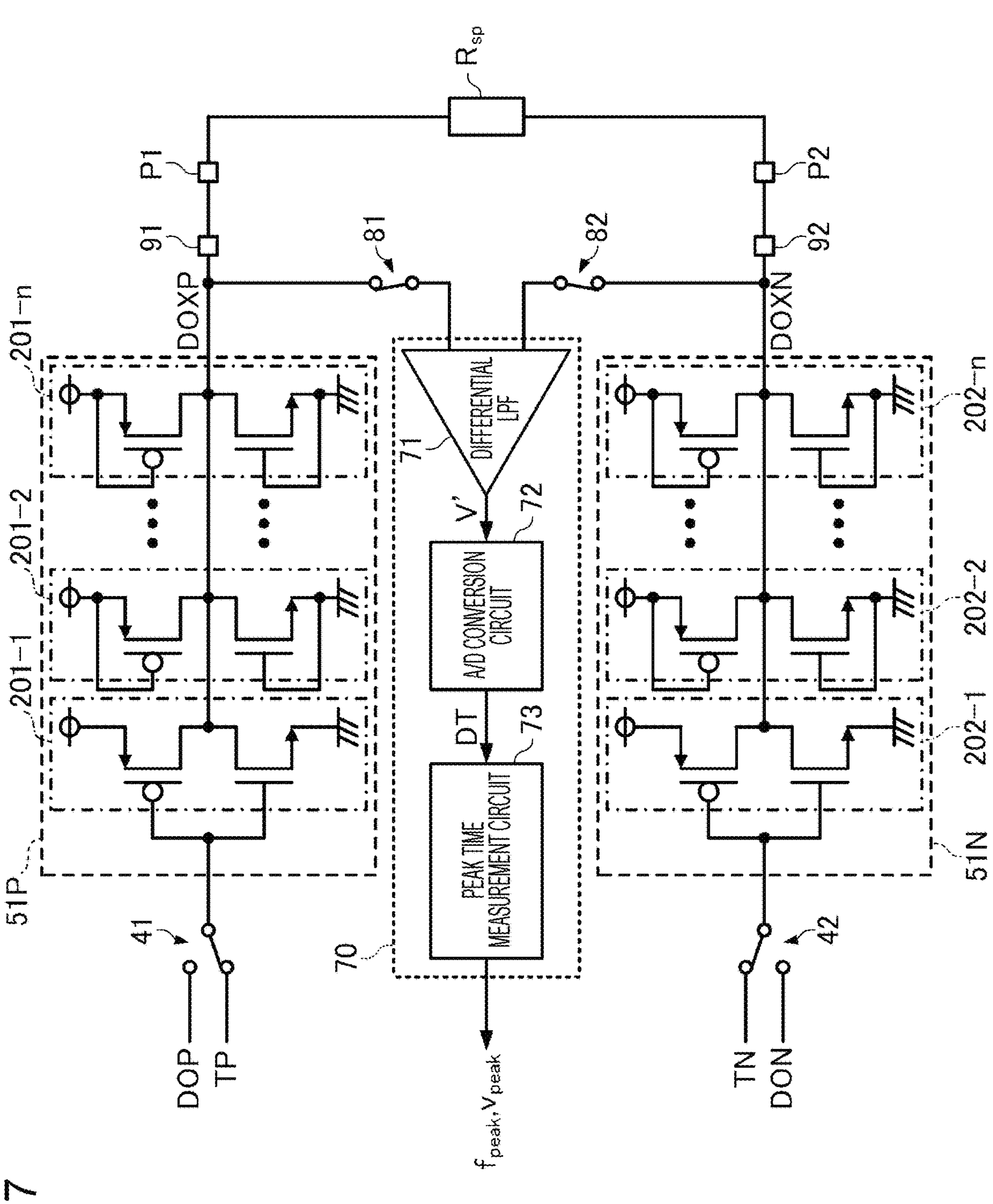
FIG. 7 is a diagram illustrating a configuration example of the class-D amplifier, the peak frequency detection circuit, and the peripheral circuits thereof.

FIGS. 6 and 7 are diagrams illustrating a configuration example of the class-D amplifiers 51P and 51N, the peak frequency detection circuit 70, and peripheral circuits thereof. FIG. 6 illustrates a configuration in the normal operation mode, and FIG. 7 illustrates a configuration in the inspection mode and the calibration mode.

As illustrated in FIGS. 6 and 7, the class-D amplifier 51P includes a plurality of inverter circuits 201-1 to **201-*n*, and the class-D amplifier 51N includes a plurality of inverter circuits 202-1 to 202-*n*. n is an integer of 2 or more, and may be, for example, about 10 to 100. Each of the inverter circuits 201-1 to 201-*n* is configured by a pair of a PMOS transistor and an NMOS transistor, and an output terminal which is a node to which a drain of the PMOS transistor and a drain of the NMOS transistor are coupled is coupled to the output terminal 91. Similarly, each of the inverter circuits 202-1 to 202-*n* is configured by a pair of a PMOS transistor and an NMOS transistor, and an output terminal which is a node to which a drain of the PMOS transistor and a drain of the NMOS transistor are coupled is coupled to the output terminal 92**.

As illustrated in FIG. 6, in the normal operation mode, the modulated signal DOP is input to the input terminal of each of the inverter circuits 201-1 to 201-*n* included in the class-D amplifier 51P via the switch 41, and the modulated signal DON is input to the input terminal of each of the inverter circuits 202-1 to 202-*n* included in the class-D amplifier 51N via the switch 42. That is, in the normal operation mode, the inverter circuits 201-1 to 201-*n* included in the class-D amplifier 51P are coupled parallel between the modulation circuit 30 and the output terminal 91 of the semiconductor device 1, and the inverter circuits 202-1 to 202-*n* included in the class-D amplifier 51N are coupled parallel between the modulation circuit 30 and the output terminal 92 of the semiconductor device 1. Accordingly, an on-resistance $R_{onP}$ of the class-D amplifier 51P is 1/n of an on-resistance of the inverter circuit 201-1, and an on-resistance $R_{onN}$ of the class-D amplifier 51N is 1/n of an on-resistance of the inverter circuit 202-1.

Then, the amplification circuit 50 outputs the amplified signal DOXP obtained by amplifying the modulated signal DOP to the output terminal 91, and outputs the amplified signal DOXN obtained by amplifying the modulated signal DON to the output terminal 92. The output terminals 91 and 92 are coupled to the terminals P1 and P2 of the sound reproduction device 3, respectively. An impedance $R_{sp}$ between the terminal P1 and the terminal P2 is, for example, 4Ω to 128Ω, and in the normal operation mode, the on-resistance $R_{onP}$ of the class-D amplifier 51P and the on-resistance $R_{onN}$ of the class-D amplifier 51N are about 1/10 to 1/100 of the impedance $R_{sp}$ of the sound reproduction device 3.

As illustrated in FIG. 6, in the normal operation mode, the switches 81 and 82 are non-conductive, and the peak frequency detection circuit 70 is electrically cut off from the output terminals 91 and 92 of the semiconductor device 1.

On the other hand, as illustrated in FIG. 7, in the inspection mode and the calibration mode, the modulated signal TP is input to each input terminal of some inverter circuits among the inverter circuits 201-1 to 201-*n* of the class-D amplifier 51P via the switch 41, and each output terminal of some other inverter circuits among the inverter circuits 201-1 to 201-*n* has a high impedance. For example, in the inspection mode and the calibration mode, the modulated signal TP is input to the input terminal of the inverter circuit 201-1, and the output terminal of each of the inverter circuits 201-2 to 201-*n* has a high impedance. Similarly, the modulated signal TN is input to each input terminal of some inverter circuits among the inverter circuits 202-1 to 202-*n* of the class-D amplifier 51N via the switch 42, and each output terminal of some other inverter circuits among the inverter circuits 202-1 to 202-*n* has a high impedance. For example, in the inspection mode and the calibration mode, the modulated signal TN is input to the input terminal of the inverter circuit 202-1, and the output terminal of each of the inverter circuits 202-2 to 202-*n* has a high impedance. As a result, for example, the on-resistance $R_{onP}$ of the class-D amplifier 51P and the on-resistance $R_{onN}$ of the class-D amplifier 51N are substantially the same as the impedance $R_{sp}$.

As illustrated in FIG. 7, in the inspection mode and the calibration mode, the switches 81 and 82 are conductive, and the peak frequency detection circuit 70 is electrically coupled to the output terminals 91 and 92 of the semiconductor device 1.

The peak frequency detection circuit 70 includes a differential low-pass filter 71, an A/D conversion circuit 72, and a peak time measurement circuit 73.

In the inspection mode and the calibration mode, a voltage of the output terminal 91 and a voltage of the output terminal 92 are input to the differential low-pass filter 71 via the switches 81 and 82. That is, the differential low-pass filter 71 receives the amplified signals DOXP and DOXN, reduces a high-frequency noise component superimposed on the amplified signals DOXP and DOXN via the pulse width modulation, and outputs a voltage V' corresponding to the potential difference of the amplified signals DOXP and DOXN. A cutoff frequency of the differential low-pass filter 71 is higher than a maximum frequency of the frequency band in which the test signal generation circuit 60 changes the frequency of the test signal. For example, when the test signal generation circuit 60 changes the frequency of the test signal in the frequency band of 10 Hz or higher and 3 kHz or lower, the cutoff frequency of the differential low-pass filter 71 is higher than 3 kHz. Since the cutoff frequency of the differential low-pass filter 71 is higher than the maximum frequency of the frequency band in which the frequency of the test signal is changed, a frequency component included in the frequency band is not attenuated by the differential low-pass filter 71.

Figure 8:
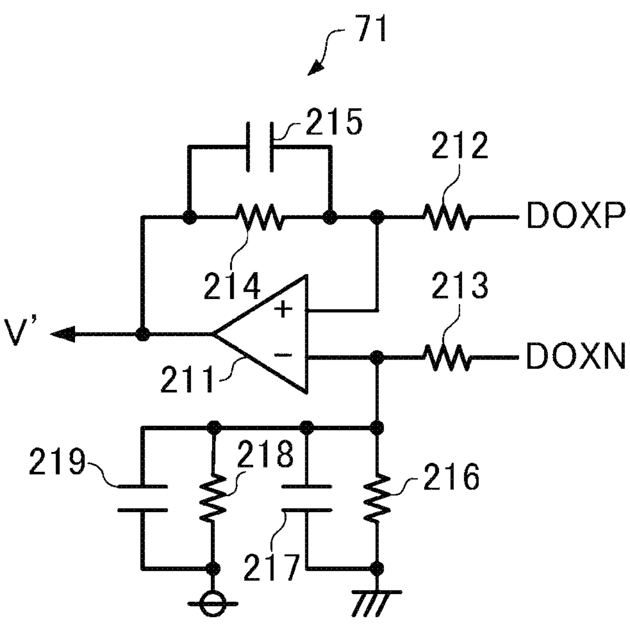
FIG. 8 is a diagram illustrating a configuration example of a differential low-pass filter.

FIG. 8 is a diagram illustrating a configuration example of the differential low-pass filter 71. As illustrated in FIG. 8, the differential low-pass filter 71 includes an operational amplifier 211, five resistors 212, 213, 214, 216, and 218, and three capacitors 215, 217, and 219.

In the inspection mode and the calibration mode, the amplified signal DOXP output to the output terminal 91 of the semiconductor device 1 is input to one end of the resistor 212. The amplified signal DOXN output to the output terminal 92 of the semiconductor device 1 is input to one end of the resistor 213. The other end of the resistor 212, one end of the resistor 214, and one end of the capacitor 215 are coupled to a non-inverting input terminal of the operational amplifier 211. The other end of the resistor 213, one end of the resistor 216, one end of the capacitor 217, one end of the resistor 218, and one end of the capacitor 219 are coupled to an inverting input terminal of the operational amplifier 211.

The other end of the resistor 214 and the other end of the capacitor 215 are coupled to an output terminal of the operational amplifier 211. The other end of the resistor 216 and the other end of the capacitor 217 are grounded, and a power supply voltage is supplied to the other end of the resistor 218 and the other end of the capacitor 219.

The differential low-pass filter 71 configured as described above reduces the high-frequency noise component superimposed on the amplified signals DOXP and DOXN via the pulse width modulation, and outputs the voltage V' corresponding to the potential difference between the amplified signals DOXP and DOXN, that is, the potential difference between the output terminal 91 and the output terminal 92 from the output terminal of the operational amplifier 211. When the power supply voltage is VDD and a ground voltage is 0 V, the voltage V' is higher than VDD×½ when the potential difference between the output terminal 91 and the output terminal 92 in which high-frequency noise components are reduced is positive, the voltage V' is lower than VDD×½ when the potential difference between the output terminal 91 and the output terminal 92 in which high-frequency noise components are reduced is negative.

An amplitude voltage V'(p-p) of the voltage V' and the impedance $R_{sp}$ of the sound reproduction device 3, the on-resistance $R_{onP}$ of the class-D amplifier 51P, and the on-resistance $R_{onN}$ of the class-D amplifier 51N have a relationship of the expression (1). From the expression (1), the amplitude of the voltage V' is larger as the impedance $R_{sp}$ is larger, and thus the amplitude of the voltage V' reaches the maximum when the impedance $R_{sp}$ reaches a peak.

$$V'(p-p) \propto \frac{R_{sp}}{R_{sp}+R_{onP}+R_{onN}} \times VDD \qquad (1)$$

Returning to the description of FIG. 7, the A/D conversion circuit 72 converts the output voltage V' of the differential low-pass filter 71 into an m-bit digital signal, and outputs a digital signal of m-bit as data DT of m-bit. m is an integer of 2 or more. The integer m is set to an appropriate value in response to the requirements such as the detection accuracy of the peak frequency or the size of the peak frequency detection circuit 70.

The peak time measurement circuit 73 measures a peak time, which is a time when the potential difference between the output terminal 91 and the output terminal 92 reaches the maximum, based on the data DT which is the output signal of the A/D conversion circuit 72. Specifically, the peak time measurement circuit 73 measures a time when the data DT reaches the maximum as the peak time. The peak time measurement circuit 73 measures the output voltage V' of the differential low-pass filter 71 at the peak time as the peak voltage. Specifically, the peak time measurement circuit 73 measures a maximum value of the data DT as the peak voltage.

As described above, when the impedance $R_{sp}$ of the sound reproduction device 3 reaches the maximum and when the impedance $R_{sp}$ of the sound reproduction device 3 reaches the peak, the amplitude of the voltage V' reaches the maximum. That is, when the impedance $R_{sp}$ reaches the peak impedance $R_{peak}$, the potential difference between the output terminal 91 and the output terminal 92 reaches the maximum. Since the frequency of the test signal changes sequentially at predetermined timings, the peak frequency, which is a frequency at which the impedance $R_{sp}$ of the sound reproduction device 3 reaches the peak impedance $R_{peak}$, is uniquely determined from the peak time measured by the peak time measurement circuit 73. As described above, in the inspection mode and the calibration mode, the peak frequency detection circuit 70 detects the peak frequency by measuring the peak time, which is the time when the potential difference between the output terminal 91 and the output terminal 92 reaches the maximum. In the inspection mode and the calibration mode, the peak frequency detection circuit 70 further detects a peak voltage which is a voltage obtained by amplifying the potential difference between the output terminal 91 and the output terminal 92 when the frequency of the test signal is the peak frequency.

Hereinafter, the peak frequency detected by the peak frequency detection circuit 70 in the inspection mode will be referred to as $f_{peak}$, and the peak frequency detected by the peak frequency detection circuit 70 in the calibration mode will be referred to as $F_{peak}$. Similarly, the peak voltage detected by the peak frequency detection circuit 70 in the inspection mode will be referred to as $v_{peak}$, and the peak voltage detected by the peak frequency detection circuit 70 in the calibration mode will be referred to as $V_{peak}$.

Figure 9:
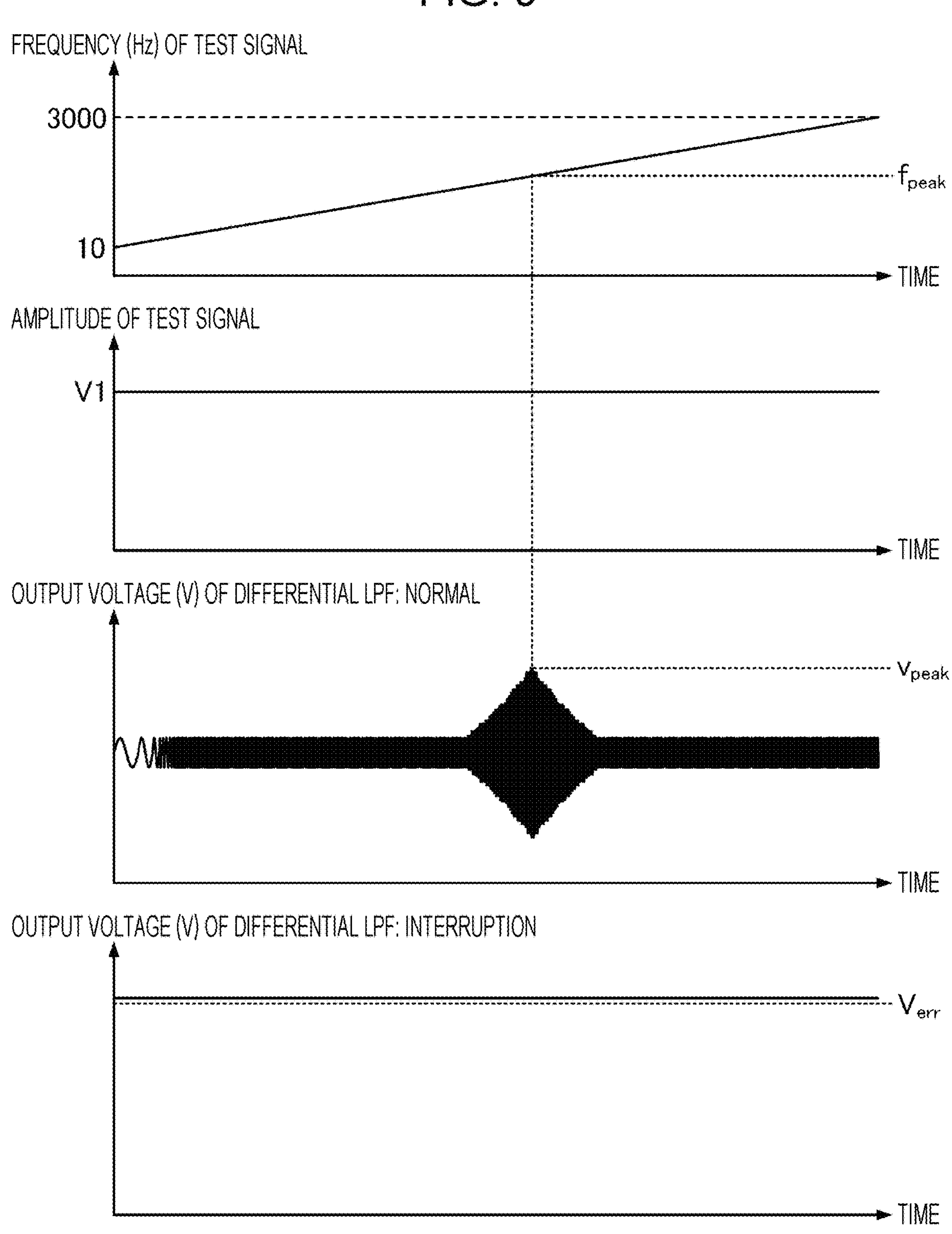
FIG. 9 is a diagram illustrating an example of a relationship between a test signal, a peak frequency, and a peak voltage.

FIG. 9 is a diagram illustrating an example of a relationship between the test signal, the peak frequency $f_{peak}$, and the peak voltage $v_{peak}$ in the inspection mode. In the example of FIG. 9, the test signal generation circuit 60 continuously changes the frequency of the test signal in the frequency band of 10 Hz or higher and 3 kHz or lower while maintaining the amplitude of the test signal at a constant voltage V1. When the sound reproduction device 3 is normal, the output voltage V' of the differential low-pass filter 71 reaches the peak voltage $v_{peak}$ at the peak frequency $f_{peak}$ of the test signal. On the other hand, when the sound reproduction device 3 fails, although not illustrated, the peak frequency $f_{peak}$ or the peak voltage $v_{peak}$ are shifted. Therefore, the determination circuit 61 can determine the state of the sound reproduction device 3 based on the peak frequency $f_{peak}$ or the peak voltage $v_{peak}$. As illustrated in FIG. 9, when an interruption failure occurs between the semiconductor device 1 and the sound reproduction device 3, the output voltage V' of the differential low-pass filter 71 is fixed to the power supply voltage. Therefore, when a predetermined voltage that is higher than the peak voltage $v_{peak}$ in a normal state and is lower than the power supply voltage of the differential low-pass filter 71 is $V_{err}$, the determination circuit 61 can determine the interruption failure when the output voltage V' of the differential low-pass filter 71 is higher than the voltage $V_{err}$, that is, when the data DT is larger than a digital value corresponding to the voltage $V_{err}$.

Figure 10:
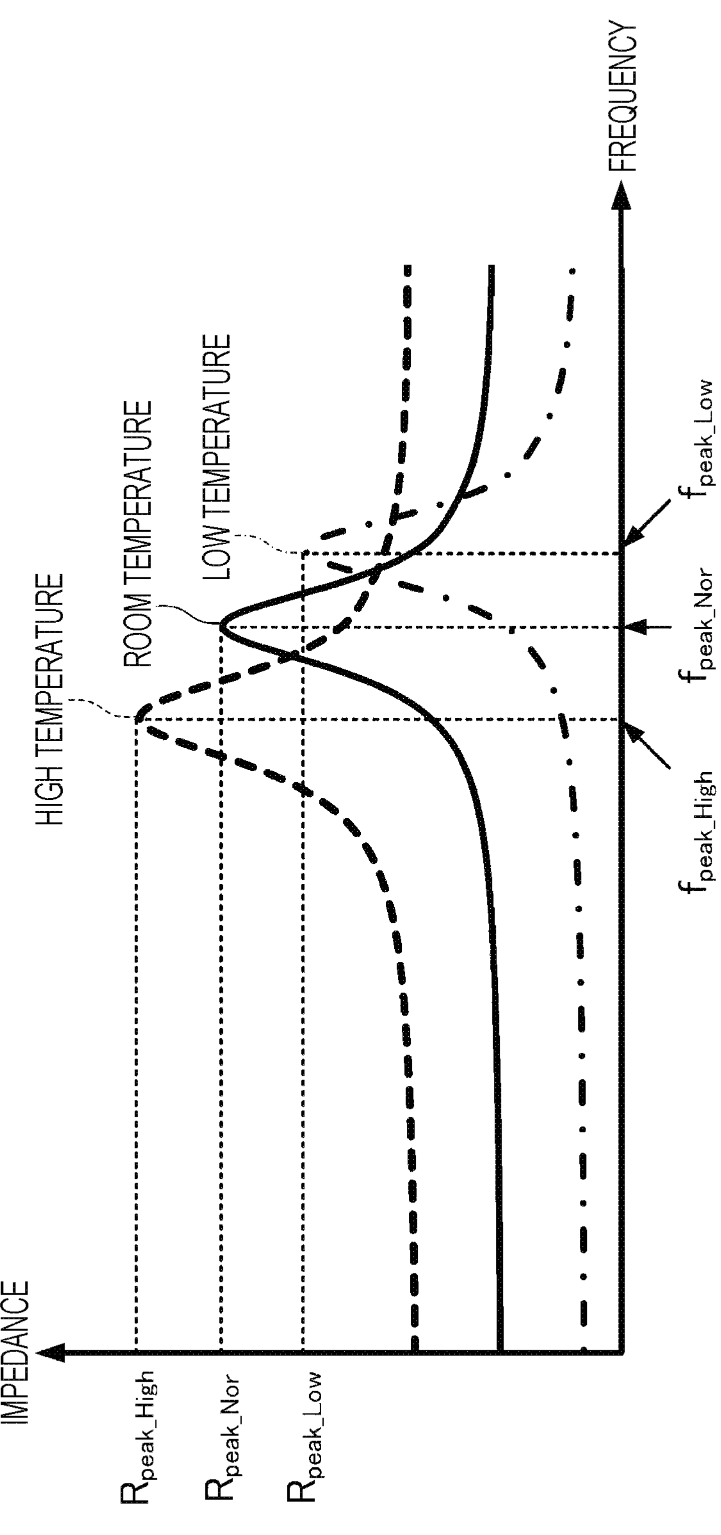
FIG. 10 is a diagram illustrating temperature dependencies of a peak impedance and the peak frequency.

As illustrated in FIG. 10, the peak impedance $R_{peak}$ or the peak frequency $f_{peak}$ changes depending on the temperature. The impedance $R_{sp}$ is larger as the temperature of the sound reproduction device 3 is higher, and is smaller as the temperature of the sound reproduction device 3 is lower. For example, when a temperature range in which the operation of the sound reproduction device 3 is guaranteed is set to −40° C. to 80° C., a peak impedance $R_{peak\_High}$ at a high temperature such as 80° C. is larger than a peak impedance $R_{peak\_Nor}$ at a room temperature such as 25° C. In addition, a peak impedance $R_{peak\_Low}$ at a low temperature such as −40° C. is smaller than a peak impedance $R_{peak\_Nor}$ at a room temperature such as 25° C. As illustrated in FIG. 10, the peak frequency $f_{peak}$ is lower as the temperature of the sound reproduction device 3 is higher, and is higher as the temperature of the sound reproduction device 3 is lower. Therefore, a peak frequency $f_{peak\_High}$ at a high temperature such as 80° C. is lower than a peak frequency $f_{peak\_Nor}$ at a room temperature such as 25° C. In addition, a peak frequency $f_{peak\_Low}$ at a low temperature such as −40° C. is higher than the peak frequency $f_{peak\_Nor}$ at a room temperature such as 25° C.

Figure 11:
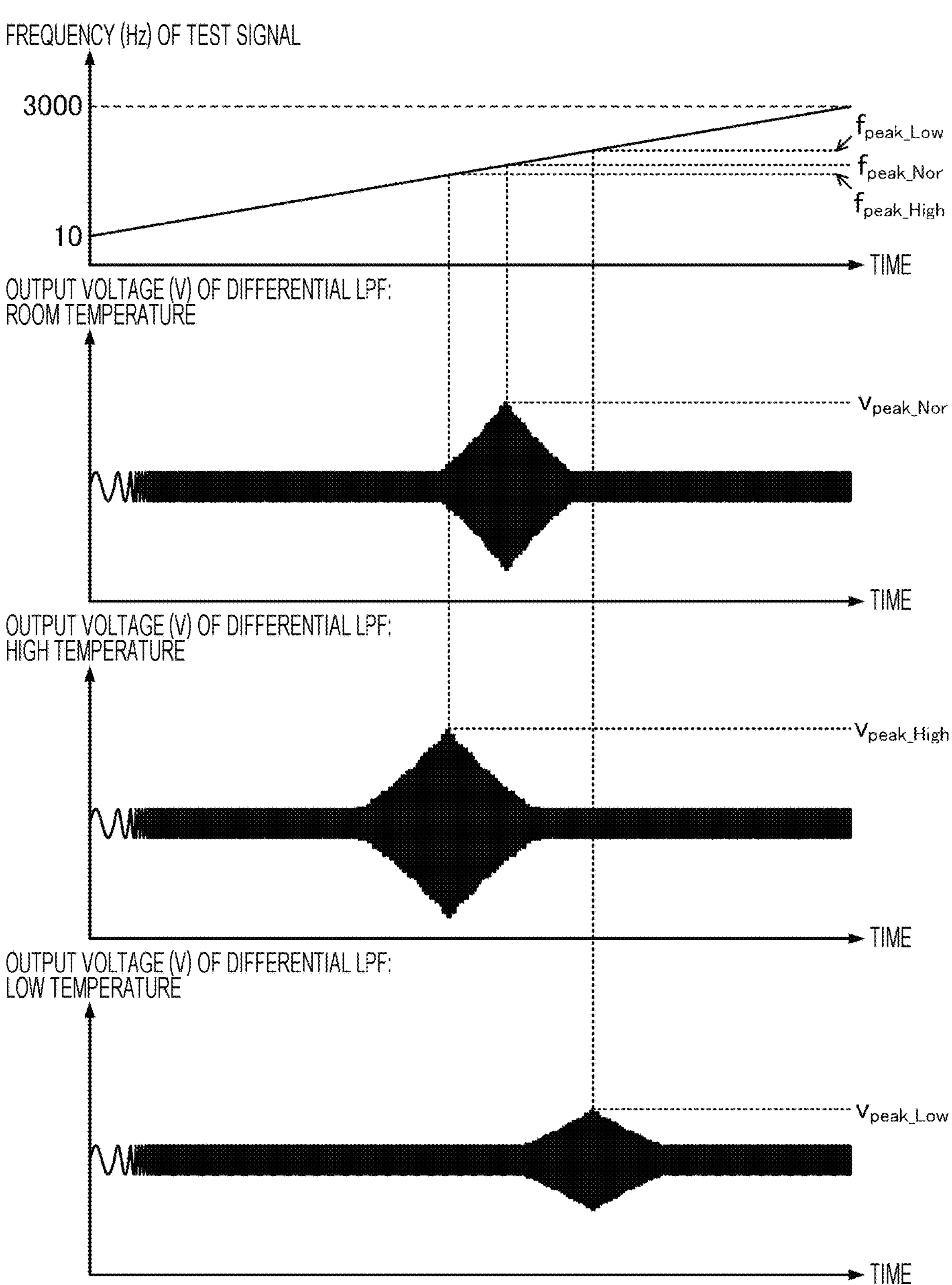
FIG. 11 is a diagram illustrating a temperature dependency of a waveform of an output voltage of the differential low-pass filter.

Since the peak impedance $R_{peak}$ or the peak frequency $f_{peak}$ changes depending on the temperature, as illustrated in FIG. 11, a waveform of the output voltage V' of the differential low-pass filter 71 also changes depending on the temperature. Therefore, the determination circuit 61 calculates the reference frequency range corresponding to the temperature based on the temperature signal output from the temperature sensor 80 and the table information stored in the memory 62, and determines whether or not the peak frequency $f_{peak}$ detected by the peak frequency detection circuit 70 is included in the reference frequency range. In addition, the determination circuit 61 calculates the reference voltage range corresponding to the temperature based on the temperature signal output from the temperature sensor 80 and the table information stored in the memory 62, and determines whether or not the peak voltage $v_{peak}$ detected by the peak frequency detection circuit 70 is included in the reference voltage range.

The relationship between the test signal, the peak impedance $R_{peak}$, the peak frequency $F_{peak}$, and the peak voltage $V_{peak}$ in the calibration mode is the same as the relationship in FIGS. 9, 10, and 11, and thus the illustration and description thereof will be omitted.

1-1-3. Processing Procedure in Calibration Mode

In the present embodiment, when the communication interface circuit 10 receives a command to switch the operation mode of the semiconductor device 1 to the calibration mode from the micro control unit 2, the operation mode of the semiconductor device 1 is switched to the calibration mode. The inspection circuit 110 executes predetermined processing in the calibration mode. In the present embodiment, the semiconductor device 1 and the sound reproduction device 3 are accommodated in a constant temperature bath, and the inspection circuit 110 executes the predetermined processing in synchronization with the constant temperature bath being switched to a plurality of temperatures.

Figure 12:
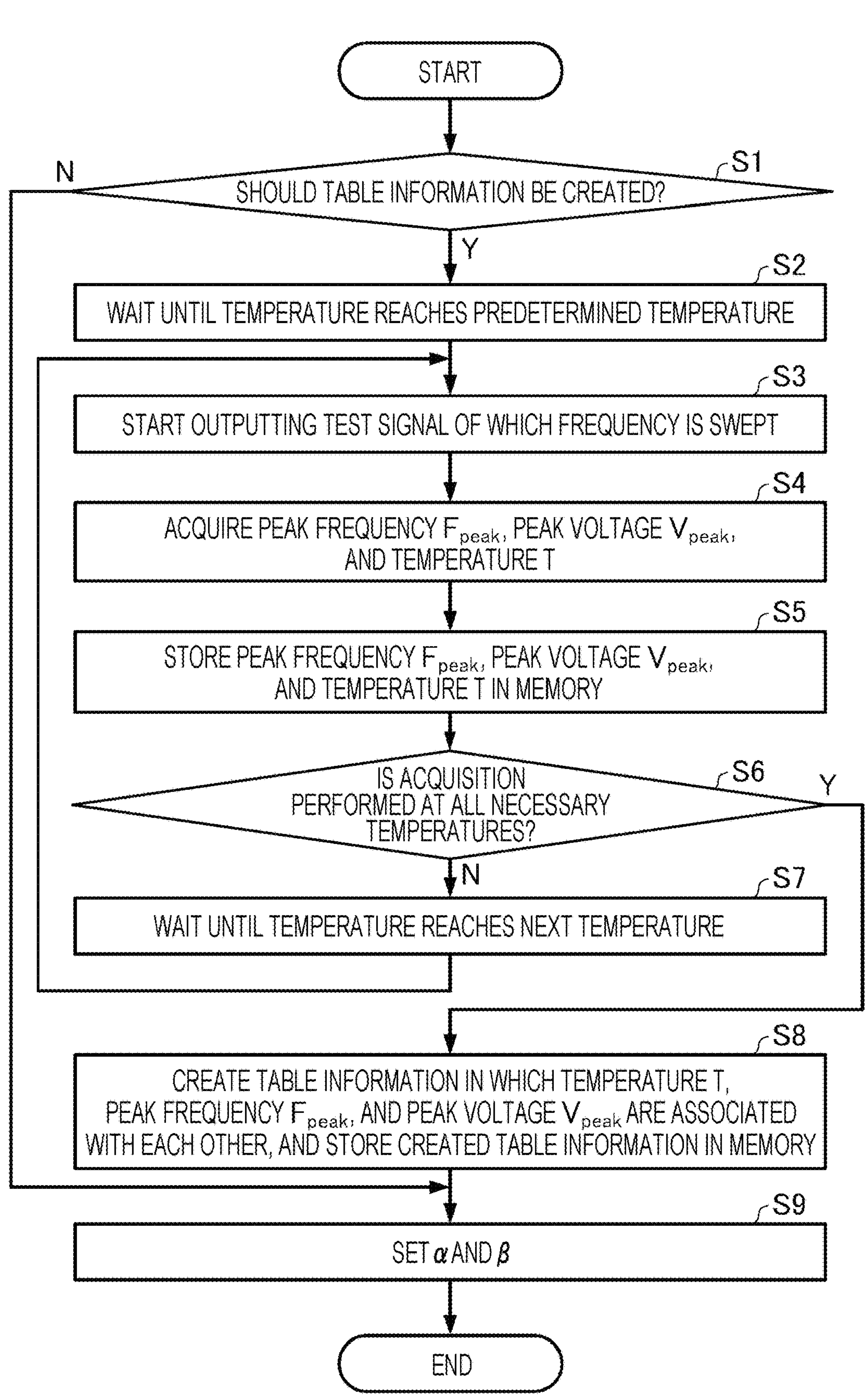
FIG. 12 is a flowchart illustrating an example of a processing procedure of an inspection circuit in a calibration mode in the first embodiment.

FIG. 12 is a flowchart illustrating an example of a processing procedure of the inspection circuit 110 in the calibration mode.

First, in step S1, the determination circuit 61 determines whether or not the table information should be created. For example, the determination circuit 61 may determine whether or not the table information is stored in the memory 62, and determine that the table information should be created when the table information is not stored. For example, the determination circuit 61 may determine that the table information should be created when the communication interface circuit 10 receives a command to instruct the creation of the table information from the micro control unit 2.

When it is determined in step S1 that the table information should be created, the determination circuit 61 waits until the temperature reaches a predetermined temperature, in step S2. For example, the temperature of the constant temperature bath is set to the predetermined temperature, and the determination circuit 61 detects a temperature T based on the temperature signal output from the temperature sensor 80, and determines whether or not the temperature has reached the predetermined temperature based on the acquired temperature T.

Then, in step S3, the test signal generation circuit 60 starts outputting the test signal of which the frequency is swept, and in step S4, the determination circuit 61 acquires the peak frequency $F_{peak}$, the peak voltage $V_{peak}$, and the temperature T.

Then, in step S5, the determination circuit 61 stores the peak frequency $F_{peak}$, the peak voltage $V_{peak}$, and the temperature T acquired in step S4 in the volatile memory of the memory 62.

Then, in step S6, when the determination circuit 61 does not acquire the peak frequency $F_{peak}$, the peak voltage $V_{peak}$, and the temperature T at all necessary temperatures, the determination circuit 61 waits until the temperature reaches a next temperature, in step S7.

The determination circuit 61 repeats the processing of steps S3 to S7 until the peak frequency $F_{peak}$, the peak voltage $V_{peak}$, and the temperature T are acquired at all necessary temperatures. As a result, the determination circuit 61 acquires, for example, the peak frequency $F_{peak\_Low}$, a peak voltage $V_{peak\_Low}$, and a temperature $T_{Low}$ at a low temperature such as −40° C., the peak frequency $F_{peak\_Nor}$, a peak voltage $V_{peak\_Nor}$, and a temperature $T_{Nor}$ at a room temperature such as 25° C., the peak frequency $F_{peak\_High}$, a peak voltage $V_{peak\_High}$, and a temperature $T_{High}$ at a high temperature such as 80° C., and stores the acquired values in the volatile memory of the memory 62.

Then, in step S8, the determination circuit 61 creates the table information in which the temperature T, the peak frequency $F_{peak}$, and the peak voltage $V_{peak}$ are associated with each other by using a plurality of peak frequencies $F_{peak}$, peak voltages $V_{peak}$, and temperatures T stored in the volatile memory of the memory 62 in step S5, and stores the created table information in the non-volatile memory of the memory 62. For example, the determination circuit 61 creates the table information in which the temperature $T_{Low}$, the peak frequency $F_{peak\_Low}$, and the peak voltage $V_{peak\_Low}$ at a low temperature such as −40° C. are associated with each other, the peak frequency $F_{peak\_Nor}$, the peak voltage $V_{peak\_Nor}$, and the temperature $T_{Nor}$ at a room temperature such as 25° C. are associated with each other, and the peak frequency $F_{peak\_High}$, the peak voltage $V_{peak\_High}$, and the temperature $T_{High}$ at a high temperature such as 80° C. are associated with each other.

When the determination circuit 61 determines not to create the table information in step S1, the determination circuit 61 does not perform the processing of steps S2 to S8.

Then, in step S9, the determination circuit 61 sets α and β, and ends the processing in the calibration mode. α is a constant for determining the reference frequency range in consideration of the characteristic variation in the sound reproduction device 3, and β is a constant for determining the reference voltage range in consideration of the characteristic variation in the sound reproduction device 3. For example, the constants α and β are stored in the non-volatile memory of the memory 62, and the determination circuit 61 reads the constants α and β from the non-volatile memory to set the constants α and β in a predetermined internal register.

1-1-4. Processing Procedure in Inspection Mode

In the present embodiment, when the communication interface circuit 10 receives a command to switch the operation mode of the semiconductor device 1 to the inspection mode from the micro control unit 2, the operation mode of the semiconductor device 1 is switched to the inspection mode. When the supply of the power supply voltage to the semiconductor device 1 is started, the operation mode of the semiconductor device 1 may be automatically switched to the inspection mode. The inspection circuit 110 executes predetermined processing in the inspection mode.

FIG. 13 is a flowchart illustrating an example of a processing procedure of the inspection circuit 110 in the inspection mode.

First, in step S11, the test signal generation circuit 60 starts outputting the test signal of which the frequency is swept, and in step S12, the determination circuit 61 acquires the peak frequency $f_{peak}$, the peak voltage $v_{peak}$, and a temperature t.

Figure 14:
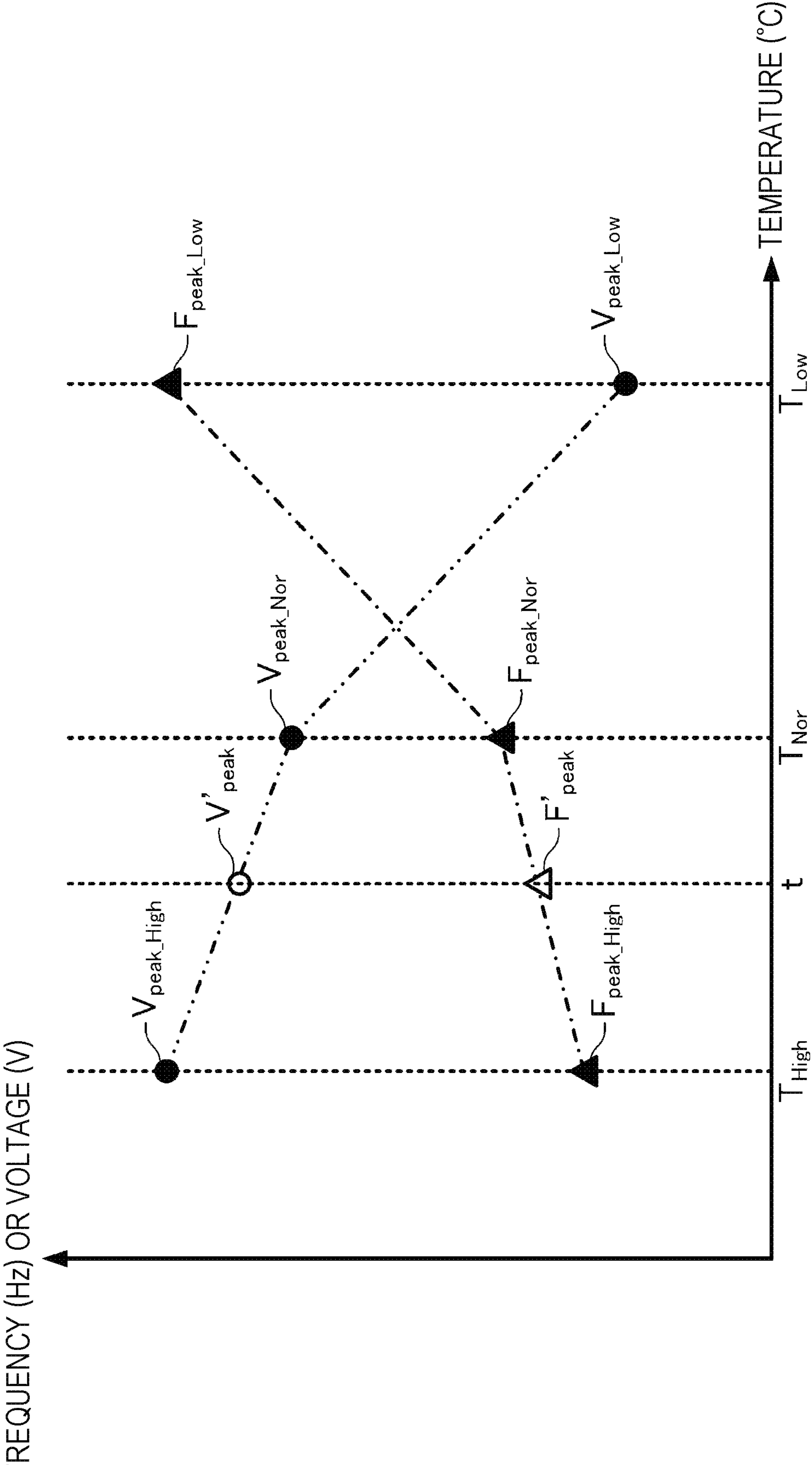
FIG. 14 is a diagram illustrating an example of a method of calculating the peak frequency and the peak voltage in the first embodiment.

Then, in step S13, the determination circuit 61 calculates a peak frequency $F'_{peak}$ and a peak voltage $V'_{peak}$ corresponding to the temperature t acquired in step S12 from the table information stored in the non-volatile memory of the memory 62. FIG. 14 is a diagram illustrating an example of a method of calculating the peak frequency $F'_{peak}$ and the peak voltage $V'_{peak}$. In the example of FIG. 14, the table information is stored in which the temperature $T_{Low}$, the peak frequency $F_{peak\_Low}$, and the peak voltage $V_{peak\_Low}$ at a low temperature such as −40° C. are associated with each other, the peak frequency $F_{peak\_Nor}$, the peak voltage $V_{peak\_Nor}$, and the temperature $T_{Nor}$ at a room temperature such as 25° C. are associated with each other, and the peak frequency $F_{peak\_High}$, the peak voltage $V_{peak\_High}$, and the temperature $T_{High}$ at a high temperature such as 80° C. are associated with each other. Since the temperature t is a temperature between the temperature $T_{High}$ and the temperature $T_{Nor}$, the determination circuit 61 uses, for example, the peak frequency $F_{peak\_High}$ and the peak frequency $F_{peak\_Nor}$ to calculate the peak frequency $F'_{peak}$ via linear interpolation. Similarly, the determination circuit 61 uses, for example, the peak voltage $V_{peak\_High}$ and the peak voltage $V_{peak\_Nor}$ to calculate the peak voltage $V'_{peak}$ via linear interpolation. When the temperature t is a temperature between the temperature $T_{Nor}$ and the temperature $T_{Low}$ the determination circuit 61 uses, for example, the peak frequency $F_{peak\_Nor}$ and the peak frequency $F_{peak\_Low}$ to calculate the peak frequency $F'_{peak}$ via linear interpolation, and uses the peak voltage $V_{peak\_Nor}$ and the peak voltage $V_{peak\_Low}$ to calculate the peak voltage $V'_{peak}$ via linear interpolation.

Then, in step S14, the determination circuit 61 determines whether or not the peak voltage $v_{peak}$ acquired in step S12 is higher than the voltage $V_{err}$. When the peak voltage $v_{peak}$ is higher than the voltage $V_{err}$, in step S15, the determination circuit 61 determines that a failure occurs, and ends the processing in the inspection mode.

On the other hand, when the peak voltage $v_{peak}$ is equal to or lower than the voltage $V_{err}$, in step S16, the determination circuit 61 determines whether or not the peak frequency $f_{peak}$ acquired in step S12 is included in the reference frequency range which is a range higher than $F'_{peak}-\alpha$ and lower than $F'_{peak}+\alpha$. When the peak frequency $f_{peak}$ is not included in the reference frequency range, in step S18, the determination circuit 61 determines that there is a possibility of the failure, and ends the processing in the inspection mode.

On the other hand, when the peak frequency $f_{peak}$ is included in the reference frequency range, in step S17, the determination circuit 61 determines whether or not the peak voltage $v_{peak}$ acquired in step S12 is included in the reference voltage range which is a range higher than $V'_{peak}-\beta$ and lower than $V'_{peak}+\beta$. When the peak voltage $v_{peak}$ is not included in the reference voltage range, in step S18, the determination circuit 61 determines that there is a possibility of the failure, and ends the processing in the inspection mode. When the peak voltage $v_{peak}$ is included in the reference voltage range, in step S19, the determination circuit 61 determines that the sound reproduction device 3 is normal, and ends the processing in the inspection mode.

The terminal P1 of the sound reproduction device 3 is an example of a "first terminal", and the terminal P2 of the sound reproduction device 3 is an example of a "second terminal". The output terminal 91 of the semiconductor device 1 is an example of a "first output terminal", and the output terminal 92 of the semiconductor device 1 is an example of a "second output terminal". The modulated signal DOP is an example of a "first modulated signal", and the modulated signal DON is an example of a "second modulated signal". The modulated signal TP is an example of a "third modulated signal", and the modulated signal TN is an example of a "fourth modulated signal". The amplified signal DOXP obtained by amplifying the modulated signal DOP is an example of a "first amplified signal", and the amplified signal DOXN obtained by amplifying the modulated signal DON is an example of a "second amplified signal". The amplified signal DOXP obtained by amplifying the modulated signal TP is an example of a "third amplified signal", and the amplified signal DOXN obtained by amplifying the modulated signal TN is an example of a "fourth amplified signal". The normal operation mode is an example of a "first operation mode", and the inspection mode is an example of a "second operation mode".

The semiconductor device 1 according to the first embodiment is configured to cause one sound reproduction device 3 to output the sound, but may be configured to cause a plurality of sound reproduction devices to output the sound.

1-1-5. Actions and Effects

As described above, with the semiconductor device 1 according to the first embodiment, in the normal operation mode, the amplification circuit 50 outputs the amplified signals DOXP and DOXN obtained by amplifying the modulated signals DOP and DON based on the sound source signal DI to the output terminals 91 and 92, respectively, so that the sound reproduction device 3 can reproduce the sound. On the other hand, in the inspection mode, the amplification circuit 50 outputs the amplified signals DOXP and DOXN obtained by amplifying the modulated signals TP and TN based on the test signal to the output terminals 91 and 92, respectively, so that the peak frequency detection circuit 70 can measure the potential difference between the output terminal 91 and the output terminal 92, to detect the peak frequency $f_{peak}$ at which the impedance of the sound reproduction device 3 reaches the peak. The determination circuit 61 can determine whether or not the peak frequency $f_{peak}$ is included in the reference frequency range, and determine that there is a possibility that the sound reproduction device 3 fails when the peak frequency $f_{peak}$ is not included in the reference frequency range. Since the reference frequency range is determined based on the frequency band of the test signal and the temperature information of the sound reproduction device 3, the reference frequency range appropriately changes depending on the temperature of the sound reproduction device 3. Specifically, the determination circuit 61 can calculate an appropriate reference frequency range corresponding to the temperature of the sound reproduction device 3 based on the temperature signal output from the temperature sensor 80 and the table information stored in the memory 62. Therefore, with the semiconductor device 1 according to the first embodiment, the accuracy of the failure determination of the sound reproduction device 3 can be maintained even when the temperature changes.

In the semiconductor device 1 according to the first embodiment, the amplification circuit 50 is shared for the generation of the amplified signals DOXP and DOXN for causing the sound reproduction device 3 to reproduce the sound in the normal operation mode and the generation of the amplified signals DOXP and DOXN necessary for detecting the peak frequency $f_{peak}$ in the inspection mode. Therefore, with the semiconductor device 1 according to the first embodiment, a signal necessary for detecting the failure of the sound reproduction device 3 can be generated by a small-scale circuit.

In the semiconductor device 1 according to the first embodiment, the determination circuit 61 can further determine whether or not the peak voltage $v_{peak}$ is included in the reference voltage range, and determine that there is the possibility that the sound reproduction device 3 fails, for example, when the peak voltage $v_{peak}$ is not included in the reference voltage range. Since the reference voltage range is determined based on the frequency band of the test signal and the temperature information of the sound reproduction device 3, the reference voltage range appropriately changes depending on the temperature of the sound reproduction device 3. Therefore, even when the peak frequency $f_{peak}$ is included in the reference frequency range, the determination circuit 61 can determine that there is the possibility that the sound reproduction device 3 fails as long as the peak voltage $v_{peak}$ is not included in the reference voltage range. Therefore, with the semiconductor device 1 according to the first embodiment, a risk that it is erroneously determined that the sound reproduction device 3 is normal when there is the possibility that the sound reproduction device 3 fails is reduced.

In addition, with the semiconductor device 1 according to the first embodiment, the potential difference between the output terminal 91 and the output terminal 92 also reaches the peak when the impedance $R_{sp}$ of the sound reproduction device 3 reaches the peak, and thus the peak frequency detection circuit 70 can detect the peak frequency $f_{peak}$ by measuring the time when the potential difference between the output terminal 91 and the output terminal 92 reaches the maximum.

In addition, with the semiconductor device 1 according to the first embodiment, in the peak frequency detection circuit 70, the differential low-pass filter 71 can reduce the high-frequency noise component superimposed on the amplified signals DOXP and DOXN by modulating the test signal, the A/D conversion circuit 72 can convert the output voltage of the differential low-pass filter 71 into the data DT, and the peak time measurement circuit 73 can easily perform high-accuracy measurement.

In addition, with the semiconductor device 1 according to the first embodiment, since the impedance $R_{sp}$ of the sound reproduction device 3 does not depend on the magnitude of the voltages of the amplified signals DOXP and DOXN, in the inspection mode, the peak frequency $f_{peak}$ and the peak voltage $v_{peak}$ can be detected while the sound reproduction device 3 reproduces a very small sound that is difficult to be heard by a human ear. Therefore, with the semiconductor device 1 according to the first embodiment, it can be made less noticeable to the user that the semiconductor device 1 is operating in the inspection mode.

1-2. Second Embodiment

Hereinafter, in the semiconductor device 1 according to a second embodiment, the same reference numerals are given to the same configurations as the configurations in the first embodiment, the same description as in the first embodiment will be omitted or simplified, and mainly, the description will be made of the contents different from the contents in the first embodiment.

Since the configuration of the semiconductor device 1 according to the second embodiment is the same as the configuration in FIG. 1, the illustration thereof will be omitted. In the semiconductor device 1 according to the second embodiment, the processing of the determination circuit 61 is different from the processing in the first embodiment.

In the second embodiment, the non-volatile memory of the memory 62 stores information on a relational expression between the temperature T and the peak frequency $F_{peak}$ of the sound reproduction device 3. The non-volatile memory of the memory 62 also stores information on a relational expression between the temperature T and the peak voltage $V_{peak}$ of the sound reproduction device 3.

Figure 15:
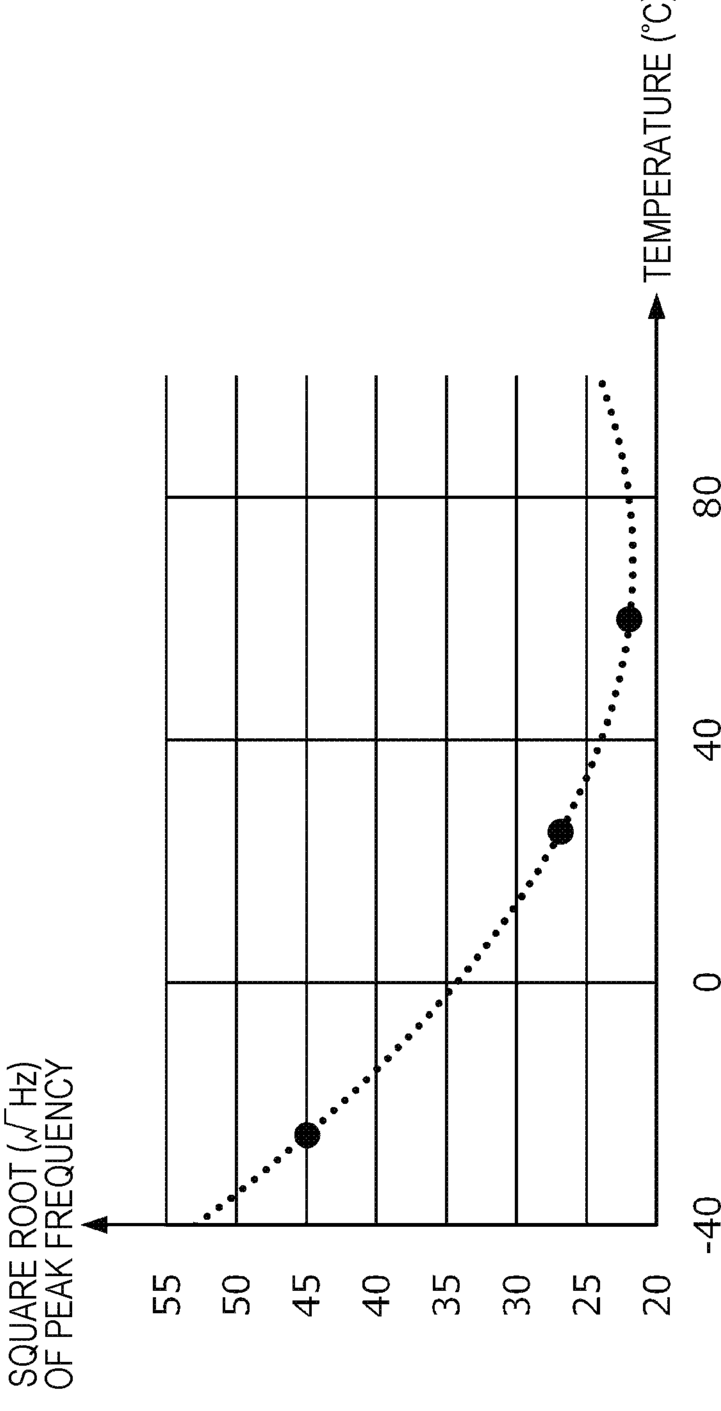
FIG. 15 is a graph illustrating a relationship between a temperature and the peak frequency.

The relational expression between the temperature T and the peak frequency $F_{peak}$ may be an n-th order polynomial in which the temperature T is a variable, as indicated in the expression (2). n is a predetermined integer of 2 or more. For example, when the relationship between the temperature T and the peak frequency $F_{peak}$ is represented by three points illustrated in FIG. 15, a square root of the peak frequency $F_{peak}$ is approximated by a quadratic equation of the temperature T, as indicated by a broken line in FIG. 15. Therefore, the relational expression between the temperature T and the peak frequency $F_{peak}$ is a fourth-order polynomial in which the temperature T is a variable.

$$F_{peak} = a_n T^n + a_{n-1} T^{n-1} + \ldots + a_1 T + a_0 \quad (2)$$

As indicated in the expression (3), the relational expression between the temperature T and the peak voltage $V_{peak}$ may be an m-th order polynomial in which the temperature T is a variable. m is a predetermined integer of 2 or more. For example, when the relationship between the temperature T and the peak impedance $R_{peak}$ is represented by three points illustrated in FIG. 16, the peak impedance $R_{peak}$ is approximated by a first-order equation of the temperature T, as indicated by a broken line in FIG. 16. Since the peak voltage $V_{peak}$ is proportional to the peak impedance $R_{peak}$, the relational expression between the temperature T and the peak voltage $V_{peak}$ is a first-order polynomial in which the temperature T is a variable.

$$V_{peak} = b_n T^n + b_{n-1} T^{n-1} + \ldots + b_1 T + b_0 \quad (3)$$

The determination circuit 61 determines whether or not the peak frequency $f_{peak}$ detected by the peak frequency detection circuit 70 is included in the reference frequency range, as in the first embodiment. As in the first embodiment, the reference frequency range is a range of a frequency determined based on the frequency band of the test signal and the temperature information which is the information on the temperature of the sound reproduction device 3.

In the second embodiment, the determination circuit 61 acquires the temperature signal output from the temperature sensor 80 as the temperature information, and calculates the reference frequency range based on the acquired temperature signal and information on the relational expression (2) between the temperature T and the peak frequency $F_{peak}$ stored in the memory 62. The determination circuit 61 calculates the reference voltage range based on the temperature signal output from the temperature sensor 80 and information on the relational expression (3) between the temperature T and the peak voltage $V_{peak}$ stored in the memory 62.

Figure 17:
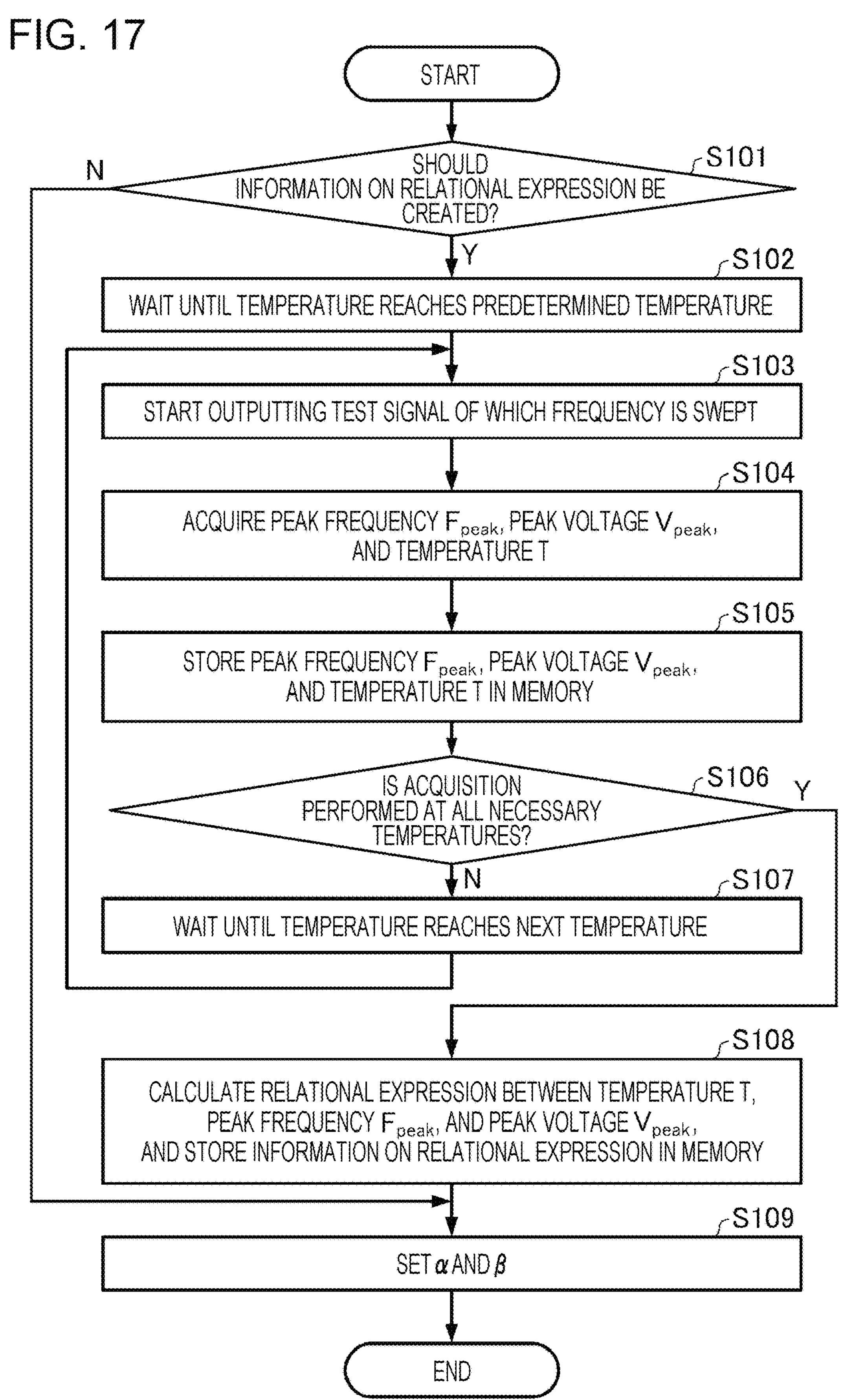
FIG. 17 is a flowchart illustrating an example of a processing procedure of an inspection circuit in a calibration mode in a second embodiment.

FIG. 17 is a flowchart illustrating an example of a processing procedure of the inspection circuit 110 in the calibration mode in the second embodiment.

First, in step S101, the determination circuit 61 determines whether or not the relational expressions (2) and (3) should be created. For example, the determination circuit 61 may determine whether or not the information on the relational expressions (2) and (3) is stored in the memory 62, and determine that the relational expressions (2) and (3) should be created when the information on the relational expressions (2) and (3) is not stored. For example, the determination circuit 61 may determine that the relational expressions (2) and (3) should be created when the communication interface circuit 10 receives a command to instruct the creation of the relational expressions (2) and (3) from the micro control unit 2.

When the determination circuit 61 determines in step S101 that the relational expressions (2) and (3) should be created, the determination circuit 61 waits until the temperature reaches a predetermined temperature in step S102.

Then, in step S103, the test signal generation circuit 60 starts outputting the test signal of which the frequency is swept, and in step S104, the determination circuit 61 acquires the peak frequency $F_{peak}$, the peak voltage $V_{peak}$, and the temperature T.

Then, in step S105, the determination circuit 61 stores the peak frequency $F_{peak}$, the peak voltage $V_{peak}$, and the temperature T acquired in step S104 in the volatile memory of the memory 62.

Then, in step S106, when the determination circuit 61 does not acquire the peak frequency $F_{peak}$, the peak voltage $V_{peak}$, and the temperature T at all necessary temperatures, the determination circuit 61 waits until the temperature reaches a next temperature, in step S107.

The determination circuit 61 repeats the processing of steps S103 to S107 until the peak frequency $F_{peak}$, the peak voltage $V_{peak}$, and the temperature T are acquired at all necessary temperatures. As a result, the determination circuit 61 acquires, for example, the peak frequency $F_{peak\_Low}$, the peak voltage $V_{peak\_Low}$, and the temperature $T_{Low}$ at a low temperature such as −40° C., the peak frequency $F_{peak\_Nor}$, the peak voltage $V_{peak\_Nor}$, and the temperature $T_{Nor}$ at a room temperature such as 25° C., the peak frequency $F_{pea}$k High, the peak voltage $V_{peak\_High}$, and the temperature $T_{High}$ at a high temperature such as 80° C., and stores the acquired values in the volatile memory of the memory 62.

Then, in step S108, the determination circuit 61 calculates the relational expressions (2) and (3) between the temperature T, the peak frequency $F_{peak}$, and the peak voltage $V_{peak}$ by using the plurality of peak frequencies $F_{peak}$, peak voltages $V_{peak}$, and temperatures T stored in the volatile memory of the memory 62 in step S105, and stores information on the relational expressions (2) and (3) in the non-volatile memory of the memory 62. The information on the relational expression (2) may be, for example, values of coefficients $a_n$ to $a_0$. Similarly, the information on the relational expression (3) may be, for example, values of coefficients $b_n$ to $b_0$.

When the determination circuit 61 determines not to create the table information in step S101, the determination circuit 61 does not perform the processing of steps S102 to S108.

Then, in step S109, the determination circuit 61 sets α and β, and ends the processing in the calibration mode. α is a constant for determining the reference frequency range in consideration of the characteristic variation in the sound reproduction device 3, and β is a constant for determining the reference voltage range in consideration of the characteristic variation in the sound reproduction device 3. For example, the constants α and β are stored in the non-volatile memory of the memory 62, and the determination circuit 61 reads the constants α and β from the non-volatile memory to set the constants α and β in a predetermined internal register.

FIG. 18 is a flowchart illustrating an example of a processing procedure of the inspection circuit 110 in the inspection mode in the second embodiment.

First, in step S111, the test signal generation circuit 60 starts outputting the test signal of which the frequency is swept, and in step S112, the determination circuit 61 acquires the peak frequency $f_{peak}$, the peak voltage $v_{peak}$, and the temperature t.

Then, in step S113, the determination circuit 61 calculates a peak frequency $F'_{peak}$ and a peak voltage $V'_{peak}$ corresponding to the temperature t acquired in step S112 from the relational expressions (2) and (3) stored in the non-volatile memory of the memory 62. That is, the determination circuit 61 substitutes the temperature t for the temperature T, which is the variable of the relational expression (2), to calculate the peak frequency $F_{peak}$, and sets the calculated peak frequency $F_{peak}$ as the peak frequency $F'_{peak}$. Similarly, the determination circuit 61 substitutes the temperature t for the temperature T, which is the variable in the relational expression (3), to calculate the peak voltage $V_{peak}$, and sets the calculated peak voltage $V_{peak}$ as the peak voltage $V'_{peak}$.

Then, in step S114, the determination circuit 61 determines whether or not the peak voltage $v_{peak}$ acquired in step S112 is higher than the voltage $V_{err}$. When the peak voltage $v_{peak}$ is higher than the voltage $V_{err}$, in step S115, the determination circuit 61 determines that a failure occurs, and ends the processing in the inspection mode.

On the other hand, when the peak voltage $v_{peak}$ is equal to or lower than the voltage $V_{err}$, in step S116, the determination circuit 61 determines whether or not the peak frequency $f_{peak}$ acquired in step S112 is included in the reference frequency range which is a range higher than $F'_{peak}-\alpha$ and lower than $F'_{peak}+\alpha$. When the peak frequency $f_{peak}$ is not included in the reference frequency range, in step S118, the determination circuit 61 determines that there is a possibility of the failure, and ends the processing in the inspection mode.

On the other hand, when the peak frequency $f_{peak}$ is included in the reference frequency range, in step S117, the determination circuit 61 determines whether or not the peak voltage $v_{peak}$ acquired in step S112 is included in the reference voltage range which is a range higher than $V'_{peak}-\beta$ and lower than $V'_{peak}+\beta$. When the peak voltage $v_{peak}$ is not included in the reference voltage range, in step S118, the determination circuit 61 determines that there is a possibility of the failure, and ends the processing in the inspection mode. When the peak voltage $v_{peak}$ is included in the reference voltage range, in step S119, the determination circuit 61 determines that the sound reproduction device 3 is normal, and ends the processing in the inspection mode.

Other configurations and functions of the semiconductor device 1 according to the second embodiment are the same as the configurations and functions in the first embodiment, and thus the description thereof will be omitted.

The semiconductor device 1 according to the second embodiment is configured to cause one sound reproduction device 3 to output the sound, but may be configured to cause a plurality of sound reproduction devices to output the sound.

As described above, with the semiconductor device 1 according to the second embodiment, the determination circuit 61 can calculate an appropriate reference frequency range corresponding to the temperature of the sound reproduction device 3 based on the temperature signal output from the temperature sensor 80 and the information on the relational expression stored in the memory 62. Therefore, with the semiconductor device 1 according to the second embodiment, the accuracy of the failure determination of the sound reproduction device 3 can be maintained even when the temperature changes.

In addition, with the semiconductor device 1 according to the second embodiment, the same effects as the effects of the semiconductor device 1 according to the first embodiment can be obtained.

1-3. Third Embodiment

Hereinafter, in the semiconductor device 1 according to a third embodiment, the same reference numerals are given to the same configurations as the configurations in the first embodiment or the second embodiment, the same description as in the first embodiment or the second embodiment will be omitted or simplified, and mainly, the description will be made of the contents different from the contents in the first embodiment and the second embodiment.

Since the configuration of the semiconductor device 1 according to the third embodiment is the same as the configuration in FIG. 1, the illustration thereof will be omitted. In the semiconductor device 1 according to the third embodiment, the processing of the determination circuit 61 is different from the processing in the first embodiment and the second embodiment.

In the third embodiment, the non-volatile memory of the memory 62 stores information on a reference frequency block including a peak frequency corresponding to a reference temperature among a plurality of frequency blocks obtained by dividing a range of a predetermined frequency. The reference temperature is, for example, a room temperature such as 25° C.

Figure 19:
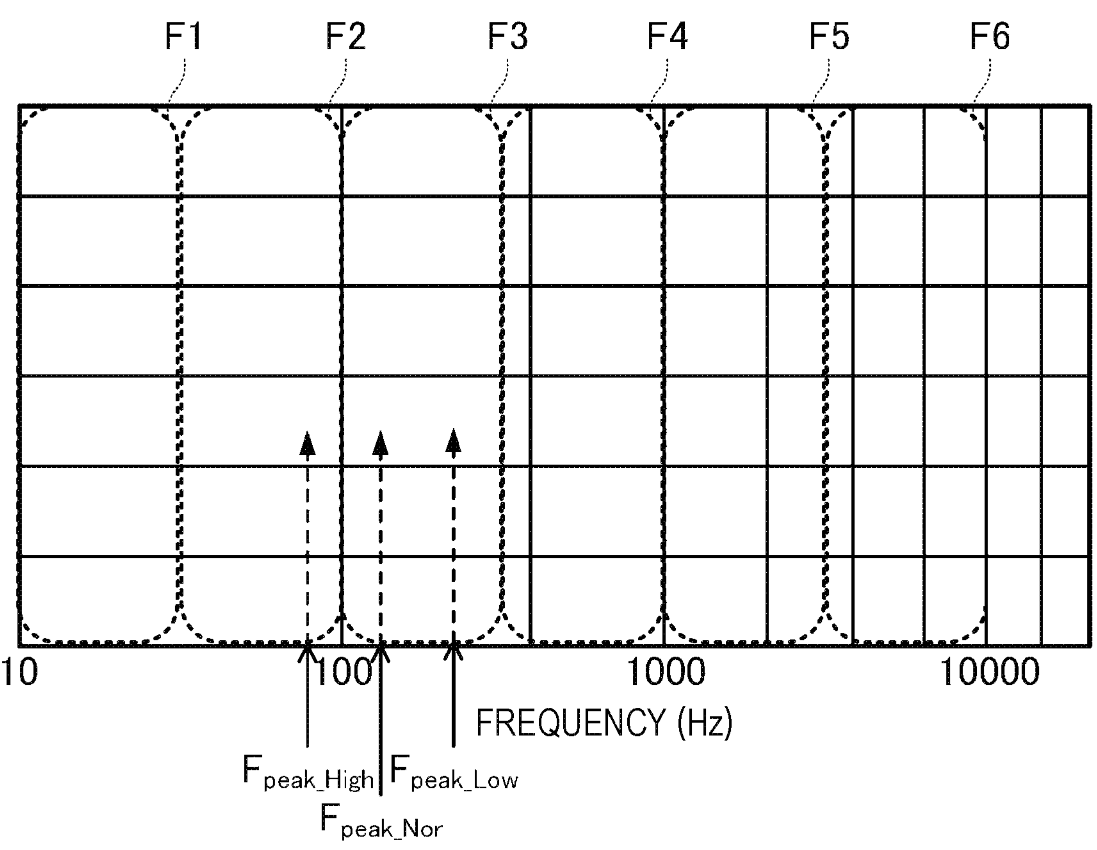
FIG. 19 is a diagram illustrating examples of a plurality of frequency blocks and a reference frequency block in a third embodiment.

FIG. 19 is a diagram illustrating an example of the plurality of frequency blocks and the reference frequency block. In the example of FIG. 19, the range of the predetermined frequency is a range of 10 Hz to 10000 Hz, and this range of the frequency is divided into six frequency blocks F1 to F6. The frequency block F1 is a range of 10 Hz to 30 Hz. The frequency block F2 is a range of 31 Hz to 100 Hz. The frequency block F3 is a range of 101 Hz to 300 Hz. The frequency block F4 is a range of 301 Hz to 1000 Hz. The frequency block F5 is a range of 1001 Hz to 3000 Hz. The frequency block F6 is a range of 3001 Hz to 10000 Hz. When the temperature range in which the operation of the sound reproduction device 3 is guaranteed is set to −40° C. to 80° C., the reference temperature is a room temperature such as 25° C., and the frequency block F3 including the peak frequency $F_{peak\_Nor}$ at a room temperature is the reference frequency block. In the example of FIG. 19, since the peak frequency $F_{peak\_Nor}$ is close to a lower limit frequency of the frequency block F3, the peak frequency $F_{peak\_High}$ at a high temperature such as 80° C. is included in the frequency block F2 before the frequency block F3, and the peak frequency $F_{peak\_Low}$ at a low temperature such as −40° C. is included in the frequency block F3. On the contrary, when the peak frequency $F_{peak\_Nor}$ is close to an upper limit frequency of the frequency block F3, the peak frequency $F_{peak\_High}$ at a high temperature such as 80° C. is included in the frequency block F3, and the peak frequency $F_{peak\_Low}$ at a low temperature such as −40° C. is included in the frequency block F4 after the frequency block F3. That is, when the state of the sound reproduction device 3 is normal, the peak frequency $f_{peak}$ detected in the inspection mode is included in the frequency range including the reference frequency block and the frequency blocks before and after the reference frequency block regardless of the temperature t.

The determination circuit 61 determines whether or not the peak frequency $f_{peak}$ detected by the peak frequency detection circuit 70 is included in the reference frequency range, as in the first embodiment. As in the first embodiment, the reference frequency range is a range of a frequency determined based on the frequency band of the test signal and the temperature information which is the information on the temperature of the sound reproduction device 3. It should be noted that, in the third embodiment, the temperature information is information on the temperature range in which the operation of the sound reproduction device 3 is guaranteed, and the reference frequency range is the frequency range including the reference frequency block and the frequency blocks before and after the reference frequency block. This reference frequency range includes a range of the peak frequency $f_{peak}$ corresponding to the temperature range in which the operation of the sound reproduction device 3 is guaranteed.

Figure 20:
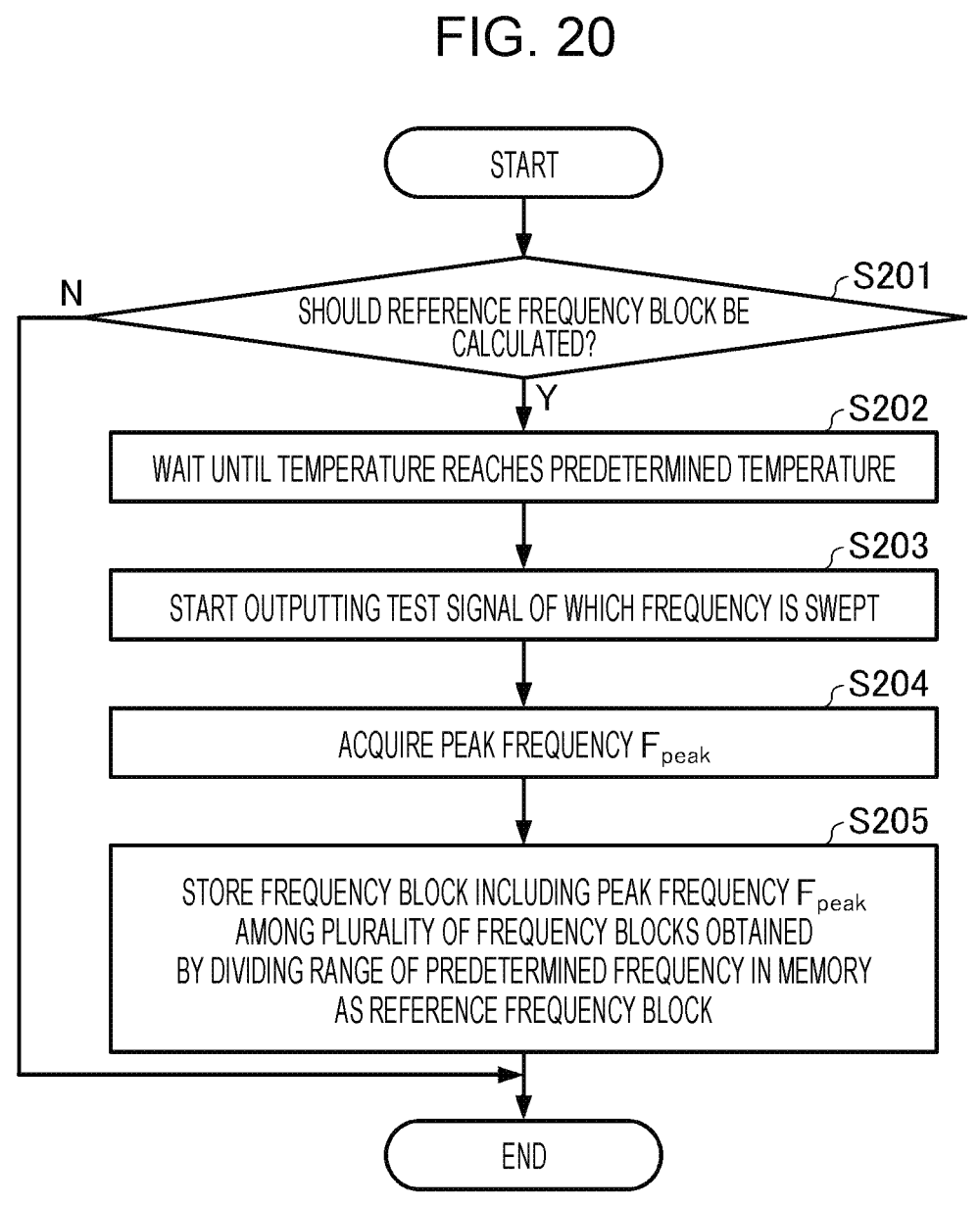

FIG. 20 is a flowchart illustrating an example of a processing procedure of the inspection circuit 110 in the calibration mode in the third embodiment.

First, in step S201, the determination circuit 61 determines whether or not the reference frequency block should be calculated. For example, the determination circuit 61 may determine whether or not the information on the reference frequency block is stored in the memory 62, and determine that the reference frequency block should be calculated when the information on the reference frequency block is not stored. For example, the determination circuit 61 may determine that the reference frequency block should be calculated when the communication interface circuit 10 receives a command to instruct the calculation of the reference frequency block from the micro control unit 2.

When it is determined that the reference frequency block should be calculated in step S201, the determination circuit 61 waits until the temperature reaches a predetermined temperature in step S202.

Then, in step S203, the test signal generation circuit 60 starts outputting the test signal of which the frequency is swept, and in step S204, the determination circuit 61 acquires the peak frequency $F_{peak}$.

Then, in step S205, the determination circuit 61 sets the frequency block including the peak frequency $F_{peak}$ acquired in step S204 among the plurality of frequency blocks obtained by dividing the range of the predetermined frequency, as the reference frequency block, stores the information on the reference frequency block in the non-volatile memory of the memory 62, and ends the processing in the calibration mode.

FIG. 21 is a flowchart illustrating an example of a processing procedure of the inspection circuit 110 in the inspection mode in the third embodiment.

First, in step S211, the test signal generation circuit 60 starts outputting the test signal of which the frequency is swept, and in step S212, the determination circuit 61 acquires the peak frequency $f_{peak}$ and the peak voltage $v_{peak}$.

Then, in step S213, the determination circuit 61 determines whether or not the peak voltage $v_{peak}$ acquired in step S212 is higher than the voltage $V_{err}$. When the peak voltage $v_{peak}$ is higher than the voltage $V_{err}$, in step S214, the determination circuit 61 determines that a failure occurs, and ends the processing in the inspection mode.

On the other hand, when the peak voltage $v_{peak}$ is equal to or lower than the voltage $V_{err}$, in step S215, the determination circuit 61 determines whether or not the peak frequency $f_{peak}$ acquired in step S212 is included in the reference frequency range including the reference frequency block or the frequency blocks before and after the reference frequency block. When the peak frequency $f_{peak}$ is not included in the reference frequency range, in step S216, the determination circuit 61 determines that there is a possibility of the failure, and ends the processing in the inspection mode.

On the other hand, when the peak frequency $f_{peak}$ is included in the reference frequency range, in step S217, the determination circuit 61 determines that the sound reproduction device 3 is normal, and ends the processing in the inspection mode.

Other configurations and functions of the semiconductor device 1 according to the third embodiment are the same as the configurations and functions in the first embodiment, and thus the description thereof will be omitted.

The semiconductor device 1 according to the third embodiment is configured to cause one sound reproduction device 3 to output the sound, but may be configured to cause a plurality of sound reproduction devices to output the sound.

As described above, in the semiconductor device 1 according to the third embodiment, the reference frequency range is the frequency range including the reference frequency block including the peak frequency corresponding to the reference temperature and the frequency blocks before and after the reference frequency block, the frequency range including the range of the peak frequency corresponding to the temperature range in which the operation of the sound reproduction device 3 is guaranteed, and thus even when the peak frequency changes due to the change in the temperature of the sound reproduction device 3, the detected peak frequency $f_{peak}$ is included in the reference frequency range. Therefore, with the semiconductor device 1 according to the third embodiment, a risk that it is erroneously determined that the sound reproduction device 3 fails when the sound reproduction device 3 is normal is reduced.

In addition, with the semiconductor device 1 according to the third embodiment, the same effects as the effects of the semiconductor device 1 according to the first embodiment can be obtained.

1-4. Fourth Embodiment

Hereinafter, in the semiconductor device 1 according to a fourth embodiment, the same reference numerals are given to the same configurations as the configurations of any one of the first to third embodiments, the same description as in any one of the first to third embodiments will be omitted or simplified, and mainly, the description will be made of the contents different from the contents in all of the first to third embodiments.

In the fourth embodiment, the non-volatile memory of the memory 62 stores information on the reference frequency block including the range of the peak frequency corresponding to the temperature range in which the operation of the sound reproduction device 3 is guaranteed, among the plurality of frequency blocks obtained by dividing the range of the predetermined frequency.

Figure 22:
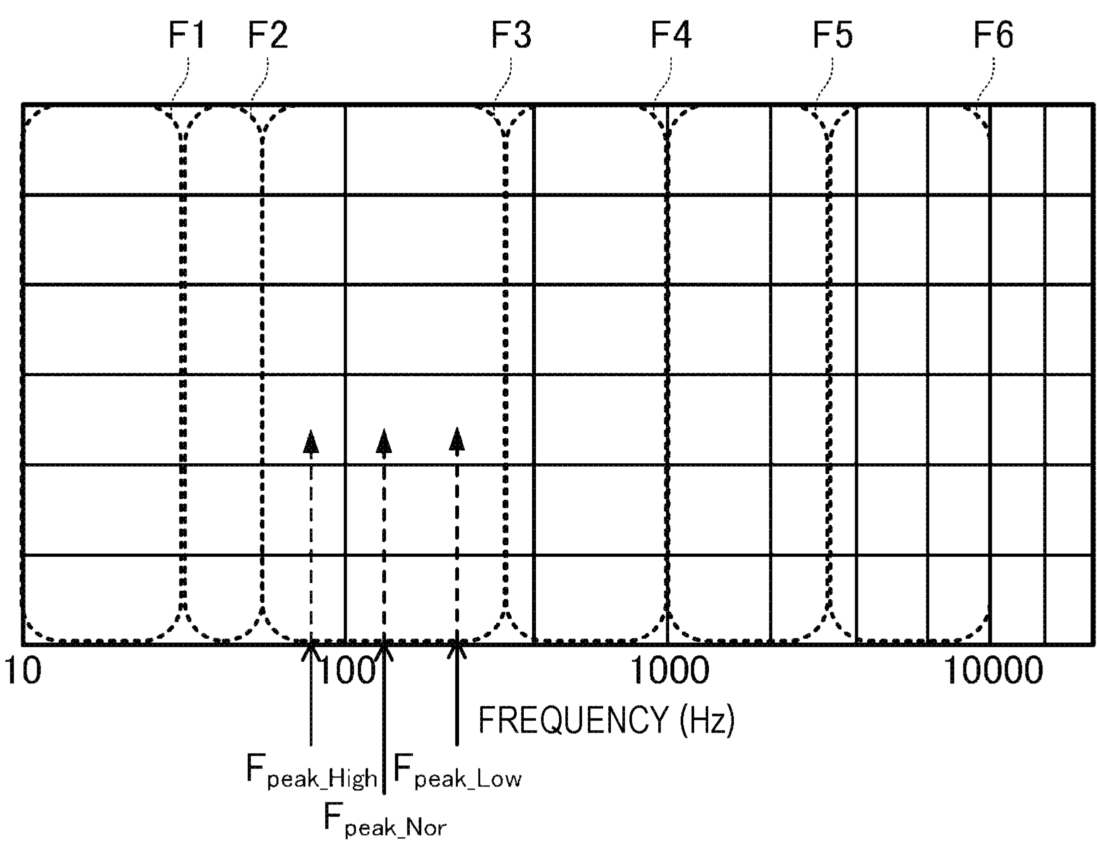
FIG. 22 is a diagram illustrating examples of a plurality of frequency blocks and a reference frequency block in a fourth embodiment.

FIG. 22 is a diagram illustrating an example of the plurality of frequency blocks and the reference frequency block. In the example of FIG. 22, the range of the predetermined frequency is a range of 10 Hz to 10000 Hz, and this range of the frequency is divided into six frequency blocks F1 to F6. The frequency block F1 is a range of 10 Hz to 30 Hz. The frequency block F2 is a range of 31 Hz to 50 Hz. The frequency block F3 is a range of 51 Hz to 300 Hz. The frequency block F4 is a range of 301 Hz to 1000 Hz. The frequency block F5 is a range of 1001 Hz to 3000 Hz. The frequency block F6 is a range of 3001 Hz to 10000 Hz. When the temperature range in which the operation of the sound reproduction device 3 is guaranteed is −40° C. to 80° C., the peak frequency $F_{peak\_High}$ at 80° C. which is the highest temperature, the peak frequency $F_{peak\_Nor}$ at 25° C. which is a room temperature, and the peak frequency $F_{peak\_Low}$ at −40° C. which is the lowest temperature are all included in one frequency block F3. The frequency block F3 is the reference frequency block. That is, when the state of the sound reproduction device 3 is normal, the peak frequency $f_{peak}$ detected in the inspection mode is included in the reference frequency block regardless of the temperature t.

The determination circuit 61 determines whether or not the peak frequency $f_{peak}$ detected by the peak frequency detection circuit 70 is included in the reference frequency range, as in the first embodiment. As in the first embodiment, the reference frequency range is a range of a frequency determined based on the frequency band of the test signal and the temperature information which is the information on the temperature of the sound reproduction device 3. It should be noted that, in the fourth embodiment, the temperature information is information on the temperature range in which the operation of the sound reproduction device 3 is guaranteed, and the reference frequency range is the frequency range of the reference frequency block. This reference frequency range includes a range of the peak frequency $f_{peak}$ corresponding to the temperature range in which the operation of the sound reproduction device 3 is guaranteed.

Figure 23:
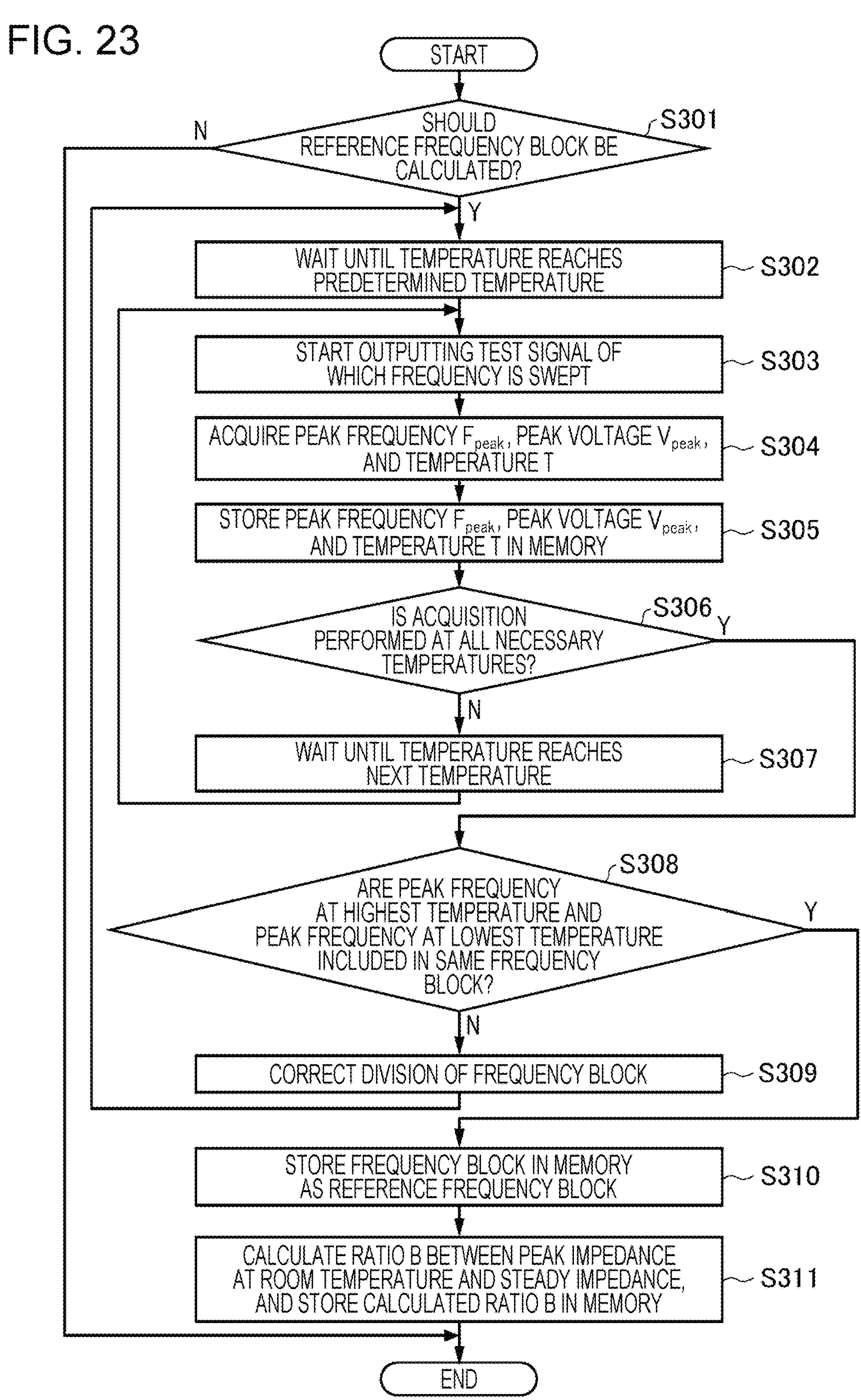
FIG. 23 is a flowchart illustrating an example of a processing procedure of an inspection circuit in a calibration mode in the fourth embodiment.

FIG. 23 is a flowchart illustrating an example of a processing procedure of the inspection circuit 110 in the calibration mode in the fourth embodiment.

First, in the step S301, the determination circuit 61 determines whether or not the reference frequency block should be calculated. For example, the determination circuit 61 may determine whether or not the information on the reference frequency block is stored in the memory 62, and determine that the reference frequency block should be calculated when the information on the reference frequency block is not stored. For example, the determination circuit 61 may determine that the reference frequency block should be calculated when the communication interface circuit 10 receives a command to instruct the calculation of the reference frequency block from the micro control unit 2.

When it is determined that the reference frequency block should be calculated in step S301, the determination circuit 61 waits until the temperature reaches a predetermined temperature in step S302.

Then, in step S303, the test signal generation circuit 60 starts outputting the test signal of which the frequency is swept, and in step S304, the determination circuit 61 acquires the peak frequency $F_{peak}$, the peak voltage $V_{peak}$, and the temperature T.

Then, in step S305, the determination circuit 61 stores the peak frequency $F_{peak}$, the peak voltage $V_{peak}$, and the temperature T acquired in step S304 in the volatile memory of the memory 62.

Then, in step S306, when the determination circuit 61 does not acquire the peak frequency $F_{peak}$, the peak voltage $V_{peak}$, and the temperature T at all necessary temperatures, the determination circuit 61 waits until the temperature reaches a next temperature, in step S307.

The determination circuit 61 repeats the processing of steps S303 to S307 until the peak frequency $F_{peak}$, the peak voltage $V_{peak}$, and the temperature T are acquired at all necessary temperatures. As a result, the determination circuit 61 acquires, for example, the peak frequency $F_{peak\_Low}$, the peak voltage $V_{peak\_Low}$, and the temperature $T_{Low}$ at −40° C. as the lowest temperature, the peak frequency $F_{peak\_Nor}$, the peak voltage $V_{peak\_Nor}$, and the temperature $T_{Nor}$ at 25° C. as a room temperature, the peak frequency $F_{peak\_High}$, the peak voltage $V_{peak\_High}$, and the temperature $T_{High}$ at 80° C. as the highest temperature, and stores the acquired values in the volatile memory of the memory 62.

Then, in step S308, the determination circuit 61 determines whether or not the peak frequency $F_{peak\_High}$ at the highest temperature and the peak frequency $F_{peak\_Low}$ at the lowest temperature, which are stored in the volatile memory of the memory 62 in step S305, are included in the same frequency block among the plurality of frequency blocks obtained by dividing the predetermined frequency range.

When the peak frequency $F_{peak\_High}$ and the peak frequency $F_{peak\_Low}$ are not included in the same frequency block, in step S309, the determination circuit 61 corrects the plurality of frequency blocks such that the peak frequency $F_{peak\_High}$ and the peak frequency $F_{peak\_Low}$ are included in the same frequency block. For example, as illustrated in FIG. 19, when the peak frequency $F_{peak\_High}$ is included in the frequency block F2 and the peak frequency $F_{peak\_Low}$ is included in the frequency block F3, a frequency of a boundary between the frequency block F2 and the frequency block F3 is lowered, and the peak frequency $F_{peak\_High}$ and the peak frequency $F_{peak\_Low}$ are corrected to be included in the same frequency block F3 as illustrated in FIG. 22. In this case, it is preferable to perform the correction such that a difference between the lower limit frequency of the frequency block F3 and the peak frequency $F_{peak\_High}$ is sufficiently large and a difference between the upper limit frequency of the frequency block F3 and the peak frequency $F_{peak\_Low}$ is sufficiently large.

The determination circuit 61 repeats the processing of steps S302 to S309 until the peak frequency $F_{peak\_High}$ and the peak frequency $F_{peak\_Low}$ are included in the same frequency block.

When the peak frequency $F_{peak\_High}$ and the peak frequency $F_{peak\_Low}$ are included in the same frequency block, in step S310, the determination circuit 61 sets the frequency block as the reference frequency block, and stores the information on the reference frequency block in the non-volatile memory of the memory 62.

Finally, in step S311, the determination circuit 61 calculates a ratio B between the peak impedance at a room temperature and a steady impedance, stores the calculated ratio B in the memory 62, and ends the processing in the calibration mode. The minimum value of the steady impedance is the impedance $R_{sp}$ of the sound reproduction device 3. For example, the determination circuit 61 calculates a ratio between the peak voltage $V_{peak\_Nor}$ at a room temperature and the minimum value of the output voltage V' of the differential low-pass filter 71, as the ratio B between the peak impedance at a room temperature and the steady impedance.

Figure 24:
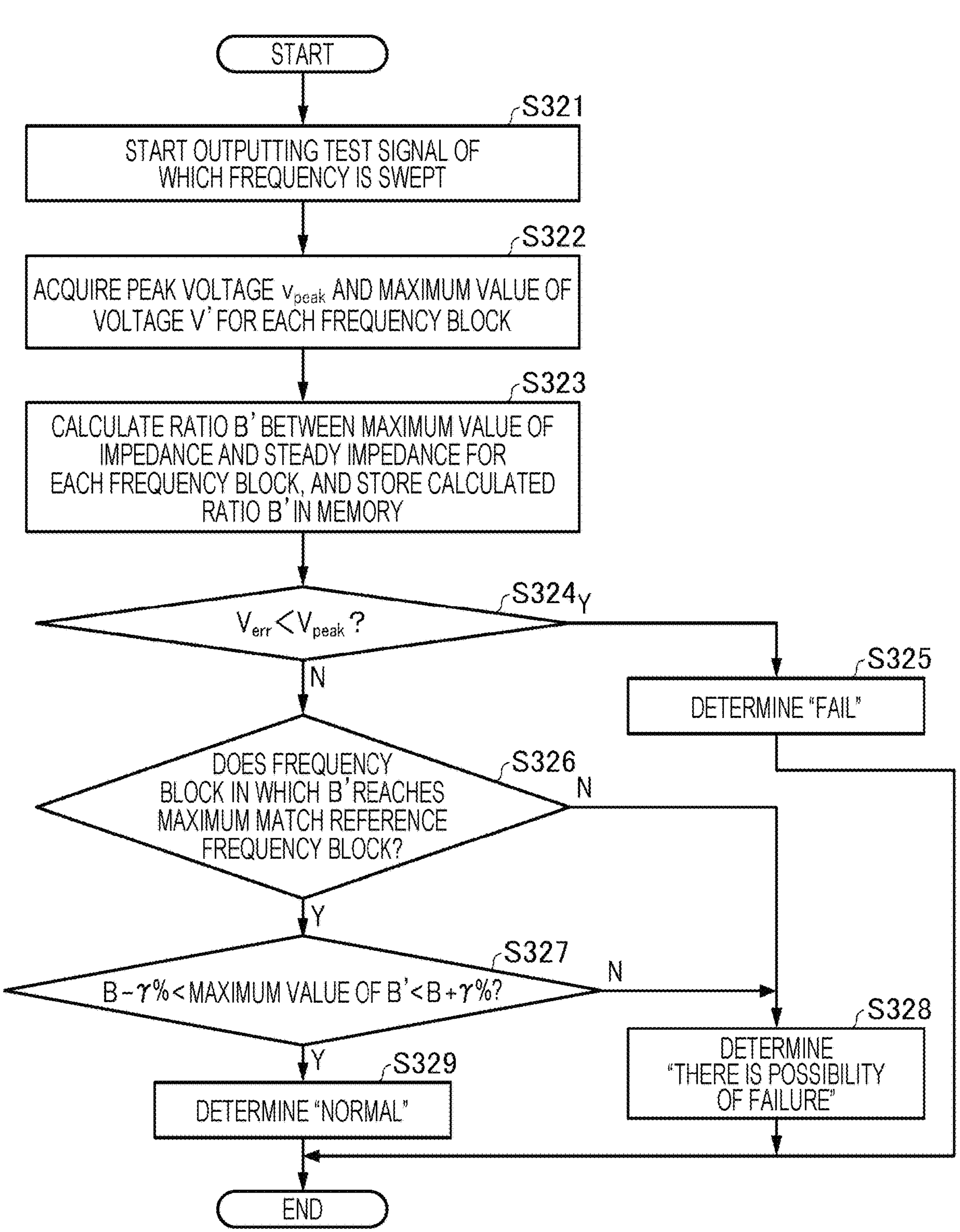
FIG. 24 is a flowchart illustrating an example of a processing procedure of an inspection circuit in an inspection mode in the fourth embodiment.

FIG. 24 is a flowchart illustrating an example of a processing procedure of the inspection circuit 110 in the inspection mode in the fourth embodiment.

First, in step S321, the test signal generation circuit 60 starts outputting the test signal of which the frequency is swept, and in step S322, the determination circuit 61 acquires the peak voltage $v_{peak}$ and the maximum value of the voltage V' for each frequency block.

Then, in step S323, the determination circuit 61 calculates a ratio B' between the maximum value of the impedance and the steady impedance for each frequency block, and stores the calculated ratio B' in the memory 62. For example, the determination circuit 61 calculates a ratio between the maximum value of the voltage V' of each frequency block and the minimum value of the voltage V' in the entire frequency range, as the ratio B' between the maximum value of the impedance of each frequency block and the steady impedance.

Then, in step S324, the determination circuit 61 determines whether or not the peak voltage $v_{peak}$ acquired in step S322 is higher than the voltage $V_{err}$. When the peak voltage $v_{peak}$ is higher than the voltage $V_{err}$, in step S325, the determination circuit 61 determines that a failure occurs, and ends the processing in the inspection mode.

On the other hand, when the peak voltage $v_{peak}$ is equal to or lower than the voltage $V_{err}$, in step S326, the determination circuit 61 determines whether or not the frequency block in which the ratio B' calculated in step S323 reaches the maximum matches the reference frequency block. When the frequency block in which the ratio B' reaches the maximum does not match the reference frequency block, in step S328, the determination circuit 61 determines that there is a possibility of the failure, and ends the processing in the inspection mode.

On the other hand, when the frequency block in which the ratio B' reaches the maximum matches the reference frequency block, in step S327, the determination circuit 61 determines whether or not the maximum value of the ratio B' is included in a range that is larger than B−γ and smaller than B+γ for the ratio B stored in the memory 62. γ is a constant for determining a range in which the ratio B' can be obtained in consideration of the characteristic variation in the sound reproduction device 3. When the maximum value of the ratio B' is not included in the range, in step S328, the determination circuit 61 determines that there is a possibility of the failure, and ends the processing in the inspection mode. When the maximum value of the ratio B' is included in the range, in step S329, the determination circuit 61 determines that the sound reproduction device 3 is normal, and ends the processing in the inspection mode.

Other configurations and functions of the semiconductor device 1 according to the fourth embodiment are the same as the configurations and functions in the first embodiment, and thus the description thereof will be omitted.

The semiconductor device 1 according to the fourth embodiment is configured to cause one sound reproduction device 3 to output the sound, but may be configured to cause a plurality of sound reproduction devices to output the sound.

As described above, in the semiconductor device 1 according to the fourth embodiment, the reference frequency range is the frequency range of the reference frequency block including the range of the peak frequency corresponding to the temperature range in which the operation of the sound reproduction device 3 is guaranteed, and thus even when the peak frequency changes due to the change in the temperature of the sound reproduction device 3, the detected peak frequency $f_{peak}$ is included in the reference frequency range. Therefore, with the semiconductor device 1 according to the fourth embodiment, a risk that it is erroneously determined that the sound reproduction device 3 fails when the sound reproduction device 3 is normal is reduced.

In addition, with the semiconductor device 1 according to the fourth embodiment, the same effects as the effects of the semiconductor device 1 according to the first embodiment can be obtained.

1-5. Fifth Embodiment

Hereinafter, in the semiconductor device 1 according to a fifth embodiment, the same reference numerals are given to the same configurations as the configurations of any one of the first to fourth embodiments, the same description as in any one of the first to fourth embodiments will be omitted or simplified, and mainly, the description will be made of the contents different from the contents in all of the first to fourth embodiments.

FIG. 25 is a diagram illustrating a configuration example of the semiconductor device according to the fifth embodiment. As illustrated in FIG. 25, the semiconductor device 1 according to the fifth embodiment is coupled to a sound source reproduction circuit 100*a* and a sound reproduction device 3*a*. Specifically, an output terminal 95 of the semiconductor device 1 is coupled to an input terminal 103 of the sound source reproduction circuit 100*a*, an input terminal 93 of the semiconductor device 1, an output terminal 101 of the sound source reproduction circuit 100*a*, and a terminal P1*a* of the sound reproduction device 3*a* are coupled to each other, and an input terminal 94 of the semiconductor device 1, an output terminal 102 of the sound source reproduction circuit 100*a*, and a terminal P2*a* of the sound reproduction device 3*a* are coupled to each other.

The semiconductor device 1 according to the fifth embodiment includes the communication interface circuit 10, the memory 20, the temperature sensor 80, switches 83, 84, and 85, and the inspection circuit 110. The semiconductor device 1 may be a semiconductor integrated circuit device of one chip, may be configured as a semiconductor integrated circuit device of a plurality of chips, or may be configured such that at least a part thereof is configured with an electronic component other than the semiconductor integrated circuit device.

When the command to switch the operation mode of the semiconductor device 1 to the normal operation mode, the inspection mode, or the calibration mode is received, the communication interface circuit 10 generates a control signal for switching the coupling of the switches 83, 84, and 85 depending on the operation mode. In addition, for example, when a sound source reproduction command for causing the sound reproduction device 3*a* to reproduce sound source data 21-*i* is received, the communication interface circuit 10 reads the sound source data 21-*i* from the memory 20, inputs the sound source data 21-*i* to the input terminal 103 of the sound source reproduction circuit 100*a* via the switch 85 and the output terminal 95, as a sound source signal DIa, and instructs the sound source reproduction circuit 100*a* to perform the reproduction via the sound reproduction device 3*a*. The sound source data 21-*i* is any one of the sound source data 21-1 to 21-*n* stored in the memory 20. Further, for example, when a sound source stop command for the sound source data 21-*i* being reproduced is received, the communication interface circuit 10 instructs the sound source reproduction circuit 100*a* to stop the reproduction. Further, for example, when various setting commands related to the sound source reproduction are received, the communication interface circuit 10 performs various settings on the sound source reproduction circuit 100*a*.

The switch 85 outputs any one of a signal based on the sound source signal DIa and a test signal TST to the output terminal 95 in response to the control signal output from the communication interface circuit 10. Specifically, the switch 85 outputs the signal based on the sound source signal DIa to the output terminal 95 in the normal operation mode, and outputs the test signal TST to the output terminal 95 in the inspection mode or the calibration mode. The signal based on the sound source signal DIa may be the sound source signal DIa itself or may be a signal obtained by performing some processing on the sound source signal DIa.

The sound source reproduction circuit 100*a* converts the signal input from the input terminal 103 into amplified signals DOXPa and DOXNa, and outputs the amplified signals DOXPa and DOXNa to the output terminals 101 and 102, respectively. When the signal input from the input terminal 103 is the signal based on the sound source signal DIa, the sound source reproduction circuit 100*a* converts the signal based on the sound source signal DIa into the amplified signals DOXPa and DOXNa, which are sound signals, and outputs the amplified signals DOXPa and DOXNa to the output terminals 101 and 102, respectively. As a result, the sound corresponding to the amplified signals DOXPa and DOXNa is output from the sound reproduction device 3*a*. When the signal input from the input terminal 103 is the test signal TST, the test signal TST is converted into the amplified signals DOXPa and DOXNa, and the amplified signals DOXPa and DOXNa are output to the output terminals 101 and 102, respectively.

For example, the sound reproduction device 3*a* may be a speaker or a buzzer. The sound output from the sound reproduction device 3*a* may be, for example, an audio imitating a voice when a human speaks, or various sounds such as a mechanical warning sound or an effect sound.

As illustrated in FIG. 25, in the present embodiment, the sound source reproduction circuit 100*a* includes a modulation circuit 30*a* and an amplification circuit 50*a*. The sound source reproduction circuit 100*a* may be a semiconductor integrated circuit device of one chip, may be configured as a semiconductor integrated circuit device of a plurality of chips, or may be configured such that at least a part thereof is configured with an electronic component other than the semiconductor integrated circuit device.

The modulation circuit 30*a* modulates the signal input to the input terminal 103 to output modulated signals DOPa and DONa. Specifically, the modulation circuit 30*a* includes a digital filter 31*a*, a sigma-delta modulation circuit 32*a*, and a pulse width modulation circuit 33*a*, the sigma-delta modulation circuit 32*a* performs sigma-delta modulation on a signal DFa obtained by performing, via the digital filter 31*a*, digital filter processing on the signal input to the input terminal 103, to output a sigma-delta modulated signal DSa, and the pulse width modulation circuit 33*a* further performs the pulse width modulation to output the modulated signals DOPa and DONa. The modulation circuit 30*a* modulates the signal based on the sound source signal DIa to output the modulated signals DOPa and DOna when the signal input from the input terminal 103 is the signal based on the sound source signal DIa, and modulates the test signal TST to output the modulated signals DOPa and DOna when the signal input from the input terminal 103 is the test signal TST. The detailed processing of the digital filter 31*a*, the sigma-delta modulation circuit 32*a*, and the pulse width modulation circuit 33*a* is the same as the processing of the digital filter 31, the sigma-delta modulation circuit 32, and the pulse width modulation circuit 33 in any one of the first to fourth embodiments, and thus the description thereof will be omitted.

The amplification circuit 50*a* outputs the amplified signal DOXPa obtained by amplifying the modulated signal DOPa to the output terminal 101, and outputs the amplified signal DOXNa obtained by amplifying the modulated signal DONa to the output terminal 102. Specifically, the amplification circuit 50*a* includes two class-D amplifiers 51Pa and 51Na, the class-D amplifier 51Pa outputs the amplified signal DOXPa obtained by amplifying the modulated signal DOPa to the output terminal 101, and the class-D amplifier 51Na outputs the amplified signal DOXNa obtained by amplifying the modulated signal DONa to the output terminal 102. Since the output terminal 101 is coupled to the terminal P1*a* of the sound reproduction device 3*a* and the output terminal 102 is coupled to the terminal P2*a* of the sound reproduction device 3*a*, the sound reproduction device 3*a* reproduces a sound having a magnitude corresponding to a voltage difference between the amplified signal DOXPa and the amplified signal DOXNa.

Therefore, when the semiconductor device 1 inputs the signal based on the sound source signal DIa to the input terminal 103 of the sound source reproduction circuit 100*a*, the sound reproduction device 3*a* outputs a desired sound indicated by the sound source reproduction command. It is preferable that the sound reproduction device 3*a* outputs a very small sound that is difficult to be heard by a human ear when the semiconductor device 1 inputs the test signal TST to the input terminal 103 of the sound source reproduction circuit 100*a*.

In the inspection mode, the inspection circuit 110 of the semiconductor device 1 detects the peak frequency $f_{peak}$ for the sound reproduction device 3*a*, and determines the state of the sound reproduction device 3*a* based on the detected peak frequency $f_{peak}$. In the calibration mode, the inspection circuit 110 detects the peak frequency $F_{peak}$ for the sound reproduction device 3*a*, and creates the information necessary for determining the state of the sound reproduction device 3*a* based on the detected peak frequency $F_{peak}$.

The inspection circuit 110 includes the test signal generation circuit 60, the determination circuit 61, the memory 62, and the peak frequency detection circuit 70. The test signal generation circuit 60 and the peak frequency detection circuit 70 operate in the inspection mode and the calibration mode, and stop the operation in the normal operation mode. The determination circuit 61 operates in the inspection mode, and stops the operation in the normal operation mode and the calibration mode.

The test signal generation circuit 60 generates the test signal TST of which the frequency is changed in a frequency band set in advance. The frequency band in which the test signal generation circuit 60 changes the frequency of the test signal TST can be set to any frequency band by the micro control unit 2, and may be, for example, a frequency band of 10 Hz or higher and 3 kHz or lower.

The peak frequency detection circuit 70 measures a potential difference between the input terminal 93 and the input terminal 94, and detects the peak frequency $f_{peak}$ or the peak frequency $F_{peak}$ which is a frequency of the test signal TST at which the impedance of the sound reproduction device 3*a* reaches the peak. The peak frequency detection circuit 70 further detects the peak voltage $v_{peak}$ or the peak voltage $V_{peak}$ which is a voltage obtained by amplifying the potential difference between the input terminal 93 and the input terminal 94 when the frequency of the test signal TST is the peak frequency $f_{peak}$ or the peak frequency $F_{peak}$. As described above, the peak frequencies $f_{peak}$ and $F_{peak}$ or the peak voltages $v_{peak}$ and $V_{peak}$ change depending on the temperature of the sound reproduction device 3*a*.

The memory 62 includes a non-volatile memory (not illustrated), and the non-volatile memory stores table information in which a plurality of temperatures and a plurality of peak frequencies related to the sound reproduction device 3*a* are associated. The table information also defines a correspondence relationship between the plurality of temperatures and a plurality of peak voltages related to the sound reproduction device 3*a*. The memory 62 includes a volatile memory (not illustrated) that stores various temporarily created data.

The determination circuit 61 determines whether or not the peak frequency $f_{peak}$ detected by the peak frequency detection circuit 70 is included in a reference frequency range. The reference frequency range is a range of a frequency determined based on the frequency band of the test signal TST and temperature information which is information on the temperature of the sound reproduction device 3*a*. In the present embodiment, the determination circuit 61 acquires a temperature signal output from the temperature sensor 80 as the temperature information, and calculates the reference frequency range based on the acquired temperature signal and the table information stored in the memory 62. The determination circuit 61 further determines whether or not the peak voltage $v_{peak}$ detected by the peak frequency detection circuit 70 is included in a reference voltage range. The reference voltage range is a range of a voltage determined based on the frequency band of the test signal TST and the temperature information which is the information on the temperature of the sound reproduction device 3*a*. The determination circuit 61 calculates the reference voltage range based on the temperature signal output from the temperature sensor 80 and the table information stored in the memory 62. Further, in the present embodiment, the determination circuit 61 determines the state of the sound reproduction device 3*a*, such as the presence or absence of a failure of the sound reproduction device 3*a*, based on the determination result of whether or not the peak frequency $f_{peak}$ is included in the reference frequency range or the determination result of whether or not the peak voltage $v_{peak}$ is included in the reference voltage range.

The temperature sensor 80 detects the temperature, and outputs the temperature signal having the magnitude corresponding to the detected temperature. In FIG. 25, although the temperature sensor 80 is built in the semiconductor device 1 and directly detects the temperature of the semiconductor device 1, the temperature of the semiconductor device 1 and the temperature of the sound reproduction device 3*a* change similarly depending on the temperature of the periphery of the semiconductor device 1 and the sound reproduction device 3*a*, and thus the temperature of the sound reproduction device 3*a* is indirectly detected. It should be noted that the temperature sensor 80 may be provided inside the sound source reproduction circuit 100*a*, or may be provided outside the semiconductor device 1 in the vicinity of the sound reproduction device 3*a* in order to directly detect the temperature of the sound reproduction device 3*a*.

Since the configurations and the processing of the test signal generation circuit 60, the determination circuit 61, and the peak frequency detection circuit 70 are the same as the configurations and the processing in any one of the first to fourth embodiments, the description thereof will be omitted.

The switch 83 switches whether to electrically couple or cut off between the input terminal 93 of the semiconductor device 1 and the peak frequency detection circuit 70 in response to the control signal output from the communication interface circuit 10. Specifically, the switch 83 electrically cuts off between the input terminal 93 and the peak frequency detection circuit 70 when the operation mode of the semiconductor device 1 is the normal operation mode, and electrically couples the input terminal 93 and the peak frequency detection circuit 70 when the operation mode of the semiconductor device 1 is the inspection mode or the calibration mode.

Similarly, the switch 84 switches whether to electrically couple or cut off between the input terminal 94 of the semiconductor device 1 and the peak frequency detection circuit 70 in response to the control signal output from the communication interface circuit 10. Specifically, the switch 84 electrically cuts off between the input terminal 94 and the peak frequency detection circuit 70 when the operation mode of the semiconductor device 1 is the normal operation mode, and electrically couples the input terminal 94 and the peak frequency detection circuit 70 when the operation mode of the semiconductor device 1 is the inspection mode or the calibration mode.

As described above, the peak frequency detection circuit 70 is electrically cut off from the input terminals 93 and 94 in the normal operation mode by the switches 83 and 84, and is electrically coupled to the input terminals 93 and 94 in the inspection mode and the calibration mode to measure the potential difference between the output terminal 101 and the output terminal 102 of the sound source reproduction circuit 100*a* and detect the peak frequency $f_{peak}$ and the peak voltage $v_{peak}$, or the peak frequency $F_{peak}$ and the peak voltage $V_{peak}$.

When a command to read the information on the determination result of the determination circuit 61 is received from the micro control unit 2, the communication interface circuit 10 acquires information on the determination result from the determination circuit 61 and transmits the information to the micro control unit 2. The micro control unit 2 can recognize the state of the sound reproduction device 3*a* and perform various types of processing corresponding to the state of the sound reproduction device 3*a* based on the information on the determination result.

Other configurations and functions of the semiconductor device 1 according to the fifth embodiment are the same as the configurations and functions in any one of the first to fourth embodiments, and thus the description thereof will be omitted.

The semiconductor device 1 according to the fifth embodiment is configured to cause one sound reproduction device 3*a* to output the sound, but may be configured to cause a plurality of sound reproduction devices to output the sound.

In the fifth embodiment, the terminal P1*a* of the sound reproduction device 3*a* is an example of a "first terminal", and the terminal P2*a* of the sound reproduction device 3 is an example of a "second terminal". The input terminal 93 of the semiconductor device 1 is an example of a "first input terminal", and the input terminal 94 of the semiconductor device 1 is an example of a "second input terminal". The modulated signal DOPa is an example of a "first modulated signal", and the modulated signal DONa is an example of a "second modulated signal". The amplified signal DOXPa is an example of a "first amplified signal", and the amplified signal DOXNa is an example of a "second amplified signal". The normal operation mode is an example of a "first operation mode", and the inspection mode is an example of a "second operation mode".

As described above, with the semiconductor device 1 according to the fifth embodiment, the sound source reproduction circuit 100*a* that causes the sound reproduction device 3*a* to output the sound is provided outside the semiconductor device 1, and whether or not there is a possibility that the sound reproduction device 3*a* fails can be determined. In addition, with the semiconductor device 1 according to the fifth embodiment, the same effects as the effects of the semiconductor device 1 according to any one of the first to fourth embodiments can be obtained.

1-6. Modification Example

In each of the above-described embodiments, the memory 20 in which the sound source data 21-1 to 21-*n* is stored is built in the semiconductor device 1, but an external memory in which the sound source data 21-1 to 21-*n* are stored may be coupled to the semiconductor device 1 instead of the memory 20, and the semiconductor device 1 may read the sound source data 21-*i*, which is the sound source signal DI, from the external memory. Alternatively, the micro control unit 2 may be built in a memory in which the sound source data 21-1 to 21-*n* is stored instead of the memory 20, and the micro control unit 2 may read the sound source data 21-*i* from the memory and transmit the sound source data 21-*i* as the sound source signal DI to the semiconductor device 1.

Figure 26:
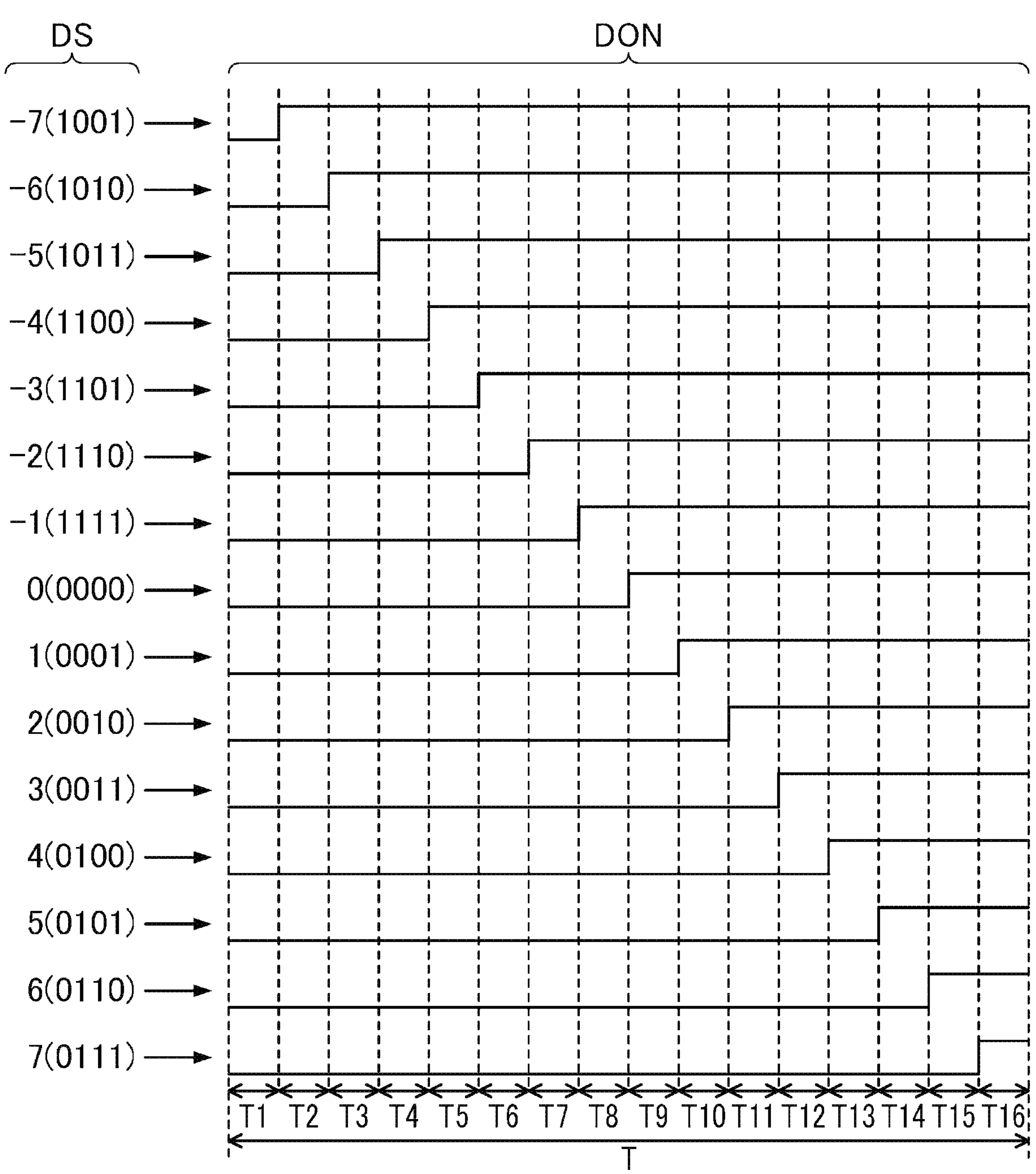
FIG. 26 is a diagram illustrating another example of the pulse width modulation for generating the modulated signal.
Figure 27:
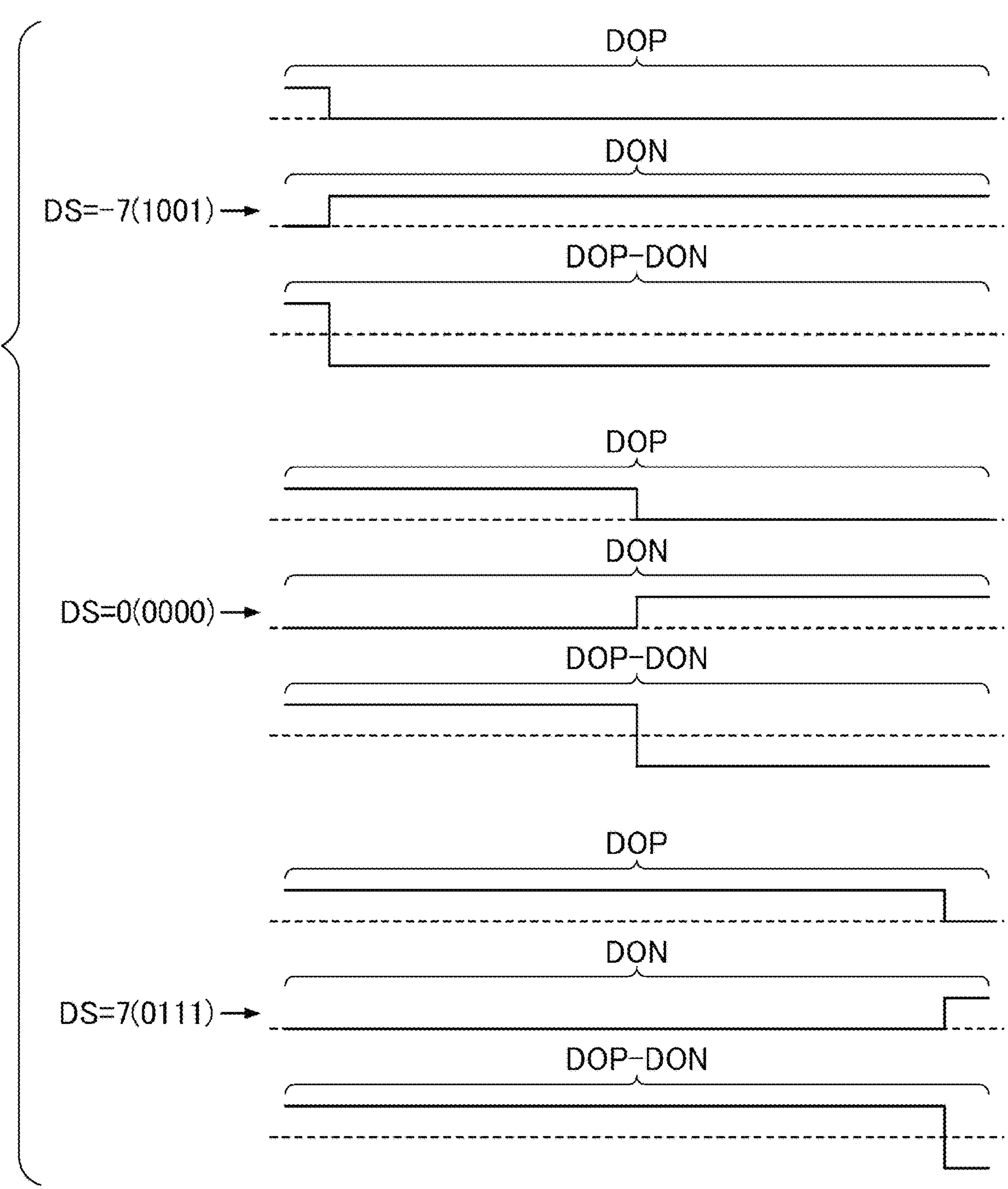
FIG. 27 is a diagram illustrating another example of the difference between the modulated signal and the modulated signal.

In addition, in each of the above-described embodiments, the examples of FIGS. 2 to 4 are described as the modulation method via the pulse width modulation circuit 33, but other modulation methods may be used. For example, the pulse width modulation for generating the modulated signal DOP may be the same as the method illustrated in FIG. 2, and the pulse width modulation for generating the modulated signal DON may be the method illustrated in FIG. 26. In the example of FIG. 26, the modulated signal DON is a signal obtained by inverting a logic level of the modulated signal DOP illustrated in FIG. 2, and a high-level time is shorter as the value of the sigma-delta modulated signal DS is larger. For example, when the sigma-delta modulated signal DS is "−7" in decimal, that is, "1001" in binary, the modulated signal DON is at a low level in the one section T1 and is at a high level in the 15 sections T2 to T16. For example, when the sigma-delta modulated signal DS is "0" in decimal, that is, "0000" in binary, the modulated signal DON is at a low level in the eight sections T1 to T8 and is at a high level in the eight sections T9 to T16. For example, when the sigma-delta modulated signal DS is "7" in decimal, that is, "0111" in binary, the modulated signal DON is at a low level in the 15 sections T1 to T15 and is at a high level in the one section T16. Therefore, for example, a difference between the modulated signal DOP and the modulated signal DON when the sigma-delta modulated signal DS is "−7", "0", and "7" in decimal is as illustrated in FIG. 27.

2. Electronic Apparatus

Figure 28:
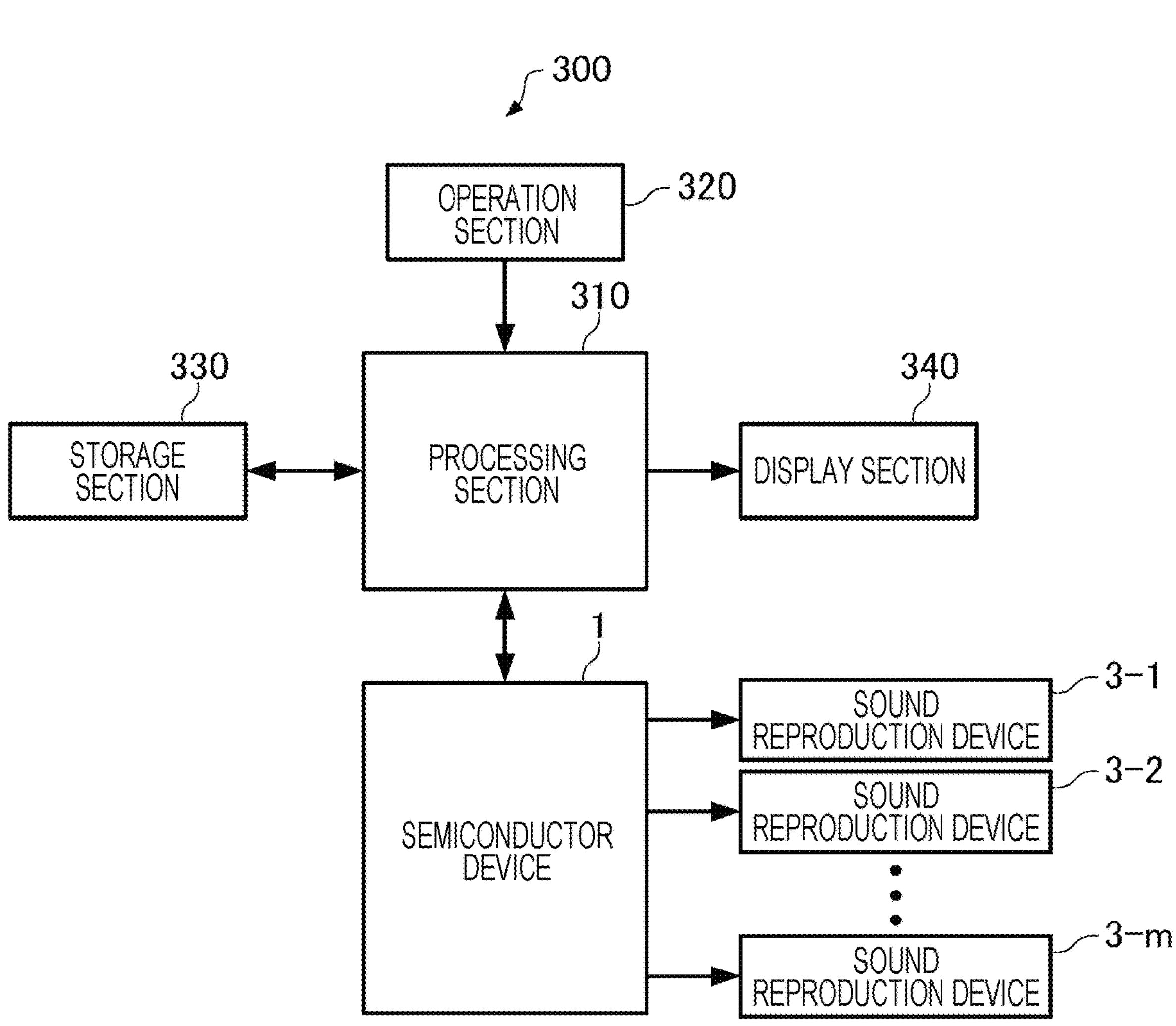
FIG. 28 is a functional block diagram of an electronic apparatus according to the present embodiment.

FIG. 28 is a functional block diagram illustrating an example of a configuration of an electronic apparatus according to the present embodiment using the semiconductor device 1 according to the present embodiment.

As illustrated in FIG. 28, an electronic apparatus 300 according to the present embodiment includes the semiconductor device 1, m sound reproduction devices 3-1 to 3-*m*, a processing section 310, an operation section 320, a storage section 330, and a display section 340. The electronic apparatus 300 according to the present embodiment may be configured by omitting or changing some of the components of FIG. 28, or by adding other components.

The processing section 310 performs control processing or various types of data processing of each section of the electronic apparatus 300. For example, the processing section 310 transmits various commands to the semiconductor device 1 to control the operation of the semiconductor device 1. The processing section 310 performs various types of processing corresponding to the operation signal from the operation section 320, processing of transmitting a display signal for displaying various types of information on the display section 340, and the like. For example, the processing section 310 may be the micro control unit 2.

The operation section 320 is an input device configured with an operation key, a button switch, or the like, and outputs an operation signal corresponding to the operation via the user to the processing section 310.

The storage section 330 stores a program, data, or the like for the processing section 310 to perform various types of calculation processing or control processing. The storage section 330 is realized by, for example, a hard disk, a flexible disk, an MO, an MT, various memories, a CD-ROM, or a DVD-ROM.

The display section 340 is a display device configured by an LCD or the like, and displays various types of information based on the input display signal. LCD is an abbreviation for Liquid Crystal Display. A touch panel that functions as the operation section 320 may be provided on the display section 340.

The semiconductor device 1 generates a sound signal based on various commands transmitted from the processing section 310 in the normal operation mode, and outputs the sound signal to the sound reproduction device 3-1. As a result, a desired sound is output from the sound reproduction device 3-1. The sound reproduction device 3-1 corresponds to the sound reproduction device 3. Further, the semiconductor device 1 outputs the amplified signals DOXP and DOXN based on the test signal to the sound reproduction device 3-1 in the inspection mode and the calibration mode. As a result, the sound is output from the sound reproduction device 3-1, and thus it is preferable that a very small sound that is difficult to be heard by a human ear is output. That is, it is preferable that a volume of the sound reproduced by the sound reproduction device 3-1 in the inspection mode and the calibration mode is smaller than a minimum value of a volume of the sound reproduced by the sound reproduction device 3-1 in the normal operation mode. As a result, it can be made less noticeable to a user that the semiconductor device 1 is operating in the inspection mode or the calibration mode. Then, the semiconductor device 1 may inspect the sound reproduction device 3-1 and transmit an inspection result to the processing section 310, and the processing section 310 may determine the presence or absence of the failure or a failure mode of the sound reproduction device 3-1. When the sound reproduction device 3-1 fails, the processing section 310 may cause, for example, any one of the sound reproduction devices 3-2 to 3-*m* to reproduce a voice for notifying that the sound reproduction device 3-1 fails, or may switch an output destination of the sound signal from the sound reproduction device 3-1 to any one of the sound reproduction devices 3-2 to 3-*m*.

Since the semiconductor device 1 can generate the signal necessary for detecting the failure of the sound reproduction device 3-1, the electronic apparatus 300 having high reliability can be realized.

Various electronic apparatuses can be considered as the electronic apparatus 300, and examples thereof include a warning device, various household electrical appliances such as a rice cooker, an IH cooking heater, a vacuum cleaner, and a washing machine, an electronic clock, mobile, laptop, and tablet type personal computers, a mobile terminal such as a smartphone or a mobile phone, a digital camera, an ink jet ejection apparatus such as an ink jet printer, a storage area network device such as a router or a switch, a local area network device, a mobile terminal base station device, a TV, a video camera, a video recorder, a car navigation device, a real-time clock device, a pager, an electronic notebook, an electronic dictionary, a calculator, an electronic game device, a game controller, a word processor, a workstation, a videophone, a security TV monitor, electronic binoculars, a POS terminal, a medical device such as an electronic thermometer, a blood pressure monitor, a blood sugar meter, an electrocardiogram measurement device, an ultrasound diagnostic device, or an electronic endoscope, a fish finder, various measurement devices, meters and gauges for a vehicle, an aircraft, or a ship, a flight simulator, a head-mounted display, motion trace, motion tracking, a motion controller, and a pedestrian autonomous navigation device.

Figure 29:
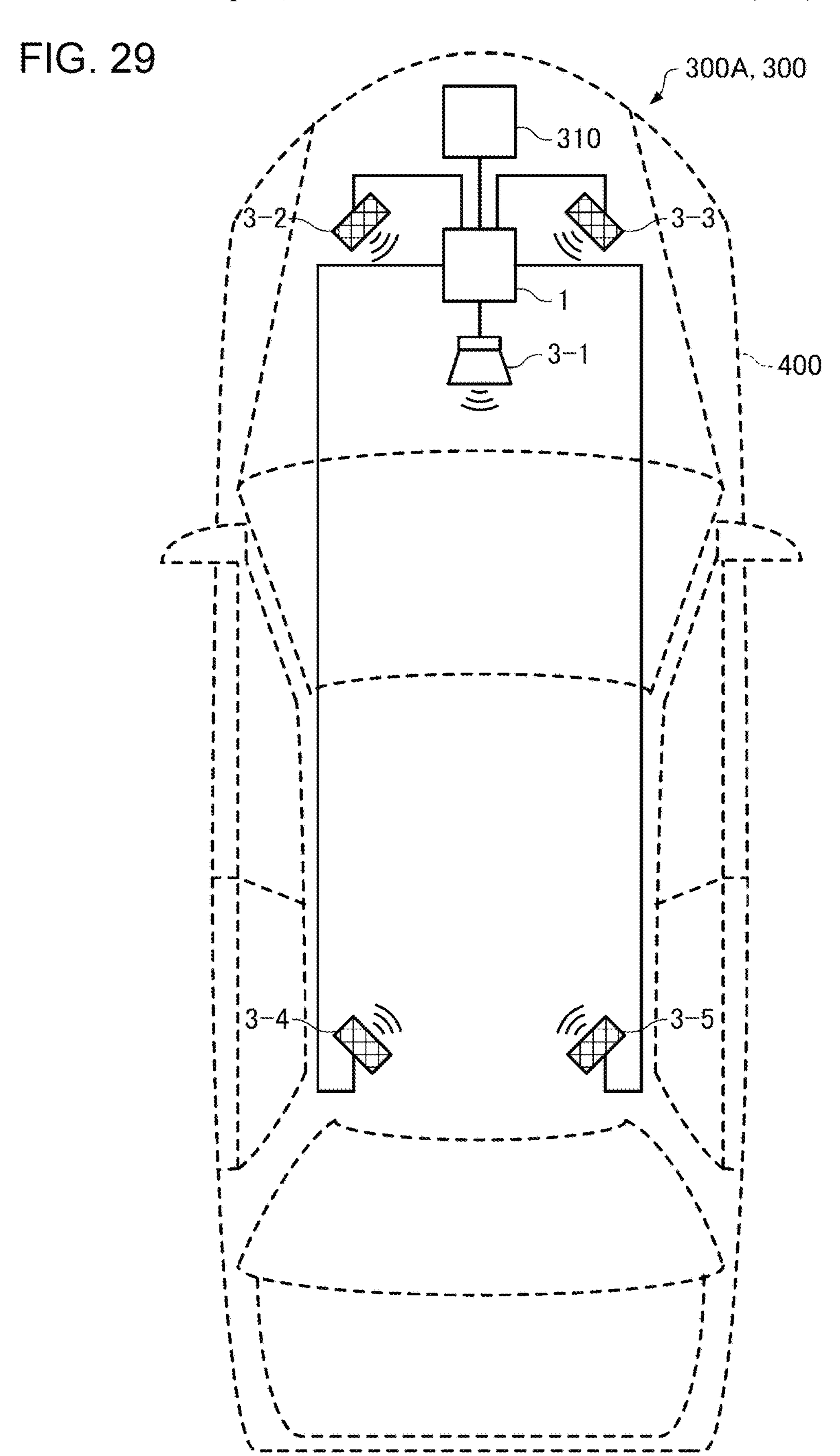
FIG. 29 is a diagram illustrating a configuration example of a warning device that is an example of the electronic apparatus.

FIG. 29 is a diagram illustrating a configuration example of a warning device 300A, which is an example of the electronic apparatus 300. In FIG. 29, the same components as the components in FIG. 28 are denoted by the same reference numerals. The warning device 300A illustrated in FIG. 29 is mounted in a vehicle 400. The sound reproduction device 3-1 is a speaker, and each of the sound reproduction devices 3-2 to 3-5 is a buzzer.

The processing section 310 transmits various sound reproduction commands and the like to the semiconductor device 1 based on signals from various sensors (not illustrated). Examples of the various sounds include an audio or a warning sound imitating a voice of a human for notifying of an abnormality in a brake, an engine oil, a power steering, a brake override system, and the like, running with a door not properly closed, zigzag running with a parking brake not released, a seat belt being not worn, and an approach to a preceding vehicle, and the like, and an effect sound for notifying of a blinker, a hazard lamp, reverse movement.

The semiconductor device 1 generates a sound signal based on a part of a plurality of sound source data corresponding to various sounds based on the command from the processing section 310, and outputs the generated sound signal to the sound reproduction device 3-1. The semiconductor device 1 may inspect the sound reproduction device 3-1 and transmit an inspection result to the processing section 310, and the processing section 310 may determine the presence or absence of the failure or a failure mode of the sound reproduction device 3-1. When the sound reproduction device 3-1 fails, the processing section 310 may cause, for example, any one of the sound reproduction devices 3-2 to 3-5 to reproduce a voice for notifying that the sound reproduction device 3-1 fails, or may switch an output destination of the sound signal from the sound reproduction device 3-1 to any one of the sound reproduction devices 3-2 to 3-5.

Since the semiconductor device 1 can generate the signal necessary for detecting the failure of the sound reproduction device 3-1, the warning device 300A having high reliability can be realized.

The electronic apparatus 300 is not limited to the configuration illustrated in FIG. 28, and may include, for example, the semiconductor device 1 and the sound source reproduction circuit 100*a* according to the fifth embodiment illustrated in FIG. 25, and the semiconductor device 1 may instruct the sound source reproduction circuit 100*a* to output the sound to any one of the sound reproduction devices 3-1 to 3-*m*. Alternatively, the electronic apparatus 300 may include the semiconductor device 1 and the sound source reproduction circuit 100*a* illustrated in FIG. 30, and the semiconductor device 1 may cause the sound reproduction device 3 to output the sound and may instruct the sound source reproduction circuit 100*a* to cause another sound reproduction device 3*a* to output the sound.

Figure 30:
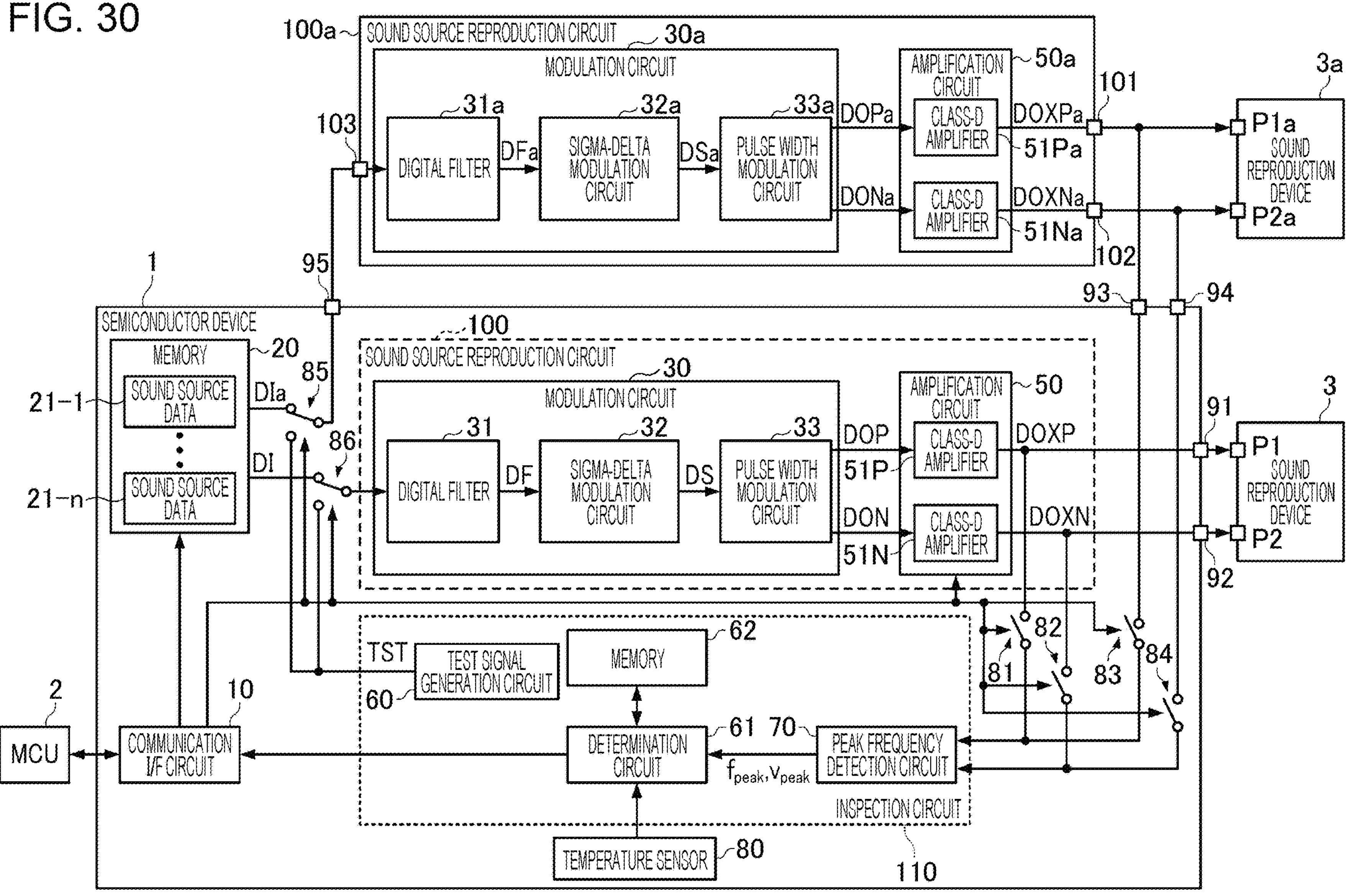
FIG. 30 is a diagram illustrating a configuration example of an electronic apparatus according to a modification example.

In FIG. 30, the same components as the components in FIG. 25 are denoted by the same reference numerals. In FIG. 30, the configuration and functions of the sound source reproduction circuit 100*a* are the same as the configuration and functions of the sound source reproduction circuit 100*a* illustrated in FIG. 25, and the description thereof will be omitted. The semiconductor device 1 is coupled to the sound source reproduction circuit 100*a* and the sound reproduction devices 3 and 3*a*. Specifically, the output terminal 91 of the semiconductor device 1 is coupled to the terminal P1 of the sound reproduction device 3, and the output terminal 92 of the semiconductor device 1 is coupled to the terminal P2 of the sound reproduction device 3. The output terminal 95 of the semiconductor device 1 is coupled to the input terminal 103 of the sound source reproduction circuit 100*a*, the input terminal 93 of the semiconductor device 1, the output terminal 101 of the sound source reproduction circuit 100*a*, and the terminal P1*a* of the sound reproduction device 3*a* are coupled to each other, and the input terminal 94 of the semiconductor device 1, the output terminal 102 of the sound source reproduction circuit 100*a*, and the terminal P2*a* of the sound reproduction device 3*a* are coupled to each other.

The semiconductor device 1 includes the communication interface circuit 10, the memory 20, the temperature sensor 80, switches 81, 82, 83, 84, 85, and 86, the sound source reproduction circuit 100, and the inspection circuit 110. The semiconductor device 1 may be a semiconductor integrated circuit device of one chip, may be configured as a semiconductor integrated circuit device of a plurality of chips, or may be configured such that at least a part thereof is configured with an electronic component other than the semiconductor integrated circuit device.

When a command to switch the operation mode of the semiconductor device 1 to the normal operation mode, the inspection mode, or the calibration mode is received, the communication interface circuit 10 generates a control signal for switching the coupling of switches 81, 82, 83, 84, 85, and 86 depending on the operation mode. In addition, for example, when a sound source reproduction command for causing the sound reproduction device 3 to reproduce sound source data 21-*i* is received, the communication interface circuit 10 reads the sound source data 21-*i* from the memory 20, inputs the sound source data 21-*i* to the sound source reproduction circuit 100 as a sound source signal DI, and instructs the sound source reproduction circuit 100 to perform the reproduction via the sound reproduction device 3. In addition, when the sound source reproduction command for causing the sound reproduction device 3*a* to reproduce sound source data 21-*i* is received, the communication interface circuit 10 reads the sound source data 21-*i* from the memory 20, inputs the sound source data 21-*i* to the input terminal 103 of the sound source reproduction circuit 100*a* via the switch 85 and the output terminal 95, as a sound source signal DIa, and instructs the sound source reproduction circuit 100*a* to perform the reproduction via the sound reproduction device 3*a*. The sound source data 21-*i* is any one of the sound source data 21-1 to 21-*n* stored in the memory 20. Further, for example, when the sound reproduction device 3 receives the sound source stop command for the sound source data 21-*i* being reproduced, the communication interface circuit 10 instructs the sound source reproduction circuit 100 to stop the reproduction. Further, when the sound reproduction device 3*a* receives the sound source stop command for the sound source data 21-*i* being reproduced, the communication interface circuit 10 instructs the sound source reproduction circuit 100*a* to stop the reproduction. Further, for example, when various setting commands related to the sound source reproduction via the sound source reproduction circuit 100 are received, the communication interface circuit 10 performs various settings on the sound source reproduction circuit 100. Further, when various setting commands related to the sound source reproduction via the sound source reproduction circuit 100*a* are received, the communication interface circuit 10 performs various settings on the sound source reproduction circuit 100*a*.

The switch 85 outputs any one of a signal based on the sound source signal DIa and a test signal TST to the output terminal 95 in response to the control signal output from the communication interface circuit 10. Specifically, the switch 85 outputs the signal based on the sound source signal DIa to the output terminal 95 in the normal operation mode, and outputs the test signal TST to the output terminal 95 in the inspection mode or the calibration mode. The signal based on the sound source signal DIa may be the sound source signal DIa itself or may be a signal obtained by performing some processing on the sound source signal DIa.

The switch 86 outputs any one of the signal based on the sound source signal DI and the test signal TST to the sound source reproduction circuit 100 in response to the control signal output from the communication interface circuit 10. Specifically, the switch 86 outputs the signal based on the sound source signal DI to the sound source reproduction circuit 100 in the normal operation mode, and outputs the test signal TST to the sound source reproduction circuit 100 in the inspection mode or the calibration mode. The signal based on the sound source signal DI may be the sound source signal DI itself or may be a signal obtained by performing some processing on the sound source signal DI.

In the normal operation mode, the sound source reproduction circuit 100 converts the signal based on the input sound source signal DI into the amplified signals DOXP and DOXN, and outputs the amplified signals DOXP and DOXN to the output terminals 91 and 92, respectively. As a result, the sounds corresponding to the amplified signals DOXP and DOXN are output from the sound reproduction device 3. In the inspection mode or the calibration mode, the sound source reproduction circuit 100 converts the input test signal TST into the amplified signals DOXP and DOXN, and outputs the amplified signals DOXP and DOXN to the output terminals 91 and 92, respectively.

For example, each of the sound reproduction devices 3 and 3*a* may be a speaker or a buzzer. The sound output from each of the sound reproduction devices 3 and 3*a* may be, for example, an audio imitating a voice when a human speaks, or various sounds such as a mechanical warning sound or an effect sound.

As illustrated in FIG. 30, the sound source reproduction circuit 100 includes the modulation circuit 30 and the amplification circuit 50. The modulation circuit 30 modulates the input signal to output the modulated signals DOP and DON. Specifically, the modulation circuit 30 includes the digital filter 31, the sigma-delta modulation circuit 32, and the pulse width modulation circuit 33, the sigma-delta modulation circuit 32 performs sigma-delta modulation on the signal DF obtained by performing, via the digital filter 31, the digital filter processing on the input signal, to output the sigma-delta modulated signal DS, and the pulse width modulation circuit 33 further performs the pulse width modulation to output the modulated signals DOP and DON. The modulation circuit 30 modulates the signal based on the input sound source signal DI to output the modulated signals DOP and DON in the normal operation mode, and modulates the input test signal TST to output the modulated signals DOP and DON in the inspection mode or the calibration mode. The detailed processing of the digital filter 31, the sigma-delta modulation circuit 32, and the pulse width modulation circuit 33 is the same as the processing of the digital filter 31, the sigma-delta modulation circuit 32, and the pulse width modulation circuit 33 in any one of the first to fourth embodiments, and thus the description thereof will be omitted.

The amplification circuit 50 outputs the amplified signal DOXP obtained by amplifying the modulated signal DOP to the output terminal 91, and outputs the amplified signal DOXN obtained by amplifying the modulated signal DON to the output terminal 92. Specifically, the amplification circuit 50 includes the two class-D amplifiers 51P and 51N, the class-D amplifier 51P outputs the amplified signal DOXP obtained by amplifying the modulated signal DOP to the output terminal 91, and the class-D amplifier 51N outputs the amplified signal DOXN obtained by amplifying the modulated signal DON to the output terminal 92. Since the output terminal 91 is coupled to the terminal P1 of the sound reproduction device 3 and the output terminal 92 is coupled to the terminal P2 of the sound reproduction device 3, the sound reproduction device 3 reproduces a sound having a magnitude corresponding to a voltage difference between the amplified signal DOXP and the amplified signal DOXN.

Therefore, when the signal based on the sound source signal DI is input to the sound source reproduction circuit 100, the sound reproduction device 3 outputs a desired sound indicated by the sound source reproduction command. Further, it is preferable that the sound reproduction device 3 outputs a very small sound that is difficult to be heard by a human ear when the test signal TST is input to the sound source reproduction circuit 100.

The switch 81 switches whether to electrically couple or cut off between the output terminal 91 of the semiconductor device 1 and the peak frequency detection circuit 70 in response to the control signal output from the communication interface circuit 10. The switch 82 switches whether to electrically couple or cut off between the output terminal 92 of the semiconductor device 1 and the peak frequency detection circuit 70 in response to the control signal output from the communication interface circuit 10. The switch 83 switches whether to electrically couple or cut off between the input terminal 93 of the semiconductor device 1 and the peak frequency detection circuit 70 in response to the control signal output from the communication interface circuit 10. The switch 84 switches whether to electrically couple or cut off between the input terminal 94 of the semiconductor device 1 and the peak frequency detection circuit 70 in response to the control signal output from the communication interface circuit 10.

Specifically, when the operation mode of the semiconductor device 1 is the normal operation mode, the switches 81 and 82 electrically cut off between the output terminals 91 and 92 and the peak frequency detection circuit 70, and the switches 83 and 84 electrically cut off between the input terminals 93 and 94 and the peak frequency detection circuit 70. In addition, when the operation mode of the semiconductor device 1 is the inspection mode or the calibration mode, the switches 81 and 82 electrically couple the output terminals 91 and 92 and the peak frequency detection circuit 70, and the switches 83 and 84 electrically cut off between the input terminals 93 and 94 and the peak frequency detection circuit 70, or the switches 83 and 84 electrically couple the input terminals 93 and 94 and the peak frequency detection circuit 70, and the switches 81 and 82 electrically cut off between the output terminals 91 and 92 and the peak frequency detection circuit 70. That is, the switches 81 and 82 and the switches 83 and 84 are turned on exclusively in the inspection mode or the calibration mode, the switches 83 and 84 are turned off when the switches 81 and 82 are turned on, and the switches 81 and 82 are turned off when the switches 83 and 84 are turned on.

In the inspection mode, the inspection circuit 110 detects the peak frequency $f_{peak}$ for each of the sound reproduction devices 3 and 3*a*, and determines the states of the sound reproduction devices 3 and 3*a* based on the detected peak frequency $f_{peak}$. In the calibration mode, the inspection circuit 110 detects the peak frequency $F_{peak}$ for each of the sound reproduction devices 3 and 3*a*, and creates the information necessary for determining the states of the sound reproduction devices 3 and 3*a* based on the detected peak frequency $F_{peak}$.

The inspection circuit 110 includes the test signal generation circuit 60, the determination circuit 61, the memory 62, and the peak frequency detection circuit 70. The test signal generation circuit 60 and the peak frequency detection circuit 70 operate in the inspection mode and the calibration mode, and stop the operation in the normal operation mode. The determination circuit 61 operates in the inspection mode, and stops the operation in the normal operation mode and the calibration mode.

The test signal generation circuit 60 generates the test signal TST of which the frequency is changed in a frequency band set in advance. The frequency band in which the test signal generation circuit 60 changes the frequency of the test signal TST can be set to any frequency band by the micro control unit 2, and may be, for example, a frequency band of 10 Hz or higher and 3 kHz or lower.

When the switches 81 and 82 are turned on, the peak frequency detection circuit 70 measures the potential difference between the output terminal 91 and the output terminal 92, and detects the peak frequency $f_{peak}$ or the peak frequency $F_{peak}$ which is a frequency of the test signal TST at which the impedance of the sound reproduction device 3 reaches the peak. The peak frequency detection circuit 70 further detects the peak voltage $v_{peak}$ or the peak voltage $V_{peak}$ which is a voltage obtained by amplifying the potential difference between the output terminal 91 and the output terminal 92 when the frequency of the test signal TST is the peak frequency $f_{peak}$ or the peak frequency $F_{peak}$. When the switches 83 and 84 are turned on, the peak frequency detection circuit 70 measures the potential difference between the input terminal 93 and the input terminal 94, and detects the peak frequency $f_{peak}$ or the peak frequency $F_{peak}$ which is a frequency of the test signal TST at which the impedance of the sound reproduction device 3*a* reaches the peak. When the switches 83 and 84 are turned on, the peak frequency detection circuit 70 further detects the peak voltage $v_{peak}$ or the peak voltage $V_{peak}$ which is a voltage obtained by amplifying the potential difference between the input terminal 93 and the input terminal 94 when the frequency of the test signal TST is the peak frequency $f_{peak}$ or the peak frequency $F_{peak}$. As described above, the peak frequencies $f_{peak}$ and $F_{peak}$ or the peak voltages $v_{peak}$ and $V_{peak}$ change depending on the temperature of the sound reproduction device 3*a*.

The memory 62 includes a non-volatile memory (not illustrated), and the non-volatile memory stores table information in which a plurality of temperatures and a plurality of peak frequencies related to the sound reproduction devices 3 and 3*a* are associated. The table information also defines a correspondence relationship between the plurality of temperatures and the plurality of peak voltages related to the sound reproduction devices 3 and 3*a*. The memory 62 includes a volatile memory (not illustrated) that stores various temporarily created data.

The determination circuit 61 determines whether or not the peak frequency $f_{peak}$ detected by the peak frequency detection circuit 70 is included in a reference frequency range. The reference frequency range is a range of a frequency determined based on the frequency band of the test signal TST and temperature information which is information on the temperatures of the sound reproduction devices 3 and 3*a*. In the present embodiment, the determination circuit 61 acquires a temperature signal output from the temperature sensor 80 as the temperature information, and calculates the reference frequency range based on the acquired temperature signal and the table information stored in the memory 62. The determination circuit 61 further determines whether or not the peak voltage $v_{peak}$ detected by the peak frequency detection circuit 70 is included in a reference voltage range. The reference voltage range is a range of a voltage determined based on the frequency band of the test signal TST and the temperature information which is the information on the temperatures of the sound reproduction devices 3 and 3*a*. The determination circuit 61 calculates the reference voltage range based on the temperature signal output from the temperature sensor 80 and the table information stored in the memory 62. Further, in the present embodiment, the determination circuit 61 determines the states of the sound reproduction devices 3 and 3*a*, such as the presence or absence of the failures of the sound reproduction devices 3 and 3*a*, based on the determination result of whether or not the peak frequency $f_{peak}$ is included in the reference frequency range or the determination result of whether or not the peak voltage $v_{peak}$ is included in the reference voltage range.

The temperature sensor 80 detects the temperature, and outputs the temperature signal having the magnitude corresponding to the detected temperature. In FIG. 30, although the temperature sensor 80 is built in the semiconductor device 1 and directly detects the temperature of the semiconductor device 1, the temperature of the semiconductor device 1 and the temperatures of the sound reproduction devices 3 and 3*a* change similarly depending on the temperature of the periphery of the semiconductor device 1 and the sound reproduction devices 3 and 3*a*, and thus the temperatures of the sound reproduction devices 3 and 3*a* are indirectly detected. It should be noted that the temperature sensor 80 may be provided outside the semiconductor device 1 in the vicinity of the sound reproduction device 3 in order to directly detect the temperature of the sound reproduction device 3. In order to directly detect the temperature of the sound reproduction device 3*a*, a temperature sensor different from the temperature sensor 80 may be provided inside the sound source reproduction circuit 100*a* or in the vicinity of the sound reproduction device 3*a*. In this case, when whether or not the peak frequency $f_{peak}$ detected when the switches 83 and 84 are turned on is included in the reference frequency range is determined, the determination circuit 61 need only acquire a temperature signal output from the temperature sensor different from the temperature sensor 80 as the temperature information.

Since the configurations and the processing of the test signal generation circuit 60, the determination circuit 61, and the peak frequency detection circuit 70 are the same as the configurations and the processing in any one of the first to fourth embodiments, the description thereof will be omitted.

When a command to read the information on the determination result of the determination circuit 61 is received from the micro control unit 2, the communication interface circuit 10 acquires information on the determination result from the determination circuit 61 and transmits the information to the micro control unit 2. The micro control unit 2 can recognize the states of the sound reproduction devices 3 and 3*a* and perform various types of processing corresponding to the states of the sound reproduction devices 3 and 3*a* based on the information on the determination result.

Since the other configurations and functions of the semiconductor device 1 illustrated in FIG. 30 are the same as the configurations and functions in any one of the first to fifth embodiments, the description thereof will be omitted.

The terminal P1 of the sound reproduction device 3 is an example of a "first terminal", and the terminal P2 of the sound reproduction device 3 is an example of a "second terminal". The output terminal 91 of the semiconductor device 1 is an example of a "first output terminal", and the output terminal 92 of the semiconductor device 1 is an example of a "second output terminal". The modulated signal DOP obtained by modulating the signal based on the sound source signal DI is an example of a "first modulated signal", and the modulated signal DON obtained by modulating the signal based on the sound source signal DI is an example of a "second modulated signal". The modulated signal DOP obtained by modulating the test signal TST is an example of a "third modulated signal", and the modulated signal DON obtained by modulating the test signal TST is an example of a "fourth modulated signal". The amplified signal DOXP obtained by amplifying the modulated signal DOP obtained by modulating the signal based on the sound source signal DI is an example of a "first amplified signal", and the amplified signal DOXN obtained by amplifying the modulated signal DON obtained by modulating the signal based on the sound source signal DI is an example of a "second amplified signal". The amplified signal DOXP obtained by amplifying the modulated signal DOP obtained by modulating the test signal TST is an example of a "third amplified signal", and the amplified signal DOXN obtained by amplifying the modulated signal DON obtained by modulating the test signal TST is an example of a "fourth amplified signal". The normal operation mode is an example of a "first operation mode", and the inspection mode is an example of a "second operation mode".

In FIG. 30, the semiconductor device 1 instructs one sound source reproduction circuit 100*a* to cause the sound reproduction device 3*a* to output the sound, but may instruct a plurality of sound source reproduction circuits 100*a* to cause a plurality of sound reproduction devices 3*a* to output the sound. For example, in the warning device 300A illustrated in FIG. 29, the semiconductor device 1 may cause at least one of the sound reproduction devices 3-1 to 3-5 to output the sound, and instruct one or a plurality of sound source reproduction circuits 100*a* to cause at least one of the sound reproduction devices 3-1 to 3-5 to output the sound.

The present disclosure is not limited to the present embodiment, and various modifications can be made within the scope of the spirit of the present disclosure.

The above-described embodiments and modification examples are merely examples, and the present disclosure is not limited thereto. For example, the respective embodiments and the respective modification example can be combined as appropriate.

The present disclosure includes a configuration that is substantially the same as the configurations described in the embodiments, for example, a configuration that has the same function, method, and result, or a configuration that has the same object and effect. The present disclosure includes a configuration in which non-essential parts of the configurations described in the embodiments are replaced. In addition, the present disclosure includes a configuration that has the same effects or a configuration that can achieve the same object as the configurations described in the embodiments.

The present disclosure includes a configuration in which a known technique is added to the configurations described in the embodiments.

The following contents are derived from the above-described embodiments and modification examples.

An aspect of the semiconductor device is a semiconductor device including: a first output terminal coupled to a first terminal of a sound reproduction device; a second output terminal coupled to a second terminal of the sound reproduction device; a modulation circuit that, in a first operation mode, modulates a signal based on a sound source signal to output a first modulated signal and a second modulated signal; a test signal generation circuit that, in a second operation mode, modulates a test signal of which a frequency is changed in a frequency band set in advance, to generate a third modulated signal and a fourth modulated signal; an amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the third modulated signal to the first output terminal and outputs a fourth amplified signal obtained by amplifying the fourth modulated signal to the second output terminal; a peak frequency detection circuit that, in the second operation mode, measures a potential difference between the first output terminal and the second output terminal to detect a peak frequency that is a frequency of the test signal at which an impedance of the sound reproduction device reaches a peak; and a determination circuit that, in the second operation mode, determines whether or not the peak frequency is included in a reference frequency range determined based on the frequency band of the test signal and temperature information that is information on a temperature of the sound reproduction device.

With the semiconductor device, in the first operation mode, the amplification circuit outputs the first amplified signal obtained by amplifying the first modulated signal based on the sound source signal to the first output terminal, and outputs the second amplified signal obtained by amplifying the second modulated signal based on the sound source signal to the second output terminal, so that the sound reproduction device can reproduce the sound. On the other hand, in the second operation mode, the amplification circuit outputs the third amplified signal obtained by amplifying the third modulated signal based on the test signal to the first output terminal, and outputs the fourth amplified signal obtained by amplifying the fourth modulated signal based on the test signal to the second output terminal, so that the peak frequency detection circuit can measure the potential difference between the first output terminal and the second output terminal, to detect the peak frequency at which the impedance of the sound reproduction device reaches the peak. The determination circuit can determine whether or not the peak frequency is included in the reference frequency range, and determine that there is a possibility that the sound reproduction device fails, for example, when the peak frequency is not included in the reference frequency range. Since the reference frequency range is determined based on the frequency band of the test signal and the temperature information of the sound reproduction device, the reference frequency range appropriately changes depending on the temperature of the sound reproduction device. Therefore, with the semiconductor device, the accuracy of the failure determination of the sound reproduction device can be maintained even when the temperature changes.

In the semiconductor device, the amplification circuit is shared for the generation of the first amplified signal and the second amplified signal for causing the sound reproduction device to reproduce the sound in the first operation mode, and the generation of the third amplified signal and the fourth amplified signal necessary for detecting the peak frequency in the second operation mode. Therefore, with the semiconductor device, a signal necessary for detecting the failure of the sound reproduction device can be generated by a small-scale circuit.

In the semiconductor device according to the aspect, the determination circuit may acquire a temperature signal output from a temperature sensor as the temperature information, to calculate the reference frequency range based on the acquired temperature signal and table information in which a plurality of the temperatures and a plurality of the peak frequencies related to the sound reproduction device are associated with each other.

With the semiconductor device, an appropriate reference frequency range corresponding to the temperature of the sound reproduction device can be calculated based on the temperature signal output from the temperature sensor and the table information in which the plurality of temperatures and the plurality of peak frequencies are associated with each other. Therefore, with the semiconductor device, the accuracy of the failure determination of the sound reproduction device can be maintained even when the temperature changes.

In the semiconductor device according to the aspect, the determination circuit may acquire a temperature signal output from a temperature sensor as the temperature information, to calculate the reference frequency range based on the acquired temperature signal and information on a relational expression between the temperature and the peak frequency.

With the semiconductor device, an appropriate reference frequency range corresponding to the temperature of the sound reproduction device can be calculated based on the temperature signal output from the temperature sensor and the information on the relational expression between the temperature and the peak frequency. Therefore, with the semiconductor device, the accuracy of the failure determination of the sound reproduction device can be maintained even when the temperature changes.

In the semiconductor device according to the aspect, the temperature information may be information on a temperature range in which an operation of the sound reproduction device is guaranteed, and the reference frequency range may be a frequency range including a reference frequency block including the peak frequency corresponding to a reference temperature among a plurality of frequency blocks obtained by dividing a range of a predetermined frequency and frequency blocks before and after the reference frequency block, the frequency range including a range of the peak frequency corresponding to the temperature range.

In the semiconductor device, the reference frequency range is the frequency range including the reference frequency block including the peak frequency corresponding to the reference temperature and the frequency blocks before and after the reference frequency block, the frequency range including the range of the peak frequency corresponding to the temperature range in which the operation of the sound reproduction device is guaranteed, and thus even when the peak frequency changes due to the change in the temperature of the sound reproduction device, the detected peak frequency is included in the reference frequency range. Therefore, with the semiconductor device, a risk that it is erroneously determined that the sound reproduction device fails when the sound reproduction device is normal is reduced.

In the semiconductor device according to the aspect, the temperature information may be information on a temperature range in which an operation of the sound reproduction device is guaranteed, and the reference frequency range may be a frequency range of a reference frequency block including a range of the peak frequency corresponding to the temperature range among a plurality of frequency blocks obtained by dividing a range of a predetermined frequency.

In the semiconductor device, the reference frequency range is the frequency range of the reference frequency block including the range of the peak frequency corresponding to the temperature range in which the operation of the sound reproduction device is guaranteed, and thus even when the peak frequency changes due to the change in the temperature of the sound reproduction device, the detected peak frequency is included in the reference frequency range. Therefore, with the semiconductor device, a risk that it is erroneously determined that the sound reproduction device fails when the sound reproduction device is normal is reduced.

In the semiconductor device according to the aspect, in the second operation mode, the peak frequency detection circuit may further detect a peak voltage that is a voltage obtained by amplifying the potential difference between the first output terminal and the second output terminal when the frequency of the test signal is the peak frequency, and in the second operation mode, the determination circuit may further determine whether or not the peak voltage is included in a reference voltage range determined based on the frequency band of the test signal and the temperature information.

In the semiconductor device, the determination circuit can further determine whether or not the peak voltage is included in the reference voltage range, and determine, for example, that there is the possibility that the sound reproduction device fails when the peak voltage is not included in the reference voltage range. Since the reference voltage range is determined based on the frequency band of the test signal and the temperature information of the sound reproduction device, the reference voltage range appropriately changes depending on the temperature of the sound reproduction device. Therefore, even when the peak frequency is included in the reference frequency range, the determination circuit can determine that there is the possibility that the sound reproduction device fails as long as the peak voltage is not included in the reference voltage range. Therefore, with the semiconductor device, a risk that it is erroneously determined that the sound reproduction device is normal when there is the possibility that the sound reproduction device fails is reduced.

In the semiconductor device according to the aspect, in the second operation mode, the peak frequency detection circuit may detect the peak frequency by measuring a time when the potential difference between the first output terminal and the second output terminal reaches a maximum.

With the semiconductor device, the potential difference between the first output terminal and the second output terminal also reaches the peak when the impedance of the sound reproduction device reaches the peak, and thus the peak frequency detection circuit can detect the peak frequency by measuring the time when the potential difference between the first output terminal and the second output terminal reaches the maximum.

In the semiconductor device according to the aspect, the peak frequency detection circuit may include a differential low-pass filter to which a voltage of the first output terminal and a voltage of the second output terminal are input, an A/D conversion circuit that converts an output voltage of the differential low-pass filter into a digital signal, and a peak time measurement circuit that measures the time when the potential difference between the first output terminal and the second output terminal reaches the maximum, based on the digital signal.

With the semiconductor device, the differential low-pass filter can reduce the high-frequency noise component superimposed on the third amplified signal and the fourth amplified signal by modulating the test signal, the A/D conversion circuit can convert the output voltage of the differential low-pass filter into the digital signal, and the peak time measurement circuit can easily perform high-accuracy measurement.

In the semiconductor device according to the aspect, a cutoff frequency of the differential low-pass filter may be higher than a maximum frequency of the frequency band.

With the semiconductor device, since the cutoff frequency of the differential low-pass filter is higher than the maximum frequency of the frequency band in which the frequency of the test signal is changed, a frequency component included in the frequency band is not attenuated by the differential low-pass filter, and the peak time measurement circuit can perform high-accuracy measurement.

Another aspect of the semiconductor device is a semiconductor device coupled to a sound source reproduction circuit including an input terminal, a modulation circuit that modulates a signal input to the input terminal to output a first modulated signal and a second modulated signal, and an amplification circuit that outputs a first amplified signal obtained by amplifying the first modulated signal to a first terminal of a sound reproduction device and outputs a second amplified signal obtained by amplifying the second modulated signal to a second terminal of the sound reproduction device, the semiconductor device including: a first input terminal coupled to the first terminal of the sound reproduction device; a second input terminal coupled to the second terminal of the sound reproduction device; an output terminal coupled to the input terminal of the sound source reproduction circuit; a switch that, in a first operation mode, outputs a signal based on a sound source signal to the output terminal and that, in a second operation mode, outputs a test signal of which a frequency is changed in a frequency band set in advance to the output terminal; a test signal generation circuit that, in the second operation mode, outputs the test signal to the switch; a peak frequency detection circuit that, in the second operation mode, measures a potential difference between the first input terminal and the second input terminal to detect a peak frequency that is a frequency of the test signal at which an impedance of the sound reproduction device reaches a peak; and a determination circuit that, in the second operation mode, determines whether or not the peak frequency is included in a reference frequency range determined based on the frequency band of the test signal and temperature information that is information on a temperature of the sound reproduction device.

With the semiconductor device, in the first operation mode, the amplification circuit of the sound source reproduction circuit outputs the first amplified signal obtained by amplifying the first modulated signal based on the sound source signal to the first output terminal, and outputs the second amplified signal obtained by amplifying the second modulated signal based on the sound source signal to the second output terminal, so that the sound reproduction device can reproduce the sound. On the other hand, in the second operation mode, the amplification circuit of the sound source reproduction circuit outputs the third amplified signal obtained by amplifying the third modulated signal based on the test signal to the first output terminal, and outputs the fourth amplified signal obtained by amplifying the fourth modulated signal based on the test signal to the second output terminal, so that the peak frequency detection circuit can measure the potential difference between the first output terminal and the second output terminal of the sound source reproduction circuit, to detect the peak frequency at which the impedance of the sound reproduction device reaches the peak. The determination circuit can determine whether or not the peak frequency is included in the reference frequency range, and determine that there is a possibility that the sound reproduction device fails, for example, when the peak frequency is not included in the reference frequency range. Since the reference frequency range is determined based on the frequency band of the test signal and the temperature information of the sound reproduction device, the reference frequency range appropriately changes depending on the temperature of the sound reproduction device. Therefore, with the semiconductor device, when the external sound source reproduction circuit causes the sound reproduction device to output the sound, the accuracy of the failure determination of the sound reproduction device can be maintained even when the temperature changes.

An aspect of the electronic apparatus is an electronic apparatus including: the semiconductor device according to the above-described aspect; and the sound reproduction device.

With the electronic apparatus, the semiconductor device that can generate the signal necessary for detecting the failure of the sound reproduction device is provided, and thus the reliability can be improved.

In the electronic apparatus according to the aspect, a volume of a sound reproduced by the sound reproduction device in the second operation mode may be smaller than a minimum value of a volume of a sound reproduced by the sound reproduction device in the first operation mode.

With the electronic apparatus, since the sound output from the sound reproduction device in the second operation mode is a very small sound that is difficult to be heard by a human ear, it can be made less noticeable to the user that the semiconductor device is operating in the second operation mode.

Another aspect of the electronic apparatus is an electronic apparatus including: a first output terminal coupled to a first terminal of a sound reproduction device; a second output terminal coupled to a second terminal of the sound reproduction device; a modulation circuit that, in a first operation mode, modulates a signal based on a sound source signal to output a first modulated signal and a second modulated signal and that, in a second operation mode, modulates a test signal of which a frequency is changed in a frequency band set in advance, to output a third modulated signal and a fourth modulated signal; a test signal generation circuit that, in the second operation mode, outputs the test signal to the modulation circuit; an amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the third modulated signal to the first output terminal and outputs a fourth amplified signal obtained by amplifying the fourth modulated signal to the second output terminal; a peak frequency detection circuit that, in the second operation mode, measures a potential difference between the first output terminal and the second output terminal to detect a peak frequency that is a frequency of the test signal at which an impedance of the sound reproduction device reaches a peak; and a determination circuit that, in the second operation mode, determines whether or not the peak frequency is included in a reference frequency range determined based on the frequency band of the test signal and temperature information that is information on a temperature of the sound reproduction device.

With the electronic apparatus, in the first operation mode, the amplification circuit outputs the first amplified signal obtained by amplifying the first modulated signal based on the sound source signal to the first output terminal, and outputs the second amplified signal obtained by amplifying the second modulated signal based on the sound source signal to the second output terminal, so that the sound reproduction device can reproduce the sound. On the other hand, in the second operation mode, the amplification circuit outputs the third amplified signal obtained by amplifying the third modulated signal based on the test signal to the first output terminal, and outputs the fourth amplified signal obtained by amplifying the fourth modulated signal based on the test signal to the second output terminal, so that the peak frequency detection circuit can measure the potential difference between the first output terminal and the second output terminal, to detect the peak frequency at which the impedance of the sound reproduction device reaches the peak. The determination circuit can determine whether or not the peak frequency is included in the reference frequency range, and determine that there is a possibility that the sound reproduction device fails, for example, when the peak frequency is not included in the reference frequency range. Since the reference frequency range is determined based on the frequency band of the test signal and the temperature information of the sound reproduction device, the reference frequency range appropriately changes depending on the temperature of the sound reproduction device. Therefore, with the electronic apparatus, the accuracy of the failure determination of the sound reproduction device can be maintained even when the temperature changes.

In the electronic apparatus, the amplification circuit is shared for the generation of the first amplified signal and the second amplified signal for causing the sound reproduction device to reproduce the sound in the first operation mode, and the generation of the third amplified signal and the fourth amplified signal necessary for detecting the peak frequency in the second operation mode. Therefore, with the electronic apparatus, the signal necessary for detecting the failure of the sound reproduction device can be generated by a small-scale circuit.

What is claimed is:

1. A semiconductor device comprising:

a first output terminal coupled to a first terminal of a sound reproduction device;

a second output terminal coupled to a second terminal of the sound reproduction device;

a modulation circuit that, in a first operation mode, modulates a signal based on a sound source signal to output a first modulated signal and a second modulated signal;

a test signal generation circuit that, in a second operation mode, modulates a test signal of which a frequency is changed in a predetermined frequency band, to generate a third modulated signal and a fourth modulated signal;

an amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the third modulated signal to the first output terminal and outputs a fourth amplified signal obtained by amplifying the fourth modulated signal to the second output terminal;

a peak frequency detection circuit that, in the second operation mode, measures a potential difference between the first output terminal and the second output terminal to detect a peak frequency that is a frequency of the test signal at which an impedance of the sound reproduction device reaches a peak; and a determination circuit that, in the second operation mode, determines whether or not the peak frequency is included in a reference frequency range determined based on the predetermined frequency band and temperature information that is information on a temperature of the sound reproduction device.

2. The semiconductor device according to claim 1, wherein the determination circuit acquires a temperature signal output from a temperature sensor as the temperature information, to calculate the reference frequency range based on the acquired temperature signal and table information in which a plurality of the temperatures and a plurality of the peak frequencies related to the sound reproduction device are associated with each other.

3. The semiconductor device according to claim 1, wherein the determination circuit acquires a temperature signal output from a temperature sensor as the temperature information, to calculate the reference frequency range based on the acquired temperature signal and information on a relational expression between the temperature and the peak frequency.

4. The semiconductor device according to claim 1, wherein the temperature information is information on a temperature range in which an operation of the sound reproduction device is guaranteed, and the reference frequency range is a frequency range including a reference frequency block including the peak frequency corresponding to a reference temperature among a plurality of frequency blocks obtained by dividing a range of a predetermined frequency and frequency blocks before and after the reference frequency block, the frequency range including a range of the peak frequency corresponding to the temperature range.

5. The semiconductor device according to claim 1, wherein the temperature information is information on a temperature range in which an operation of the sound reproduction device is guaranteed, and the reference frequency range is a frequency range of a reference frequency block including a range of the peak frequency corresponding to the temperature range among a plurality of frequency blocks obtained by dividing a range of a predetermined frequency.

6. The semiconductor device according to claim 1, wherein in the second operation mode, the peak frequency detection circuit further detects a peak voltage that is a voltage obtained by amplifying the potential difference between the first output terminal and the second output terminal when the frequency of the test signal is the peak frequency, and in the second operation mode, the determination circuit determines whether or not the peak voltage is included in a reference voltage range determined based on the frequency band of the test signal and the temperature information.

7. The semiconductor device according to claim 1, wherein in the second operation mode, the peak frequency detection circuit detects the peak frequency by measuring a time when the potential difference between the first output terminal and the second output terminal reaches a maximum.

8. The semiconductor device according to claim 7, wherein the peak frequency detection circuit includes a differential low-pass filter to which a voltage of the first output terminal and a voltage of the second output terminal are input, an A/D conversion circuit that converts an output voltage of the differential low-pass filter into a digital signal, and a peak time measurement circuit that measures the time when the potential difference between the first output terminal and the second output terminal reaches the maximum, based on the digital signal.

9. The semiconductor device according to claim 8, wherein a cutoff frequency of the differential low-pass filter is higher than a maximum frequency of the frequency band.

10. A semiconductor device coupled to a sound source reproduction circuit including an input terminal, a modulation circuit that modulates a signal input to the input terminal to output a first modulated signal and a second modulated signal, and an amplification circuit that outputs a first amplified signal obtained by amplifying the first modulated signal to a first terminal of a sound reproduction device and outputs a second amplified signal obtained by amplifying the second modulated signal to a second terminal of the sound reproduction device, the semiconductor device comprising:

a first input terminal coupled to the first terminal of the sound reproduction device;

a second input terminal coupled to the second terminal of the sound reproduction device;

an output terminal coupled to the input terminal of the sound source reproduction circuit;

a switch that, in a first operation mode, outputs a signal based on a sound source signal to the output terminal and that, in a second operation mode, outputs a test signal of which a frequency is changed in a predetermined frequency band to the output terminal;

a test signal generation circuit that, in the second operation mode, outputs the test signal to the switch;

a peak frequency detection circuit that, in the second operation mode, measures a potential difference between the first input terminal and the second input terminal to detect a peak frequency that is a frequency of the test signal at which an impedance of the sound reproduction device reaches a peak; and a determination circuit that, in the second operation mode, determines whether or not the peak frequency is included in a reference frequency range determined based on the predetermined frequency band and temperature information that is information on a temperature of the sound reproduction device.

11. An electronic apparatus comprising:

the semiconductor device according to claim 1; and the sound reproduction device.

12. The electronic apparatus according to claim 11, wherein a volume of a sound reproduced by the sound reproduction device in the second operation mode is smaller than a minimum value of a volume of a sound reproduced by the sound reproduction device in the first operation mode.

13. An electronic apparatus comprising:

a first output terminal coupled to a first terminal of a sound reproduction device;

a second output terminal coupled to a second terminal of the sound reproduction device;

a modulation circuit that, in a first operation mode, modulates a signal based on a sound source signal to output a first modulated signal and a second modulated signal and that, in a second operation mode, modulates a test signal of which a frequency is changed in a predetermined frequency band, to output a third modulated signal and a fourth modulated signal;

a test signal generation circuit that, in the second operation mode, outputs the test signal to the modulation circuit;

an amplification circuit that, in the first operation mode, outputs a first amplified signal obtained by amplifying the first modulated signal to the first output terminal and outputs a second amplified signal obtained by amplifying the second modulated signal to the second output terminal and that, in the second operation mode, outputs a third amplified signal obtained by amplifying the third modulated signal to the first output terminal and outputs a fourth amplified signal obtained by amplifying the fourth modulated signal to the second output terminal;

a peak frequency detection circuit that, in the second operation mode, measures a potential difference between the first output terminal and the second output terminal to detect a peak frequency that is a frequency of the test signal at which an impedance of the sound reproduction device reaches a peak; and a determination circuit that, in the second operation mode, determines whether or not the peak frequency is included in a reference frequency range determined based on the predetermined frequency band and temperature information that is information on a temperature of the sound reproduction device.

* * * * *